United States Patent [19]

Sun et al.

[11] Patent Number: 5,630,051

[45] Date of Patent: May 13, 1997

[54] METHOD AND APPARATUS FOR MERGING HIERARCHICAL TEST SUBSEQUENCE AND FINITE STATE MACHINE (FSM) MODEL GRAPHS

[75] Inventors: Xiao Sun; Carmie A. Hull, both of Austin, Tex.

[73] Assignee: Motorola Inc., Schaumburg, Ill.

[21] Appl. No.: 399,307

[22] Filed: Mar. 6, 1995

[51] Int. Cl.[6] .................................................. G01R 31/28
[52] U.S. Cl. ........................................ 395/183.08; 371/27
[58] Field of Search ........................... 395/183.13, 183.01, 395/183.08; 371/27

[56] References Cited

U.S. PATENT DOCUMENTS

| | | | |
|---|---|---|---|
| 4,692,921 | 9/1987 | Dahbura et al. | 371/27 |
| 4,991,176 | 2/1991 | Dahbura et al. | 371/27 |
| 5,228,040 | 7/1993 | Agrawal et al. | 371/22.6 |
| 5,394,347 | 2/1995 | Kita et al. | 364/578 |
| 5,426,651 | 6/1995 | Van De Burgt | 371/27 |
| 5,452,215 | 9/1995 | Washabaugh | 364/489 |
| 5,459,841 | 10/1995 | Flora-Holmquist et al. | 395/800 |

OTHER PUBLICATIONS

Thomas H. Cormen et al., Introduction to Algorithms, 1985 MIT Press, Cambridge, Mass.

Alfred V. Aho, et al., An Optimization Technique for Protocol Conformance Test Generation . . . Protocol Specification Testing and Verification VIII, p. 75, IFIP 1988.

Anton Dahbura et al., An Optimal Test Sequence for the JTAG/IEEE p. 1149.1 Test Access Port Cntlr. IEEE Proceedings 1989 International Test Conference, pp. 55–62, 1989.

Xiao Sun et al., Protocol Conformance Testing by Discriminating UIO Sequences Protocol Specification Testing and Verification XI, p. 349, IFIP 1991.

Xiao Sun et al., On the Verification and Validation of Protocols with High Fault Coverage Using UIO Seq IEEE, 1992.

Kwang-Ting Cheng et al., Automatic Functional Test Generation Using the Finite State Machine Model 30th ACM/IEEE Design Automation Conference, p. 86, 1993.

Xiao Sun, Automatic Conformance Testing of Protocols Implemented in Software and Hardware Ph.D. Dissertation, Texas A&M University, Aug. 1993.

*Primary Examiner*—Robert W. Beausoliel, Jr.
*Assistant Examiner*—Albert T. Decady
*Attorney, Agent, or Firm*—Bruce E. Hayden

[57] ABSTRACT

Hierarchical Test Subsequence (TS) subgraphs and Finite State Machine (FSM) subgraphs are merged.

Hierarchical FSM subgraphs are merged (82) by connecting FSM model (33) child subgraph transitions or graph edges with states or vertices in the FSM parent subgraph. Matching is done based on Input/Output sequences. This merging (82) is repeated until all FSM child subgraphs are merged into FSM childless subgraphs. FSM childless subgraphs are Merged FSM graphs (83).

Hierarchical Test Subsequence (TS) subgraphs (65) are merged (38) by finding peer subgraphs for TS child subgraphs. TS micro-edges from module entry and to module exit are connected to peer level FSM model states or vertices identified by matching Input/Output sequences. This merging (38) is repeated until all TS child subgraphs are merged into TS childless subgraphs. TS childless subgraphs are Merged TS graphs (39).

21 Claims, 18 Drawing Sheets

METHOD AND APPARATUS FOR MERGING HIERARCHICAL TEST SUBSEQUENCE AND FINITE STATE MACHINE (FSM) MODEL GRAPHS

CROSS REFERENCE TO RELATED APPLICATIONS

This application is related to our copending patent application U.S. Ser. No. 08/403,332 entitled METHOD AND APPARATUS FOR CONSTRUCTING UNIQUE INPUT/OUTPUT SEQUENCE (UIO) SETS UTILIZING TRANSITION DISTINCTNESS MEASUREMENTS, filed concurrently herewith and assigned to the assignee hereof.

This application is related to our copending patent application U.S. Ser. No. 08/398,831 entitled METHOD AND APPARATUS FOR TESTING FINITE STATE MACHINE (FSM) CONFORMANCE UTILIZING UNIQUE INPUT/OUTPUT SEQUENCE (UIO) SETS, filed concurrently herewith and assigned to the assignee hereof.

This application is related to our copending patent application U.S. Ser. No. 08/399,020 entitled METHOD AND APPARATUS FOR CONSTRUCTING TEST SUBSEQUENCE GRAPHS UTILIZING UNIQUE INPUT/OUTPUT SEQUENCE (UIO) SETS, filed concurrently herewith and assigned to the assignee hereof.

This application is related to our copending patent application U.S. Ser. No. 08/399,392 entitled METHOD AND APPARATUS FOR CONSTRUCTING VERIFICATION TEST SEQUENCES BY EULER TOURING A TEST SUBSEQUENCE GRAPH, filed concurrently herewith and assigned to the assignee hereof.

This application is related to our copending patent application U.S. Ser. No. 08/399,008 entitled METHOD AND APPARATUS FOR CONSTRUCTING VERIFICATION TEST SEQUENCES BY MERGING AND TOURING HIERARCHICAL UNIQUE INPUT/OUTPUT SEQUENCE (UIO) BASED TEST SUBSEQUENCE GRAPHS, filed concurrently herewith and assigned to the assignee hereof.

FIELD OF THE INVENTION

The present invention generally relates to conformance testing electronic circuitry, and more specifically to merging hierarchical Test Subsequence (TS) graphs and Finite State Machine (FSM) graphs used to construct Verification Test Sequences (VTS).

BACKGROUND OF THE INVENTION

Testing hardware, firmware, and software implementations of communications software, VLSI circuits, and rule based expert systems for conformance with specifications is critical in today's drive for total quality assurance. For example, release of a faulty VLSI circuit can cost a company millions of dollars. Similarly, release of faulty software can have life threatening implications.

The complexity of modern hardware, software, and firmware has grown to the point that exhaustive testing, that is testing every testable aspect of a product is impractical, or even infeasible. One reason for this is that a linear growth in the number of components results in exponential grown in the number of component interactions.

It is often helpful to test hardware, firmware, and software for conformance to their specifications. It would be often helpful to supply stimuli to a machine to be tested, then look inside the machine to see what happened, or indeed see how whatever happened did happen. However, it is often infeasible or impractical in many test situations to actually look into a circuit or software program to determine what its current status or state it is in. Rather, practicality requires that these machines be treated as black boxes where all that a tester has available at any time are the output responses from the machine received in response to stimuli presented to the machine by the tester.

One approach to black box testing is disclosed in U.S. Pat. No. 4,692,921 to Anton T. Dahbura, et al. A number of Unique Input/Output (UIO) subsequences are developed. Input/Output test subsequences are constructed for Finite State Machine (FSM) edges to be tested by concatenating a head and a tail sequence to each edge to be tested. The head subsequence is a low cost I/O sequence designed to drive the machine under test from a known (reset) state to the state immediately preceding the state transition edge to be tested. The tail subsequence utilized is the UIO sequence constructed for the state immediately following the state transition to be tested.

The approach disclosed in the '921 patent application was extended in U.S. Pat. No. 4,991,176 to Anton T. Dahbura, et al. Instead of finding the shortest test subsequences, the I/O subsequence selection criteria was changed to minimize cost, where cost may be different than the number of I/O subsequences utilized. Secondly, the concepts of forming a graph with the generated test subsequences and touring the graph in order to generate a verification test sequence are disclosed.

The approach was similarly disclosed in a paper authored and edited in part by the '176 authors in an article: titled "An Optimization Technique for Protocol Conformance Test Generation Based on UIO Sequences and Rural Postman Tours" in "Protocol Specification, Testing, and Verification, VIII", which were the proceedings of the IFIP WG 6.1 Eighth International Symposium on Protocol Specification, Testing, and Verification, held in Atlantic City, N.J., U.S.A. on Jun. 7–10, 1988. The use of a Chinese Postman tour to tour a subsequence graph was shown as a method of generating a verification test sequence.

An implementation of the Dahbura method discussed above was disclosed in an article titled "An Optimal Test Sequence for the JTAG/IEEE P1149.1 Test Access Port Controller" by Dahbura et al. which was presented at the IEEE 1989 International Test Conference. Test verification sequences were generated for the JTAG/IEEE P1149.1 architecture and applied. Test coverage was then evaluated.

The UIO sequences disclosed by Dahbura et al. extend from a transition edge-under-test forward. One of the applicants herein, Xiao Sun, in his Ph.D. dissertation titled "Automatic Conformance Testing of Protocols Implemented in Software or Hardware" from Texas A&M University, dated August 1993, introduced Backward Unique Input/Output (BUIO) sequences. These BUIO sequences are similar to Dahbura's UIO (hereinafter "FUIO") sequences, but differ in that the BUIO sequences precede an edge-under-test in a test subsequence. The use of BUIO sequences offers a number of advantages, including the ability to validate that a machine under test has been driven to a particular state. Additionally, Dr. Sun disclosed augmenting a test subsequence graph to make it symmetric, and the use of an Euler Tour to tour an augmented test subsequence graph.

The introduction and usage of BUIO sequences and augmentation of a test subsequence graph for conformance testing were further discussed in two papers co-authored by co-applicant Sun titled "Protocol Conformance Testing by Discriminating UIO Sequences", in "Protocol Specification, Testing, and Verification VI", sponsored by IFIP in 1991, and "On the Verification and Validation of Protocols with High Fault Coverage Using UIO Sequences", IEEE 1992.

SUMMARY OF THE INVENTION

In accordance with the invention, there is provided a method and apparatus for merging hierarchical Test Subsequence (TS) subgraphs and Finite State Machine (FSM) subgraphs.

Hierarchical FSM subgraphs are merged into a FSM graph by connecting FSM child subgraph transitions or graph edges with states or vertices in the FSM parent subgraph. This is repeated until all FSM child subgraphs are merged into FSM childless subgraphs. FSM childless subgraphs are Merged FSM graphs.

Hierarchical Test Subsequence (TS) subgraphs are merged by finding peer subgraphs for TS child subgraphs. The edges from module entry and to module exit are connected to peer level states or vertices identified by matching Input/Output sequences. This is repeated until all TS child subgraphs are merged into TS childless subgraphs. TS childless subgraphs are Merged TS graphs.

These and other features, and advantages, will be more clearly understood from the following detailed description taken in conjunction with the accompanying drawings. It is important to point out that there may be other embodiments of the present invention which are not specifically illustrated.

BRIEF DESCRIPTION OF THE DRAWINGS

FIG. 8 is a Finite State Machine (FSM) model state transition diagram of a sample FSM model with five states and eleven state transitions. Two subfigures are shown.

FIG. 9 has five subfigures (FIG. 9(A–E)) corresponding to the five FSM states shown in FIG. 8. Each of the outgoing transitions has attached a Distinctness Measurement (DM) and Distinctness Label (DL) from Table T-3;

FIG. 10 has three subfigures (FIG. 10(A–C)) corresponding to the three model states;

FIG. 11 has five subfigures (FIG. 11(A–E)) corresponding to the five FSM states shown in FIG. 8. Each of the incoming transitions has attached a Distinctness Measurement (DM) and Distinctness Label (DL) from Table T-3;

FIG. 12 has two subfigures (FIG. 12(A–B)) corresponding to the two model states;

FIG. 15 has FSM model state transition diagrams demonstrating a Euler Tour. Two subfigures are shown.

FIG. 16 is a FSM model state transition diagram showing a new, hierarchical, FSM model. FIG. 16 includes four subfigures (FIG. 16 (A–D)).

DETAILED DESCRIPTION OF A PREFERRED EMBODIMENT

Figure 1:
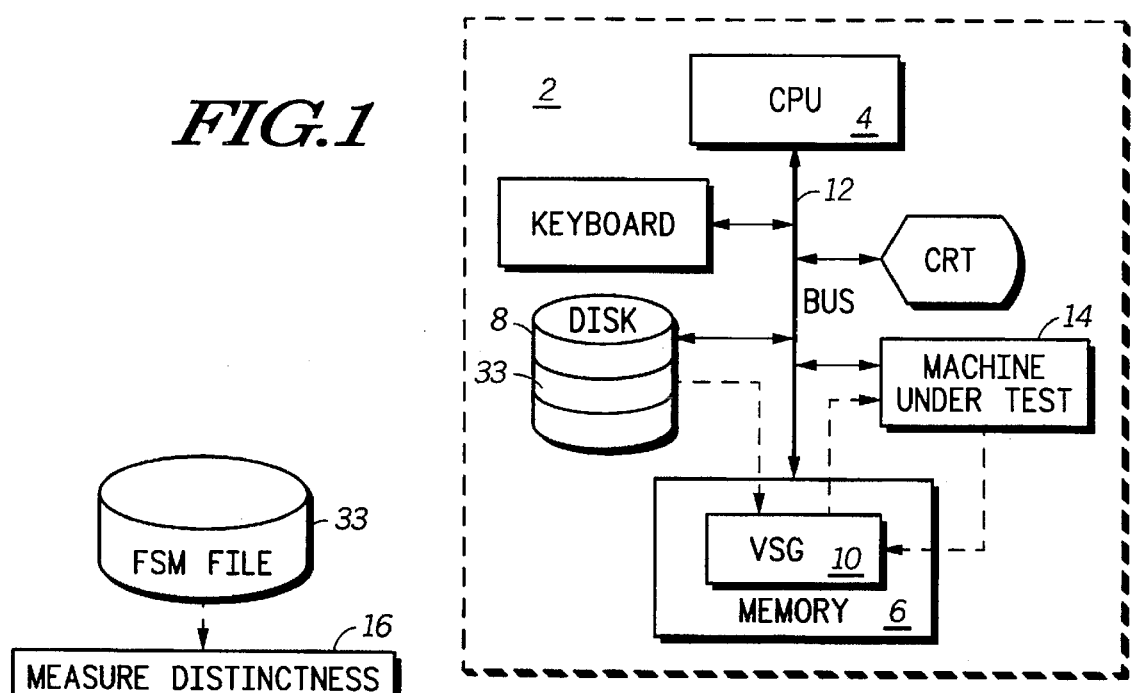
FIG. 1 is a block diagram showing in accordance with the present invention the hardware components of the invention.

Verification is a procedure to certify whether a machine performs as described in its design specification. A design can be a functional description, such as a netlist or a flow chart. The product of such a design may be a chip or a program. In the disclosed invention, such a design is viewed as a "Golden Model" during the verification process. This means that the machine is tested for conformance with the "Golden Model" design. Testing is done by comparing a test sequence of stimuli and expected responses thereto with actual responses received from the product in response to the prescribed sequence of stimuli.

The model to be tested against is ultimately converted and translated into a Finite State Machine ("FSM"). A FSM captures the functional behavior of a design as defined by its inputs, outputs, current states, and next states. The functional behavior is represented by symbols and is not necessarily in a Boolean domain. By specifying Input/Output sequences as strings, Boolean machines, such as circuits, as well as non-Boolean machines such as those implementing communications protocols, can be tested and verified. The Input/Output values of the FSM have to be described by primary Input/Output values.

A FSM can be viewed as a directed graph, with states at each vertex, and TRansitions between states or vertices as edges on the graph. Each such state transition usually has associated with it one or more inputs which cause the state transition to occur combined with the output response that results from the transition. States then are semi-stable between the receipt of input stimuli that cause the state TRansitions. Each pair of input stimuli and corresponding output responses is called an "Input/Output" (or I/O) sequence. Each I/O sequence corresponds to a single FSM transition.

A protocol or circuit can be modeled as a deterministic FSM if its behavior can be modeled by the quintuple, $\{S, I, O, NS, Z\}$, where $S=\{s_1, \ldots, s_n\}$ is a finite set of states, $I=\{I_1, \ldots, I_m\}$ is a finite set of Input Stimuli, and $O=\{o_1, \ldots, o_m\}$ is a finite set of Output Responses. The FSM operates according to two functions: the next state (NS) and the output (Z) function, which are given by the mappings:

$$NS: S \times I \rightarrow S, \text{ and} \quad (1)$$
$$Z: S \times I \rightarrow O$$

These "Input/Output" sequences can be represented as tuples, such as "A/B" where "A" is an input string, and "B" is the corresponding output string. Note that both inputs and outputs may be non-binary strings, allowing verification of non-Boolean machines, such as communications protocol engines. The output sequence for each transition ($TR_{ij}$) from state $S_i$ to state $S_j$ consisting of an input string ($I_{ij}$) and the expected output string ($O_{ij}$) under that input stimulus ($I_{ij}$) can be defined as:

$$TR_{ij}=(I_{ij}/O_{ij}) \quad (2)$$

A Unique Input/Output sequence ("UIO") is a minimum length sequence of Input/Output sequences concatenated together, corresponding to a series or sequence of state TRansitions that can be sequentially traversed, such that the UIO can uniquely identify one of the nodes traversed with the sequence. Each UIO sequence is optimally unique within a FSM.

This invention primarily utilizes Forward Unique I/O ("FUIO") sequences wherein the FUIO uniquely determines the leading state in the sequence, and Backward Unique I/O ("BUIO") sequences wherein a BUIO uniquely determines the trailing state in the sequence traversed.

More formally, a FUIO ($FUIO_i$) sequence for state $S_i$ is an Input/Output sequence of minimum length, starting at state $S_i$, wherein:

$$FUIO_i=(I_{ij}/O_{ij}) \ldots (I_{lm}/O_{lm}), \forall FUIO_x \neq FUIO_y, S_x \neq S_y \quad (3)$$

where $I_{ij} \ldots I_{lm}$ are specified input stimuli, and $O_{ij} \ldots O_{lm}$ are the expected outputs under stimuli $I_{ij} \ldots I_{lm}$. Likewise a BUIO ($BUIO_m$) sequence for state $S_m$ is an Input/Output sequence of minimum length with destination state $S_m$ wherein:

$$BUIO_m=(I_{ij}/O_{ij}) \ldots (I_{lm}/O_{lm}), \forall BUIO_x \neq BUIO_y, S_x \neq S_y \quad (4)$$

Due to their uniqueness, UIO sequences can be used to uniquely identify states ($S_x$) and TRansitions ($TR_{xy}$) in a FSM via I/O behavior. A Test Subsequence consists here of an edge under test ($EUT_{xy}$) concatenated with a $UIO_i$, where $S_i$ is the destination state of the transition if the FUIO is used, or the starting state of the transition if the BUIO is used. Henceforth we will use "@" as the concatenation operator. Note that each EUT consists of a single state Transition ($TR_{ij}$), and each IO and UIO sequence consists of one or more state TRansitions concatenated together. Thus, FUIOs and BUIOs may be redefined:

$$FUIO_i=TR_{ij}@TR_{jk} \ldots @TR_{lm}, \forall FUIO_x \neq FUIO_y, S_x \neq S_y \quad (5)$$

$$BUIO_m=TR_{ij}@TR_{jk} \ldots @TR_{lm}, \forall BUIO_x \neq BUIO_y, S_x \neq S_y \quad (6)$$

where $TR_{ij}$ is the transition from state $S_i$ to state $S_j$ caused by stimuli string $I_{ij}$ and generating output string $O_{ij}$.

In this invention, we apply a $FUIO_j$ after each transition whose destination state is $S_j$, or we apply a $BUIO_k$ in front of each transition whose starting state is $S_k$, to form a graph of Test Subsequences. The Test Subsequences ($TS_{ij}$) for the transition $TR_{ij}$ from state $S_i$ to state $S_j$ can be defined as either:

$$TS_{ij}=TR_{ij}@FUIO_j, \text{ or} \quad (7)$$

$$TS_{ij}=BUIO_i@TR_{ij} \quad (8)$$

One alternative for creating a Test Subsequence ($TS_{ij}$) for $EUT_{ij}$ from starting state ($S_i$) to destination state ($S_j$) is to first check for the existence of $TR_{ij}$ as the first transition in a FUIO ($FUIO_i$) from the starting state ($S_i$) or as the last transition in the BUIO ($BUIO_j$) from the destination state ($S_j$).

One addition is the usage of FUIOsets and BUIOsets. Occasionally, no FUIO or BUIO for a specified FSM state is computable within the allotted resources. In such a case, an alternative is to create either a FUIOset and/or BUIOset. These UIO sets are composed of two or more Input/Output sequences to (BUIOset) or from (FUIOset) the specified state wherein the combination of Input/Output sequences in the set guarantees the required uniqueness. Thus, if there are two Input/Output sequences ($IO_a$ and $IO_b$) in a FUIOset, two Test Subsequences are formed, $TSa=EUT@IO_a$ and $TSb=EUT@IO_b$.

Different classes of UIO sequences can be used together. This is advantageous since a state may not have a BUIO or FUIO. Indeed, it may be necessary to use a BUIOset or FUIOset. For example a sink state will not have a FUIO, and a source state will not have a BUIO. Additionally, due to the exponential fanout of the tree searches necessary for UIO construction, in some instances it may be more efficient to terminate a FUIO search at a certain tree depth, and instead use a BUIO sequence. Test sequences obtained by using classes of UIOs can achieve high functional fault coverage and a shorter sequence length than possible with the prior art.

The set consisting of the Test Subsequences necessary to uniquely identify a given state is called a "Unique Input/

Output sequence set" (UIO Set). In the case of FUIOs and BUIOs, these sets will consist of a single member, but will have a plurality of members in the case of FUIOsets and BUIOsets. A set of these "Unique Input/Output Sequence Sets" where each member of a set either uniquely identifies a state, or can be combined with an Edge Under Test to form a Test Subsequence Set are hereinafter called "Sets of Unique Input/Output Sequence Sets". Finally, the group of Test Subsequences constructed from a given Unique Input/Output Sequence Set combined with a single Edge-Under-Test (EUT) form a Test Subsequence Set. Again, if a FUIO or BUIO is used, the Test Subsequence Set will have a single member.

The Test Subsequences (or Test Subsequence Sets) are used to construct a Test Subsequence Graph. A Test Subsequence Graph is again a directed graph, with states as vertices, and Test Subsequences as edges. Each Edge-Under-Test (EUT) in the original FSM will have one or more corresponding Test Subsequences (TS) in the Test Subsequence Graph.

The invention may utilize hierarchical FSMs. Such hierarchical FSMs correspond to the reality of how circuits and software are now created. They are also useful in localizing UIO creation, allowing for more efficient construction, especially for large FSMs. A Test Subsequence Subgraph is constructed for each FSM subgraph in the model. Then the Test Subsequence Subgraphs are merged into a flattened Test Subsequence Graph, and the FSM subgraphs are merged into a flattened FSM graph.

The Euler Tour method is used to generate a tour of the Test Subsequence Graph. Hence, every Test Subsequence ($TS_{ij}$) is traversed once and only once in the Euler Tour. The Verification Test Sequence resulting from the Euler Tour is then used to verify the machine implemented against the design ("Golden Model") as specified as the FSM. Each input stimulus is sequentially supplied to the machine in the order specified by the Euler Tour. The output response to each input stimulus so supplied is compared to the expected output corresponding to that input. The machine implementation is validated when all received outputs match their expected values.

This verification tool is not a specific fault model oriented ATPG method. Thus, test sequences are generated on a Golden Model FSM only by using distinctive I/O characterization of the FSM. The test sequences generated can identify deviation from the Golden Model specification by comparing expected output (with distinctive characteristics) against output from test sequences on the machines under test. Thus no concept of picking a fault, inserting a fault, sensing a fault behavior, and finding an input assignment of inserting and sensing are used in the functional ATPG methodology described here. Because of this, test sequences generated by this invention can detect any practical defects which cause the external behavior of the machine under test to differ from the Golden Model specification modeled. The state transition edge-under-test (EUT) and the Euler Tour method solve the controllability problem for testing while the UIO (FUIO/BUIO) sequences and the Test Subsequence method solve observability problems for testing.

FIG. 1 is a block diagram of the hardware components of one embodiment of the invention. A computer 2 is used, having a central processing unit 4 (or "Computer Processor"), Memory 6, and a Disk Drive 8 connected to a Bus 12. The Verification Sequence Generator (VSG) 10 is a computer program loaded into the Memory 6. The VSG 10 program utilizes a Finite State Machine model 33 in a file located on the Disk Drive 8 to generate Verification Test Sequences 43 (see FIG. 2). The Verification Test Sequences 43 are used to validate the Machine Under Test 14 against the FSM model. The Machine Under Test 14 may be a communications protocol. One alternative is to connect the Machine Under Test 14 to the Computer Bus 12. This latter is useful in testing circuit implementations.

Figure 2:
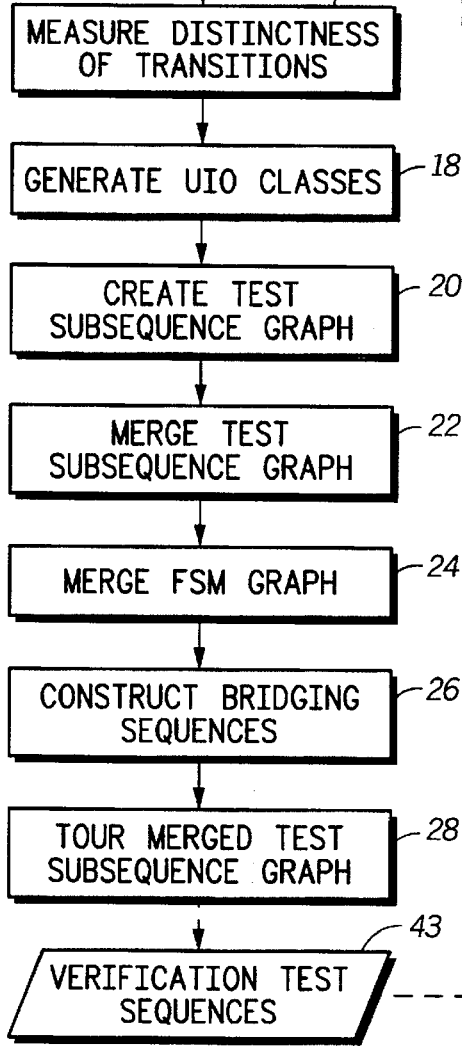
FIG. 2 is a system flow chart showing in accordance with the present invention an overall high level systems view of the invention.

FIG. 2 is a system flow chart of the invention. A FSM 33 specification is read. The distinctness of each FSM transition or graph edge is measured 16. The distinctness measurement is used to increase the speed of the generation of UIO classes 18. The UIO classes are concatenated with edges to be tested to Create a Test Subsequence Graph 20.

The Test Subsequence Graph is then hierarchically flattened through a Test Subsequence Graph Merge 22. The original FSM is also flattened through a second merge 24. The flattened FSM graph is used to construct Bridging Sequences 26, used to augment the Test Subsequence Graph to make it symmetric. The Augmented Symmetric Test Subsequence Graph is then toured with the Euler method 28, where Verification Test Sequences 43 are generated by outputting each Test Subsequence as it is traversed in the Euler tour 28 of the Augmented Symmetric Test Subsequence Graph. Finally, the Verification Test Sequences 43 are applied to a Machine Under Test 14 to determine whether the machine conforms to the FSM model 33.

Figure 3:
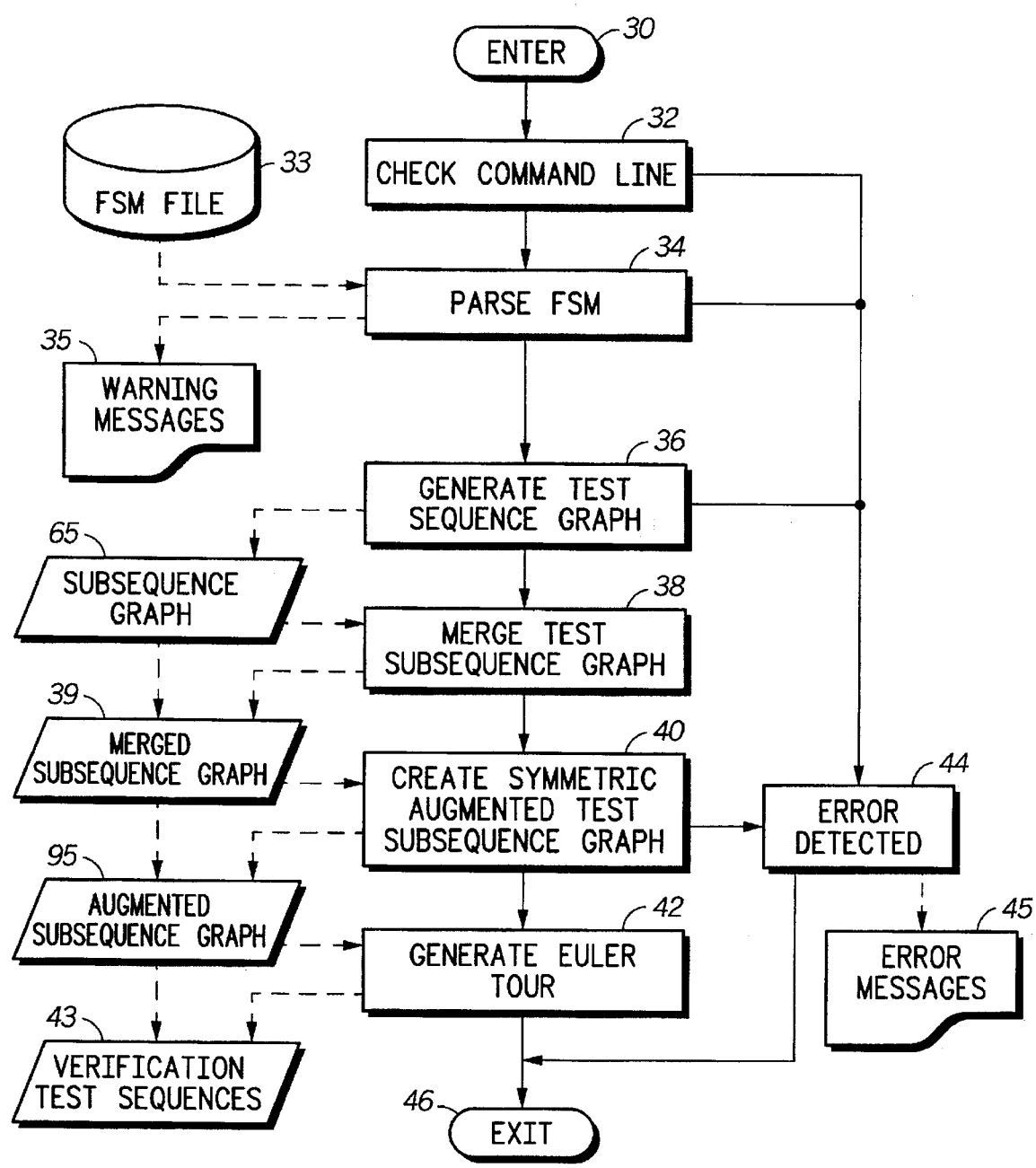
FIG. 3 is a flow chart showing in accordance with the present invention one implementation of the invention.

FIG. 3 is a flow chart showing an implementation of the invention. The invention may be implemented as a computer program. The program is entered, step 30. First, the command line is checked and verified, step 32. Should an error be detected, the program is error terminated, step 44. Next, a model of the Finite State Machine (FSM) is read from a file 33 and parsed, step 34. Again, should an error be detected, the program is error terminated, step 44. Warning messages 35 from the FSM merge, step 34, are optionally printed.

After the FSM model has been parsed, step 34, Test Subsequences (TS) are generated, step 36. The result is a Test Subsequence Graph 65, which is a directed graph with Test Subsequences as "micro-edges". Hierarchical subsequences of Test Subsequences are then merged, step 38, into a flat Merged Test Subsequence Graph 39.

From the Merged Test Subsequence Graph 39, a Symmetric Augmented Test Subsequence Graph 95 is formed, step 40. Errors detected again result in error termination, step 44, after printing appropriate error messages 45. The symmetry introduced by the augmentation, step 40, of the Test Subsequence Graph 95 is necessary for the Euler Tour, step 42, of the Augmented Test Subsequence Graph. As the Augmented Test Subsequence Graph 95 is Euler Toured, step 42, the Test Subsequences are concatenated into Verification Test Sequences 43 as the Test Subsequences are traversed. Finally, the program terminates, step 46.

Figure 4:
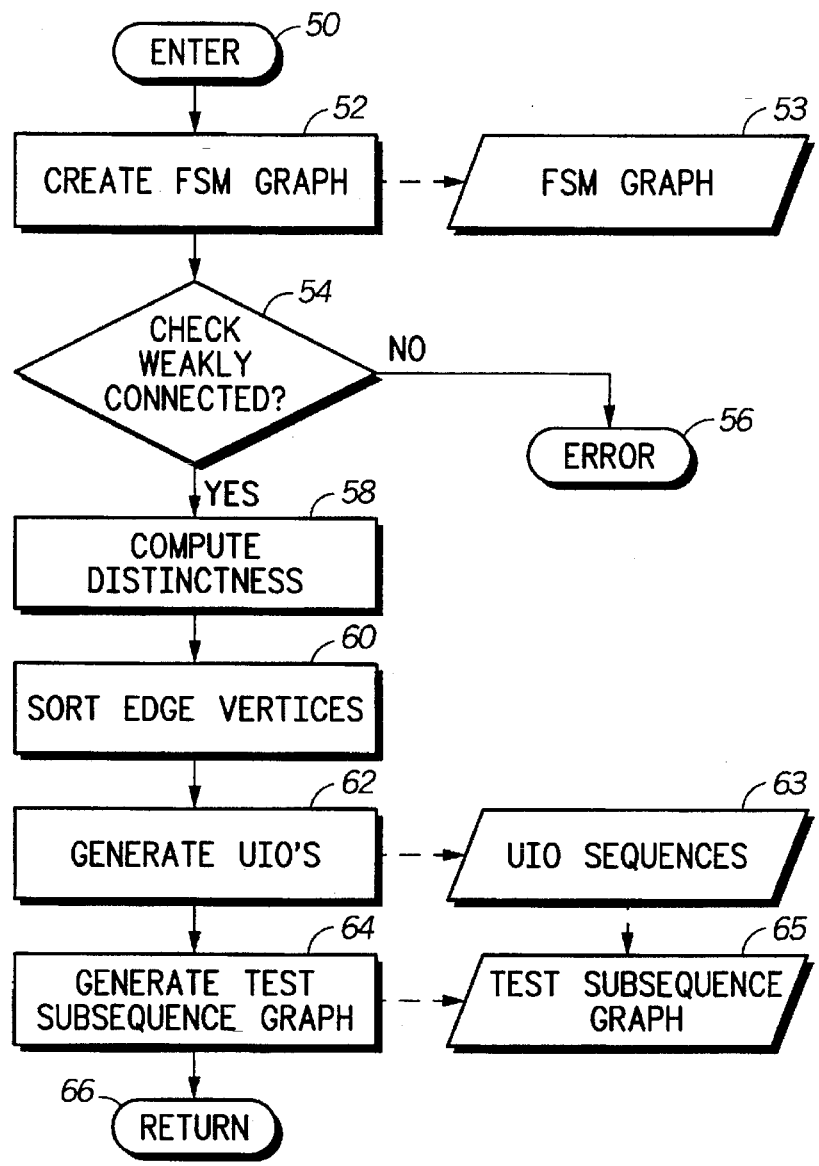
FIG. 4 is a flow chart showing in accordance with the present invention one implementation of the Generate Test Sequence module.

FIG. 4 is a flow chart showing an implementation of the Generate Test Sequence module, step 36. The routine is entered, step 50, and a FSM graph 53 is created, step 52. Next, a check is made as to whether the just created graph is weakly connected, step 54. If not weakly connected, step 54, the routine error terminates, step 56.

Otherwise, a Distinctness Measure (DM) is computed, step 58. This Distinctness Measure is used to sort the edges or transitions, and states or vertices of the FSM model, step 60. The sorted edges and vertices are used to generate, step 62, UIO sequences 63. The UIOs in turn are used to generate, step 64, a Test Subsequence Graph 6.5. Finally, the routine returns, step 66, to the calling program.

Figure 5:
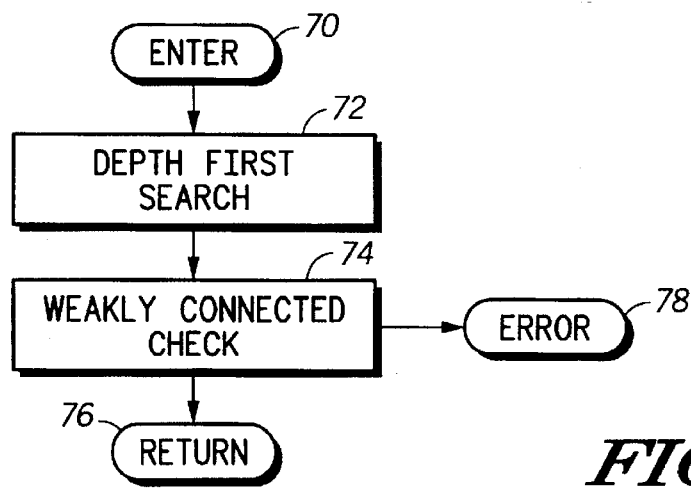
FIG. 5 is a flow chart showing in accordance with the present invention the Check Weakly Connected module.

FIG. 5 is a flow chart showing the Check Weakly Connected, module, step 54. It is entered, step 70. A depth first search, step 72, is first performed. Then a Weakly Connected Check, step 74, is performed. If the graph is not at least weakly connected, then it contains at least two totally independent FSMs, and a Euler Tour is impossible. The module will either error return, step 78, or return normally, step 76, depending on the results of the Weakly Connected Check, step 74.

Figure 6:
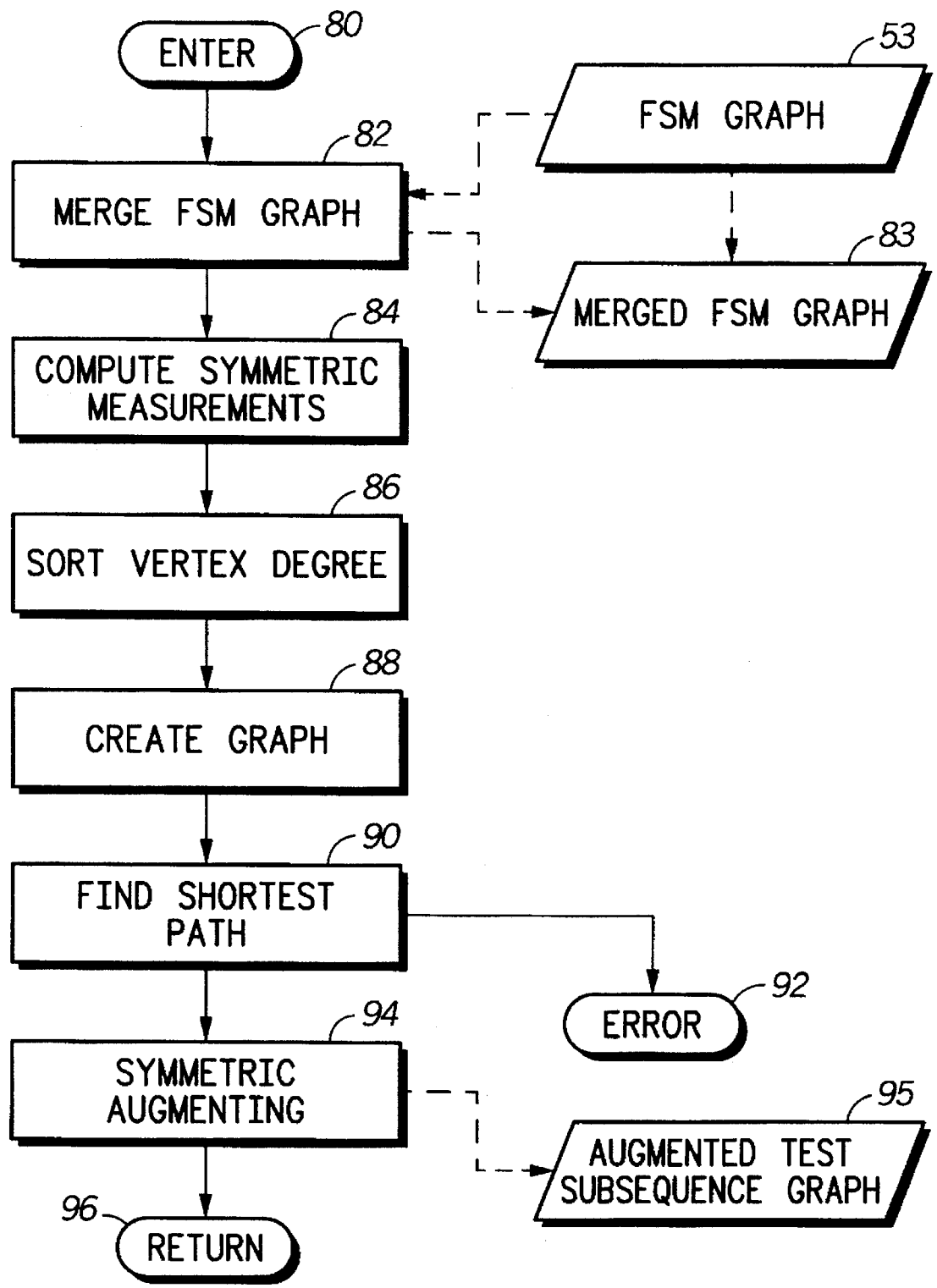
FIG. 6 is a flow chart showing in accordance with the present invention a more detailed implementation of the Create Symmetric Augmented Graph routine.

FIG. 6 is a flow chart showing a more detailed implementation of the Create Symmetric Augmented Graph routine, step 40. After entering, step 80, the hierarchical levels of the FSM Graph 53 are merged, step 82, into a flat Merged FSM Graph 83. Next, a measure of symmetry is computed, step 84, for each node. Nodes are thus identified that have more transitions either entering or leaving. The vertices are again sorted, step 86, this time based on the number of excess input or output transitions for each vertex.

Vertices are matched based on their number of excess incoming or outgoing transitions. Thus, the node or state with the largest number of excess incoming Test Subsequence edges will be paired with the node or state with the largest number of excess outgoing Test Subsequence edges. A graph is made of these vertices, step 88. The shortest path between these nodes or states is then found 90. If a shortest path cannot be found, step 90, the routine error terminates, step 92. Otherwise, the Test Subsequence Graph is augmented, step 94. The resulting Augmented Test Subsequence Graph 95 is a directed graph where each node has an equal number of incoming and outgoing edges or test subsequences. The program then returns, step 96, to its parent calling program.

Note several alternatives to this procedure. Instead of matching nodes with the highest numbers of excess incoming and outgoing micro-edges, then duplicating the bridging sequences formed, a different bridging sequence for each overlap may be constructed. Alternatively, bridging sequences can be constructed to minimize their cumulative length, to minimize their cost, or to maximize fault coverage. Each of these alternatives may be a more optimal solution to some FSM classes.

Figure 7A:
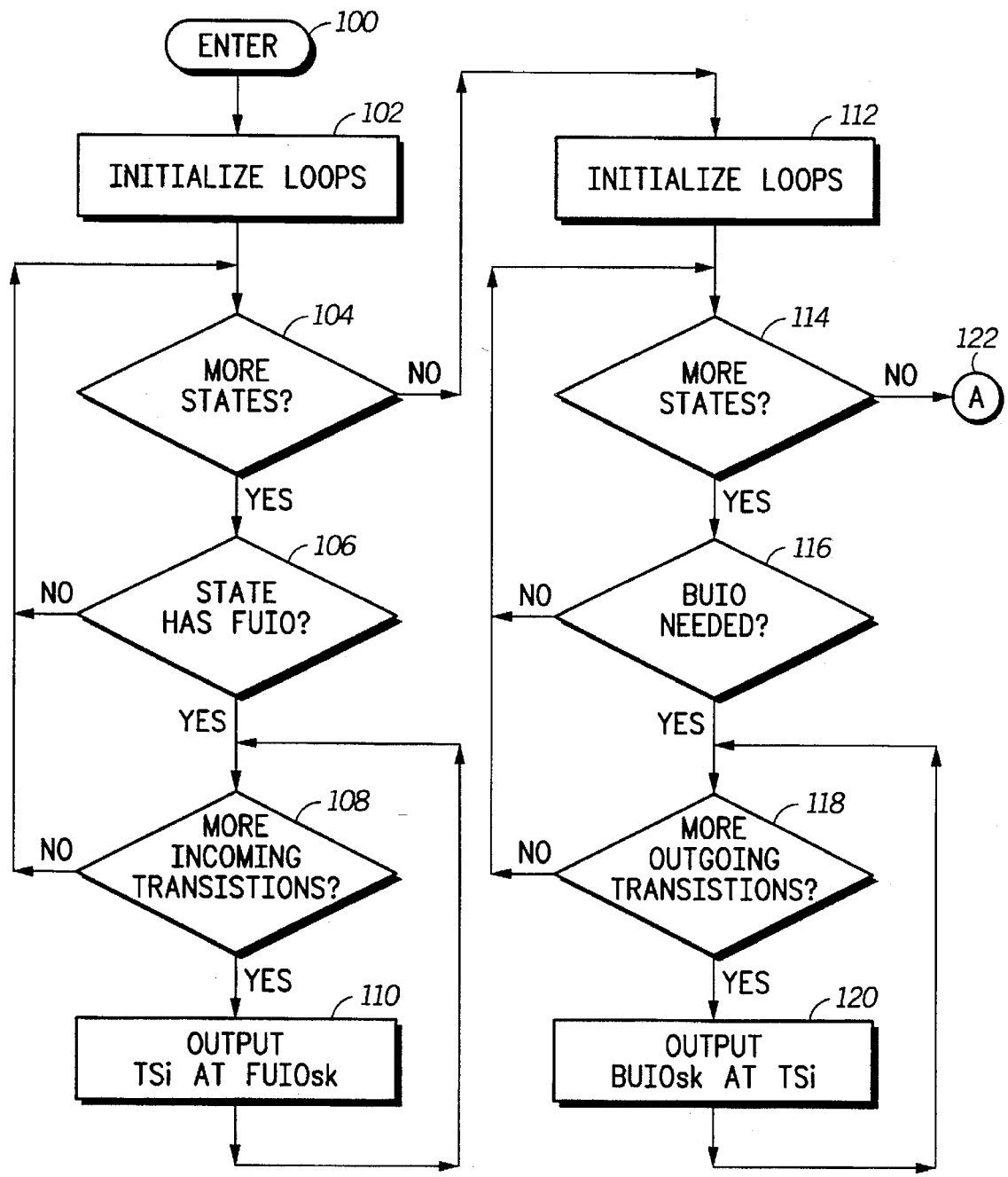
FIG. 7A and 7B together are a flow chart showing in accordance with the present invention one implementation of the Create Test Subsequence Graph routine.
Figure 7B:
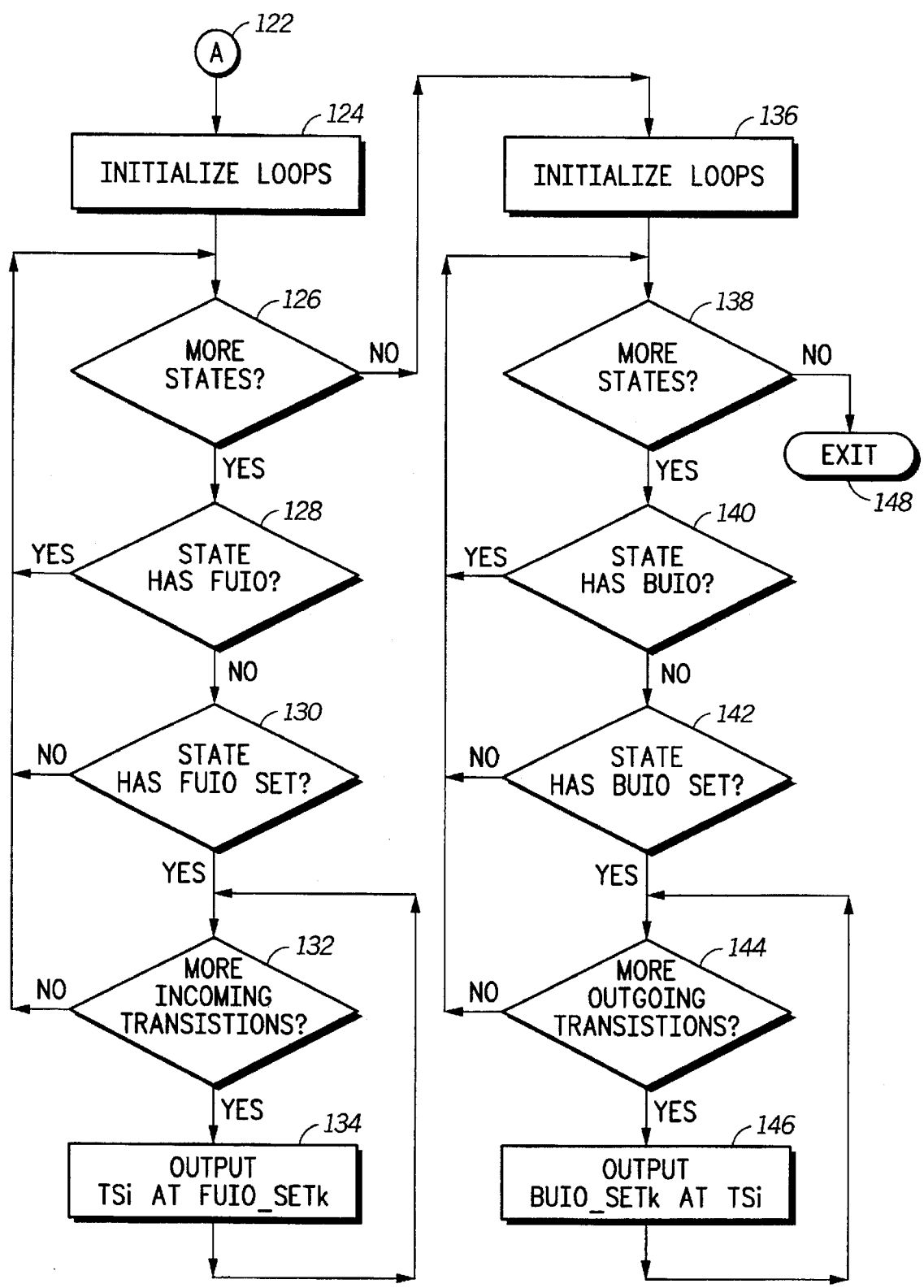

FIG. 7(a) and FIG. 7(b) combined by connector 122 form a flow chart that shows one implementation of the Create Test Subsequence Graph, step 20 (see FIG. 2). The routine is entered, step 100, and the first set of loops is initialized, step 102. A check is made whether any more states are present to process, step 104. If more states need to be evaluated, the next state is checked to see if it has a FUIO, step 106. If no FUIO can be identified for that state, the routine iterates, again checking for more states, step 104. Otherwise, an inner loop is entered and incoming transitions are checked, one by one. For each incoming transition, a Test Subsequence ($TS_{ij}$) is created consisting of the incoming transition, $TR_{ij}$ concatenated with the corresponding $FUIO_j$, step 110. A check, step 108, is made every time through the inner loop for more incoming transitions to check.

After looping through all of the FSM states once, a second loop is started, again initializing loop variables, step 112. A check is made whether any more states are present to process, step 114. If more states need to be evaluated, the next state is checked to see if it needs a BUIO, step 116. This decision may be based on the absence of a FUIO at the other end of an EUT, or an attempt may be made to generate a BUIO for each state in the FSM. If no BUIO is needed for that state, the routine iterates, again checking for more states, step 114. Otherwise, an inner loop is entered and outgoing transitions are checked, one by one. For each outgoing transition, a Test Subsequence ($TS_{ij}$) is created consisting of the outgoing transition, $TR_{ij}$ concatenated with the corresponding $Bijo_u$, step 120. A check, step 118, is made every time through the inner loop for more outgoing transitions to check.

After looping through all of the FSM states twice, a third loop is started, again initializing loop variables, step 124. A check is made whether any more states are present to process, step 126. If more states need to be evaluated, the next state is checked to see if it needs a FUIOset, step 128. One instance where a FUIOset is needed is when a EUT has neither a FUIO nor a BUIO. If no FUIOset is needed for that state, the routine iterates, again checking for more states, step 126. Otherwise, a check is then made whether a FUIOset can be identified, step 130. If no FUIOset is identified, the routine iterates, again checking for more states, step 126. Other, vise, an inner loop is entered and incoming transitions are checked, one by one. For each incoming transition, a Test Subsequence ($TS_{ij}$) is created for each member in the set consisting of the outgoing transition, $TR_{ij}$ concatenated with the corresponding FUIOset ($FUIOset_{ij}$) member, step 134. A check, step 132, is made every time through the inner loop for more incoming transitions to check.

After looping through all of the FSM states three times, a fourth loop is started, again initializing loop variables, step 136. A check is made whether any more states are present to process, step 138. If more states need to be evaluated, the next state is checked to see if it needs a BUIO Set, step 140. If no BUIO Set is needed for that state, the routine iterates, again checking for more states, step 138. A check is then made whether a BUIO Set can identified, step 142. If no BUIO Set can be identified., the routine iterates, again checking for more states, step 138. Otherwise, an inner loop is entered and outgoing transitions are checked, one by one. For each outgoing transition, a Test Subsequence ($TS_{ij}$) is created for each member of the set, consisting of the outgoing transition, $TR_{ij}$ concatenated with the corresponding BUIO Set ($BUIO\_Set_{ij}$) member, step 146. A check, step 144, is made every time through the inner loop for more incoming transitions to check. When the fourth loop is completed, the routine exits, step 148.

The FUIO, BUIO, FUIOset, and BUIOset Input/Output sequences can be constructed using a depth first search method. A configurable maximum tree search depth timeout is implemented in order to limit the exponential path growth resulting from the fanout inherent in tree traversal. Thus, a BUIO may often be identified for a EUT much more efficiently than continuing a costly FUIO search. Utilizing edge distinctness measurements allows the search for UIO sequence sets to be expedited since branches with high distinctness (or low I/O sequence frequency) are searched first.

The first step in building a Verification Test Sequence 43 is to measure 16 the distinctness of edges or transitions. This measurement is used to significantly reduce the complexity and cost of UIO sequence generation.

The Dahbura et al. method of generating UIO sequences requires that all Input/Output sequences be enumerated, which results in a complexity of the generation equal to $O(n(d_{max})^{(n+2)})$ for UIO sequences shorter than $2n^2$, where n is the number of nodes in the FSM and $d_{max}$ is the largest out-degree (the number of outgoing edges) for any node (state) in the FSM model. Let:

$$p_i \equiv (dm_i/|E|), \sum_i p_i = 1, \qquad (8)$$

$$p_{from_i} \equiv (dm_{from_i}/|E_{from_i}|), \sum_i p_{from_i} = 1, \text{ and}$$

-continued $$p_{to_i} \equiv (dm_{to_i}/|E_{to_i}|), \sum_i p_{to_i} = 1$$

where $dm_i$ is the number of times that distinct label $DL_i$ appears in the FSM, $dm\_from_i$ is the number of times label $DL_i$ appears on an outgoing edge, $dm\_to_i$ is the number of times that $DL_i$ appears on an incoming edge, $|E|$ is the total number of edges in the FSM, $|E\_from_i|$ is the number of outgoing edges from a state $(S_i)$, and $|E\_to_i|$ is the number of incoming edges to a state $(S_i)$. Hence, $P_i$ is the probability of the $i^{th}$ distinct label, $(DL_i)$ (Input/Output Sequence pair) appearing in the whole FSM; $p\_from_i$ is the probability of the $i^{th}$ distinct label $(DL_i)$ appearing in the outgoing edges of a state $(S_i)$; and $p\_to_i$ is the probability of the $i$th distinct label $(DL_i)$ appearing in the incoming edges of a state $(S_i)$.

Let the probability of not finding a UIO sequence of length 1 for a state $(S_i)$ be $P_s(1)$. Selecting the edges with the smallest $P_i$ (or $p\_from_i$ or $p\_to_i$), results in a worse case probability of:

$$P_s(l) = \prod_l (p_l) \qquad (9)$$

Since the smallest $P_i$ is always; checked first, the first searched $P_i$ is always less than or equal to 0.5 in a depth first UIO search.

As an example, for a FSM containing 100 transitions, 10 of them with $p_i=2/100$, ($0<i\leq10$), and the remainder of the 90 transitions with $p_i=20/100$, ($10<i\leq100$).

$$P_s(1)=(2/100)^l, 1\leq 10, \text{ and} \qquad (10)$$

$$P_s(1)=(2/100)^{10} \times (20/100)^{(l-10)}, l>10$$

Using Equation 10, for $l=4$, $P_s(4)=0.00000016$. Without using the Distinctness Measurement, the probability of not finding a UIO sequence of length 4 for the state $(S_i)$ is $(20/100)^4=0.0016$. Thus, with the above example, the improvement in the performance for finding UIO sequences of length four (4) is approximately $0.0016/0.00300016=10,000$ (or $10^4$) when using a depth first UIO search that utilizes the Distinctness Measurement (DM).

The first step then in computing a Distinctness Measurement for a transition or edge is to identify all of the different Input/Output sequences in the FSM. Next, the frequency that each different Input/Output sequence appears in the FSM is tallied. The corresponding frequency is then associated with the appropriate transitions or edges. Since the relative frequencies associated with the transitions are important, it is not necessary to divide the tallied frequencies by the total number of transitions in the FSM.

This Distinctness Measurement can then be used to greatly expedite the search for UIO sequences. A depth first search can be made by following the search tree down, always selecting the branch or transition with the lowest Distinctness Measurement, until either a UIO is identified, or a configured maximum depth is reached. This methodology has two interrelated advantages over the prior art. First, a UIO is usually found at a lesser tree depth. Secondly, a UIO search has to backtrack less frequently when reaching a maximum (configurable) depth without finding a UIO. The resulting depth first UIO search can thus be significantly faster than the breadth first UIO search usually performed when not using a distinctness measurement.

FIG. 8 through FIG. 12 are state transition diagrams which illustrate how edge Distinctness Measurement is performed, and how this Distinctness Measurement is utilized in creating UIOs.

Figure 8A:
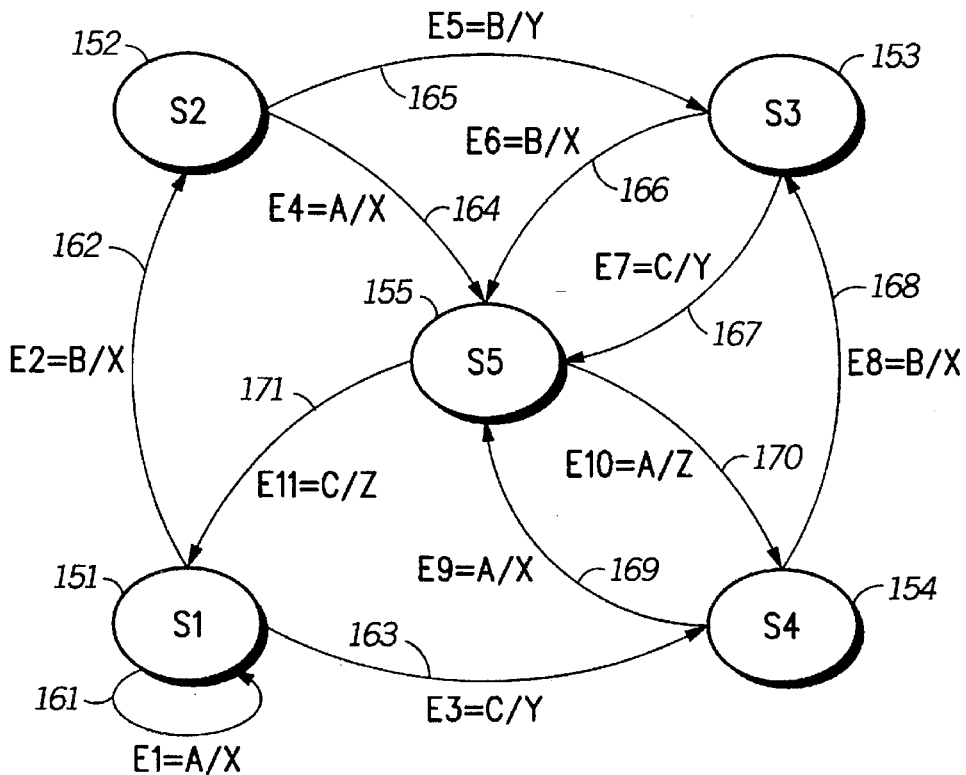
FIG. 8A shows each state transition with its original Input/Output (I/O) sequence.

FIG. 8(a) is a finite state machine (FSM) transition diagram with five states, S1 151, S2 152, S3 153, S4 154, and S5 155. The state transition diagram has eleven TRansitions (TR) or edges. Edge E1 161 is a self loop from state S1 151 with input "a" and output "x". Edge E2 162 is the transition from state S1 151 to S2 152, with IO ="b/x". Edge E3 163 is the transition from S1 151 to S4 154, with IO="c/y". Edge E4 164 is the transition from S2 152 to S5 155, with IO="a/x". Edge E5 165 is the transition from S2 152 to S3 153 with IO ="b/y".

Edges E6 166 and E7 167 are both TRansitions from state S3 153 to state S5 155. Edge E6 166 has IO="b/x", and edge E7 167 has IO="c/y". Edge E8 168 is the transition from S4 154 to S3 153 with IO="b/x". Edge E9 169 is the transition from S4 154 to S5 155 with IO="a/x", while edge E10 170 is the reverse transition, with IO="a/z". Finally, edge E11 171 is the transition from S5 155 to S1 151 with IO="c/z".

Note that this is the same FSM model used as FIG. 2 in the cited article by A. Aho et al. titled "An Optimization Technique for Protocol Conformance Test Generation Based on UIO Sequences and Rural Chinese Postman Tours". This will ultimately herein allow a comparison between results from utilizing the disclosed invention and the results from utilizing the Dahbura method as disclosed in the cited '921 and '176 patents.

Plating the eleven edges in a table results in Table T-1:

TABLE T-1

| Edge | From | To | I/O |
|------|------|-----|-----|
| E1   | S1   | S1  | a/x |
| E2   | S1   | S2  | b/x |
| E3   | S1   | S4  | c/y |
| E4   | S2   | S5  | a/x |
| E5   | S2   | S3  | b/y |
| E6   | S3   | S5  | b/x |
| E7   | S3   | S5  | c/y |
| E8   | S4   | S3  | b/x |
| E9   | S4   | S5  | a/x |
| E10  | S5   | S4  | a/z |
| E11  | S5   | S1  | c/z |

Table T-2 illustrates one method of computing the global Distinctness Measurement ("DM") by assigning each transitional I/O pair a label ("DL"), then totaling the number of edges that have that I/O pair:

TABLE T-2

| Label | I/O | Edges      | DM |
|-------|-----|------------|----|
| $DL_1$ | a/x | E1, E4, E9 | 3  |
| $DL_2$ | a/z | E10        | 1  |
| $DL_3$ | b/x | E2, E6, E8 | 3  |
| $DL_4$ | b/y | E5         | 1  |
| $DL_5$ | c/y | E3, E7     | 2  |
| $DL_6$ | c/z | E11        | 1  |

Table T-3 is constructed from. Table T-1 by merging in the information from Table T-2. For example, edge E1 has an I/O sequence equal to "a/x". This I/O sequence has been assigned the label "$DL_1$". There are three edges (E1, E4, E9) that each have I/O sequence "a/x", and thus label $DL_1$. The label $DL_1$ is assigned a Distinctness Measurement ("DM") equal to the number of times (3) that it occurred in the FSM. This Distinctness Measurement ("DM") for label $DL_1$ is inserted in table T-3 for the three edges having that label.

TABLE T-3

| Edge | I/O | DL | DM |
|------|-----|------|----|
| E1   | a/x | $DL_1$ | 3 |
| E2   | b/x | $DL_3$ | 3 |
| E3   | c/y | $DL_5$ | 2 |
| E4   | a/x | $DL_1$ | 3 |
| E5   | b/y | $DL_4$ | 1 |
| E6   | b/x | $DL_3$ | 3 |
| E7   | c/y | $DL_5$ | 2 |
| E8   | b/x | $DL_3$ | 3 |
| E9   | a/x | $DL_1$ | 3 |
| E10  | a/z | $DL_2$ | 1 |
| E11  | c/z | $DL_6$ | 1 |

Figure 8B:
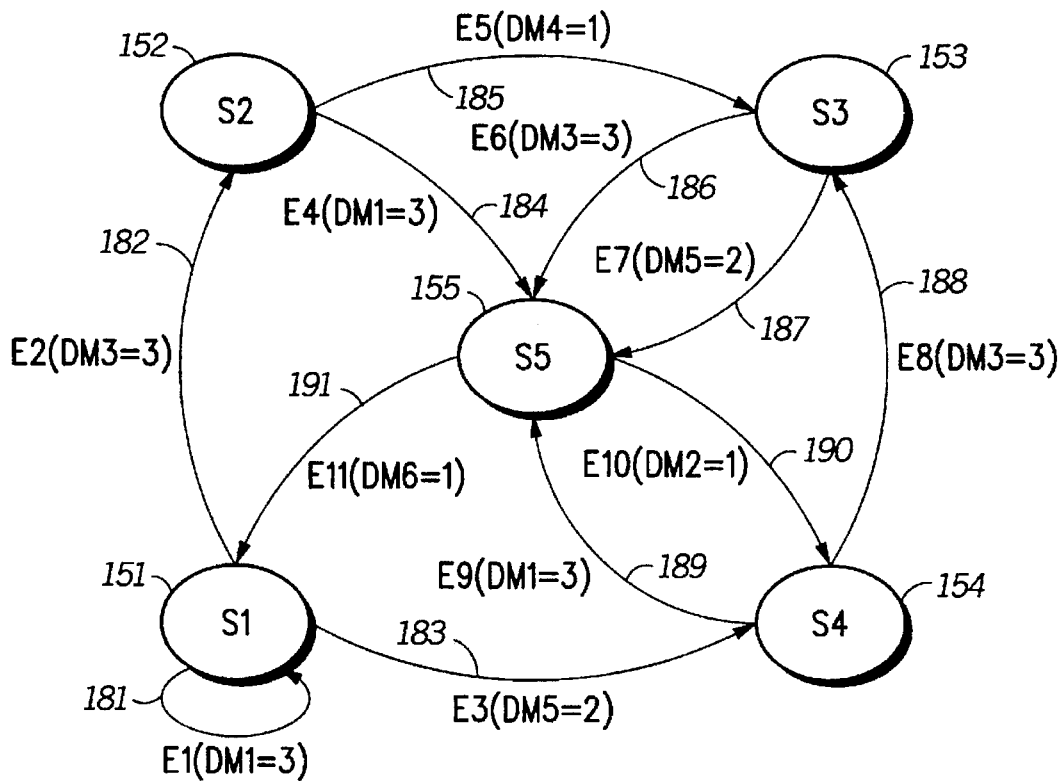
FIG. 8B shows each state transition with its associated distinctness labels and counts from Tables T-2 and T-3.
Figure 9A:
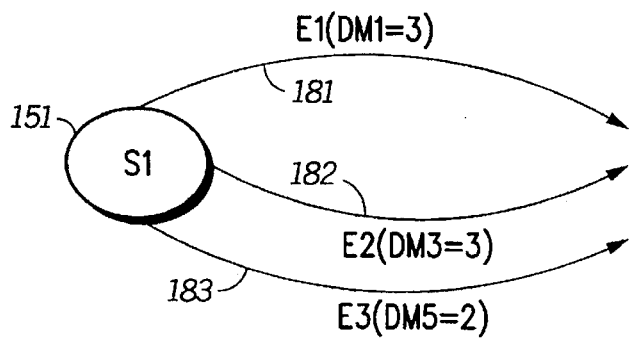
FIG. 9 is a FSM model state transition diagram showing the one level outgoing transitions for the five states shown in FIG. 8.
Figure 9B:
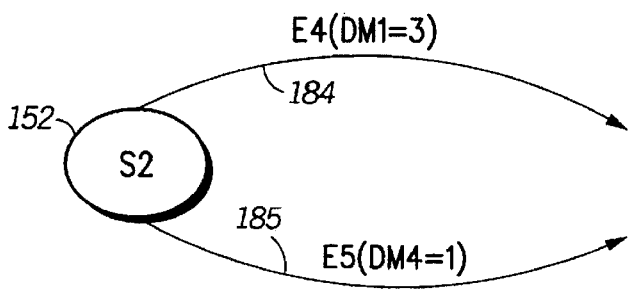
Figure 9C:
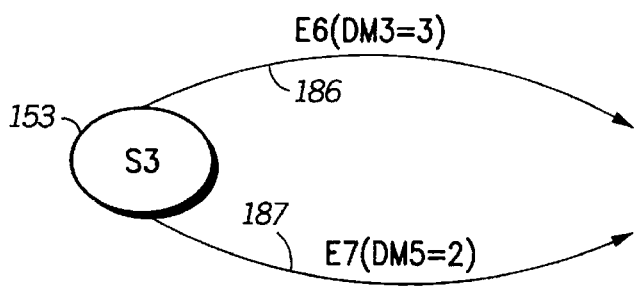
Figure 9D:
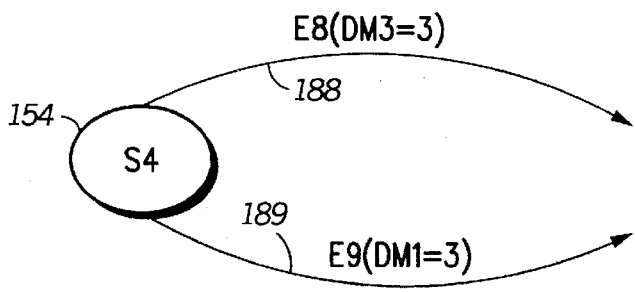
Figure 9E:
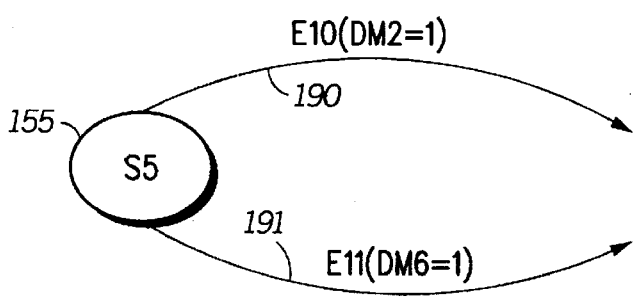

FIG. 8(b) is a state diagram of the FSM in FIG. 8(a) with the I/O string for each edge replaced by the corresponding Distinctness Measurement for that edge from Table T-3. Thus, edges E1 181, E4 184, AND E9 189 have a dm=3 for $DL_1$. Hereinafter, we will refer to this as "dm1=3". Edge E10 190 has dm2=1. Edges E2 182, E6 186, and E8 188 have dm3=3. Edge E5 185 has dm4=1. Edges E3 183, and E7 187 have dm5=2. Finally, transition edge E11 191 has dm6=1.

FIG. 9 consists of five subfigures (9(a) through 9(e)). Each of the subfigures is a finite state diagram for one of the five states, S1 through S5. FIG. 9(a) shows state S1 151 and all three first level outgoing edges E1 181, E2 182, and E3 183. FIG. 9(b) shows the two first level outgoing edges E4 184 and E5 185 for state S2 152. FIG. 9(c) shows the two first level outgoing edges E6 186, and E7 187 for state S3 153. FIG. 9(d) shows the two first level outgoing edges E8 188, and E9 189 for state S4 154. Finally, FIG. 9(e) shows the two first level outgoing edges E10 190, and E11 191 for state S5 155.

FUIO sequences can be immediately ascertained for states S2 152 and S5 155. The FUIO sequence for S2 152 is edge E5 185 with an I/O sequence of "b/y" since its Distinctness Measure is equal to one. This means that the label $DL_4$ (representing "b/y") is unique within the entire FSM. The sequence is thus minimal, and therefore a FUIO. State S5 155 actually has two FUIOs, since both of its outgoing TRansitions or edges, E10 190, and E11 191, both have a distinctness measurement of one. The choice of which one to use is arbitrary.

Figure 10A:
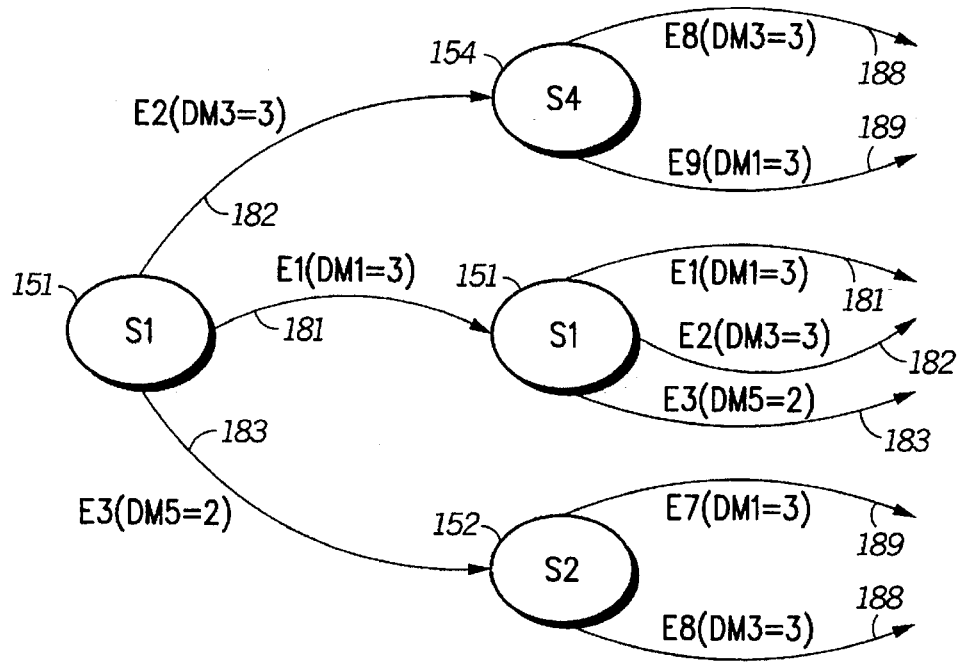
FIG. 10 is a FSM model state transition diagram showing the two level outgoing transitions for the three states shown in FIG. 9 that did not have one level or single edge FUIO sequences.

FIG. 10 consists of three subfigures (10(a) through 10(c)). Each of the three subfigures is a Finite State (FSM) diagram for one of the three states, S1 151, S3 153, and S4 154, that did not have FUIOs of length one. FIG. 10(a) shows a two level state diagram fanout starting at state S1 151. As edge E3 183 has a lower DM measurement (dm5=2) than either edges E2 182 or E1 181, it is searched first. A second level edge, E5 185, with a DM value equal to one is found. This edge concatenated with the original edge E3 183 results in a FUIO.

Figure 10B:
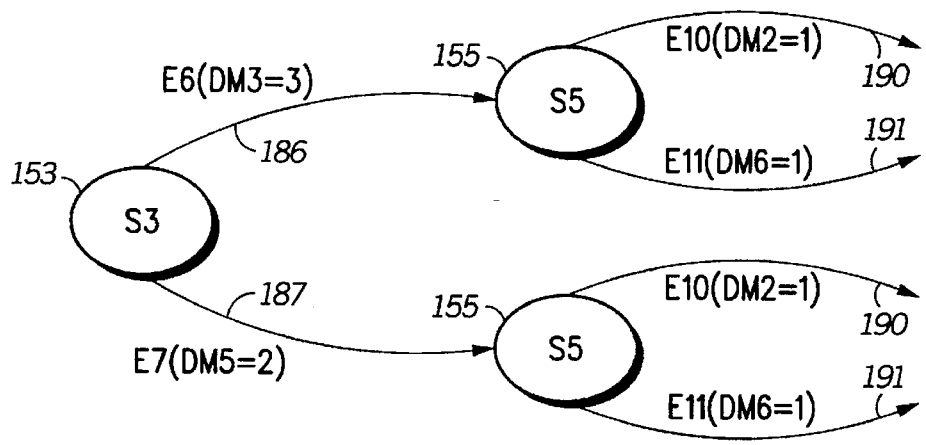

FIG. 10(b) shows the two level state diagram starting at state S3 153. Since edge E7 187 has a lower DM than edge E6 186, edge E7 187 is searched first for a FUIO. It turns out that both the edges E10 190, and E11 191, outgoing from the second level state S3 153 have DM measurement values equal to one, so a FUIO can be constructed by concatenating edge E7 187 outgoing from state S3 153 with either edge E10 190, or E11 191 outgoing from the second level state S5 155. Since both possible permutations have a DM=2 for their first leg, and a DM=1 for their second leg, the choice is arbitrary which of the two FUIOs is selected.

Figure 10C:
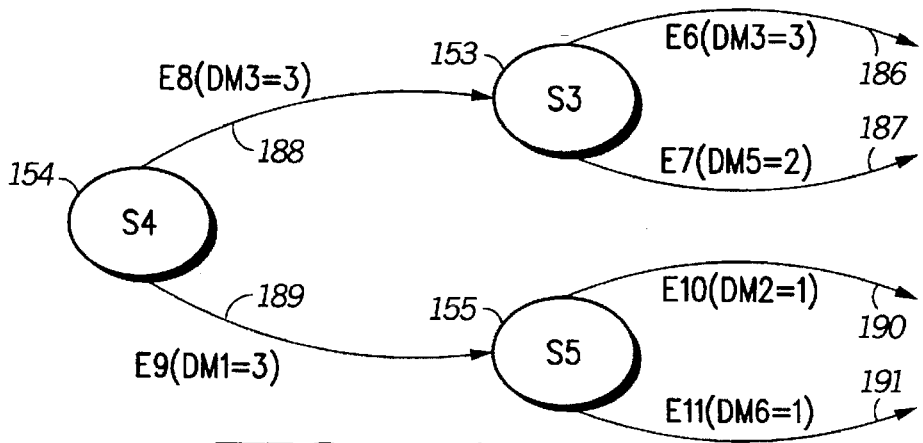

FIG. 10(c) shows the two level state diagram starting at state S4 154. Since both outgoing edges E8 188, and E9 189, have equivalent DM measurement value, the decision which to search first is arbitrary. As it turns out, several of the two level sequences are FUIOs here. However, it is advantageous to select either E9@E10 or E9@E11 since selection of a second leg of the sequence with dm=1 will probably result in increased fault coverage.

Table T-4 shows the two level fanout of various two edge sequences.

TABLE T-4

| Edge #1 | DM #1 | Edge #2 | DM #2 |
|---------|-------|---------|-------|
| E1 | dm1=3 | E1 | dm1=3 |
| E1 | dm1=3 | E2 | dm3=3 |
| E1 | dm1=3 | E3 | dm5=2 |
| E2 | dm3=3 | E5 | dm4=1 |
| E2 | dm3=3 | E4 | dm1=3 |
| E3 | dm5=2 | E9 | dm1=3 |
| E3 | dm5=2 | E8 | dm3=3 |
| E4 | dm1=3 | E11 | dm6=1 |
| E4 | dm1=3 | E10 | dm2=1 |
| E5 | dm4=1 | | |
| E6 | dm3=3 | E10 | dm2=1 |
| E6 | dm3=3 | E11 | dm6=1 |
| E7 | dm5=2 | E10 | dm2=1 |
| E7 | dm5=2 | E11 | dm6=1 |
| E8 | dm3=3 | E6 | dm3=3 |
| E8 | dm3=3 | E7 | dm5=2 |
| E9 | dm1=3 | E10 | dm2=1 |
| E9 | dm1=3 | E11 | dm6=1 |
| E10 | dm2=1 | | |
| E11 | dm6=1 | | |

Table T-5 contains the same information as Table T-4, except that it has been sorted by DM#1 and DM#2 in order to identify FUIO and non-FUIO sequences. The one and two edge FUIO sequences are marked.

TABLE T-5

| Edge #1 | DM #1 | Edge #2 | DM #2 | FUIO |
|---------|-------|---------|-------|------|
| E1 | dm1=3 | E1 | dm1=3 | |
| E4 | dm1=3 | E10 | dm2=1 | √ |
| E9 | dm1=3 | E10 | dm2=1 | |
| E1 | dm1=3 | E2 | dm3=3 | √ |
| E1 | dm1=3 | E3 | dm5=2 | √ |
| E4 | dm1=3 | E11 | dm6=1 | |
| E9 | dm1=3 | E11 | dm6=1 | |
| E10 | dm2=1 | | | √ |
| E2 | dm3=3 | E4 | dm1=3 | √ |
| E6 | dm3=3 | E10 | dm2=1 | √ |
| E8 | dm3=3 | E6 | dm3=3 | √ |
| E2 | dm3=3 | E5 | dm4=1 | √ |
| E8 | dm3=3 | E7 | dm5=2 | √ |
| E6 | dm3=3 | E11 | dm6=1 | √ |
| E5 | dm4=1 | | | √ |
| E3 | dm5=2 | E9 | dm1=3 | √ |
| E7 | dm5=2 | E10 | dm2=1 | √ |
| E3 | dm5=2 | E8 | dm3=3 | √ |
| E7 | dm5=2 | E11 | dm6=1 | √ |
| E11 | dm6=1 | | | √ |

In the above example, states or vertices were checked in arbitrary order for FUIO sequences. In the case of a Finite State Machine model that is not fully specified, FUIO search performance can be enhanced by first assigning each state or vertex a Distinctness Measurement (DM) consisting of the sum of the Distinctness Measurements (DM) of the state's outgoing edges or TRansitions. The vertices or states are then sorted by vertex DM, and a FUIO search made first on the vertices with the lowest DM.

FIG. 11 has five subfigures (11(a) to 11(e)). These five subfigures are state diagrams showing the incoming transition edges to each of the five states shown in FIG. 8. FIG.

Figure 11E:
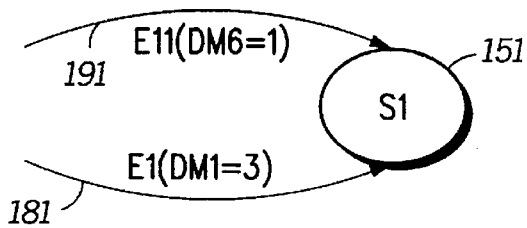
FIG. 11 is a FSM model state transition diagram showing the one level incoming transitions for the five states shown in FIG. 8.
Figure 11E:
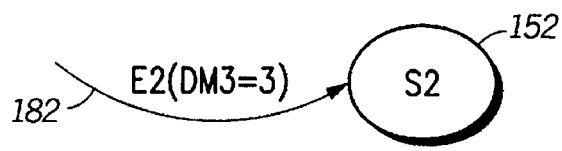
Figure 11E:
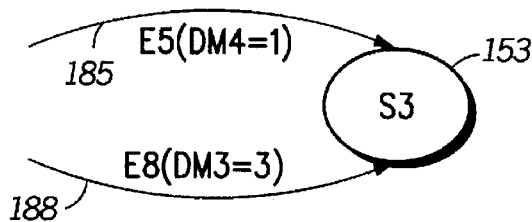
Figure 11E:
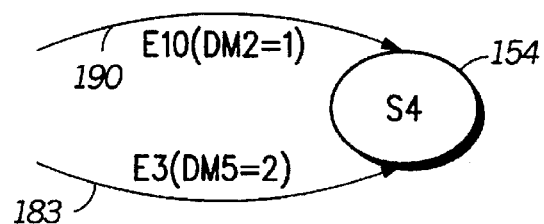
Figure 11E:
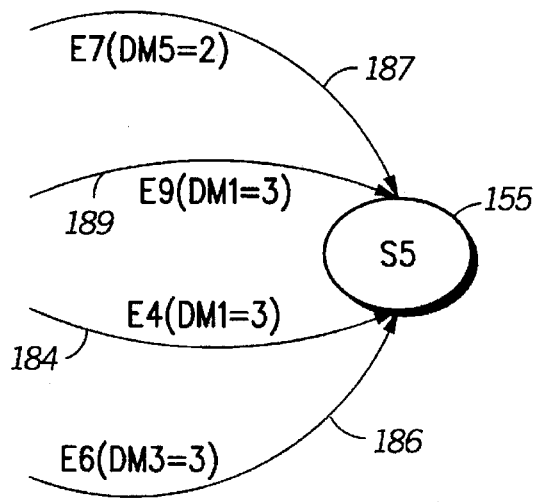

11(a) shows state S1 151 and its two incoming TRansitions E1 181, and E11 191. FIG. 11(b) shows state S2 152 with its single incoming transition E2 182. FIG. 11(c) shows state S3 153 with its two incoming TRansitions E5 185, and E8 188. FIG. 11(d) shows state S4 154 with its two incoming TRansitions E3 183, and E10 190. Finally, FIG. 11(e) shows state S5 155 with its four incoming TRansitions E4 184, E6 186, E7 187, and E9 189.

BUIO sequences can be immediately ascertained for states S1 151, S3 153, and S4 154. The BUIO sequence for state S1 151 is transition edge E11 191, since its distinctness measurement is one. The BUIO sequence for state S3 153 is transition edge E5 185, again with a distinctness measurement equal to one. Likewise, the BUIO sequence for state S4 154 is transition edge E10 190.

Figure 12A:
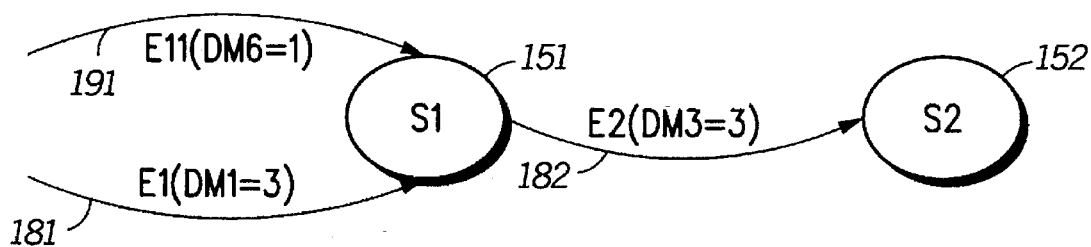
FIG. 12 is a FSM model state transition diagram showing the two level incoming transitions for the two states shown in FIG. 11 that did not have one level or single edge BUIO sequences.

FIG. 12 has two subfigures (12(a) and 12(b)) showing state diagrams for the two states, S2 152, and S5 155, that did not have one level or single edge BUIO sequences. FIG. 12(a) shows the two level fanout of incoming TRansitions for state S2 152. By searching the second level edges for lowest distinctness measurement, a BUIO is transition edge E11 191 followed by edge E2 182 is readily identified.

Figure 12B:
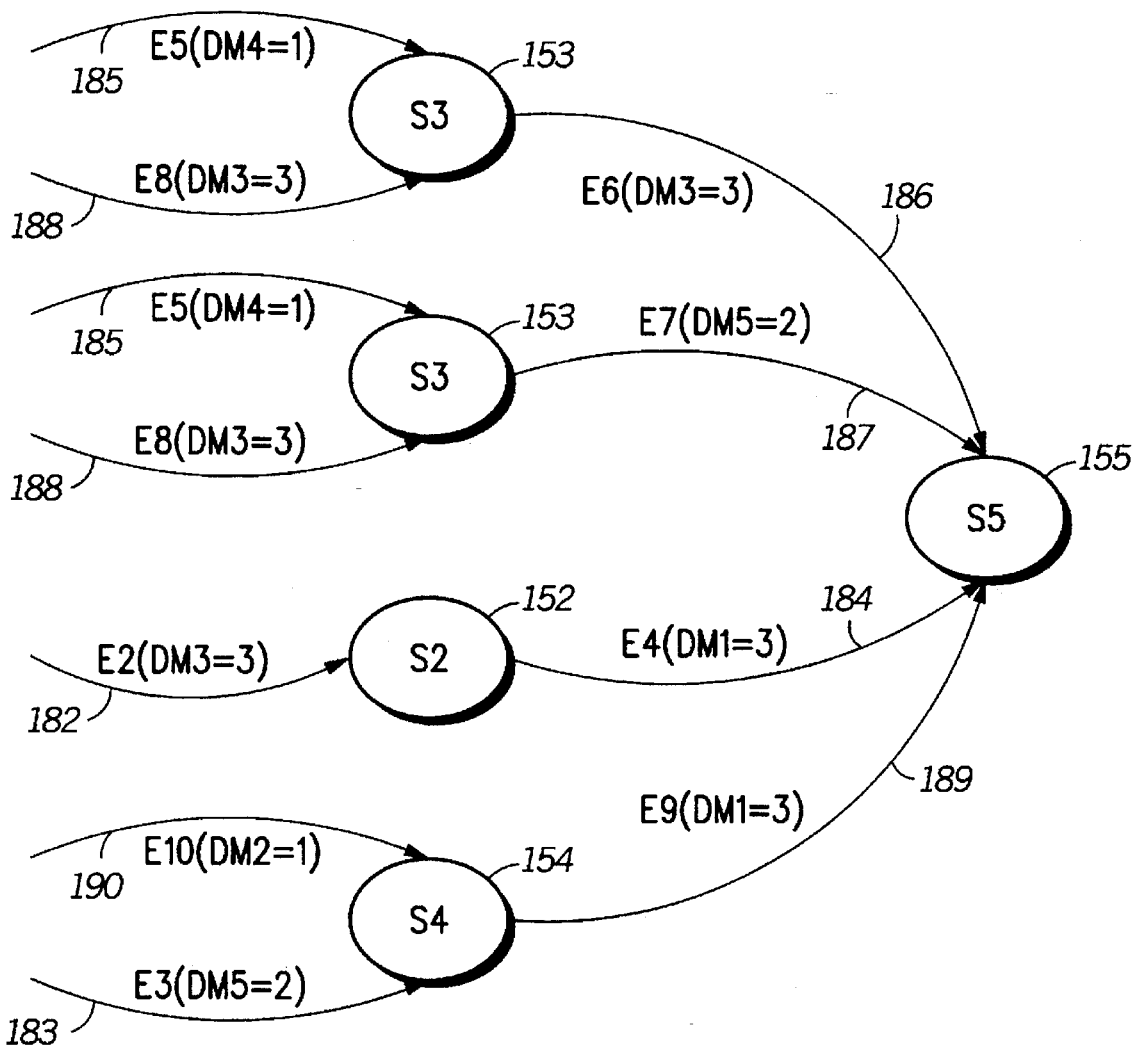

FIG. 12(b) is a state diagram showing a two level fanout of incoming TRansitions to state S5 155. Numerous two level BUIO are present. However, it is advantageous to search for UIO sequences on the TRansitions with the lowest Distinctness Measurement (DM) first. Thus, the preferred BUIO sequence for state S5 155 is transition edge E5 185 followed by edge E7 187 since edge E7 187 has the lowest dm value for the first level font, and edge E5 185 has the lowest dm value for the second level font. This selection of low distinctness measurement edges results in increased fault coverage.

Table T-6 shows the BUIO sequences for the FSM initially shown in FIG. 10(a). States S1, S3, and S4 only have a one level font, since each has at least one BUIO sequence of length one. States S2 and S4 have two level fanouts. Table T-7 contains the same data as Table T-6, except that it is sorted by Edge#1 and Edge#2. This allows rapid identification of BUIO sequences.

TABLE T-6

| State | Edge #1 | DM #1 | Edge #2 | DM #2 |
|---|---|---|---|---|
| S1 | E11 | dm6=1 | | |
| S2 | E2 | dm3=3 | E1 | dm1=3 |
| S2 | E2 | dm3=3 | E11 | dm6=1 |
| S3 | E5 | dm4=1 | | |
| S4 | E10 | dm2=1 | | |
| S5 | E6 | dm3=3 | E5 | dm4=1 |
| S5 | E6 | dm3=3 | E8 | dm3=3 |
| S5 | E7 | dm5=2 | E5 | dm4=1 |
| S5 | E7 | dm5=2 | E8 | dm3=3 |
| S5 | E4 | dm1=3 | E2 | dm3=3 |
| S5 | E9 | dm1=3 | E3 | dm5=2 |
| S5 | E9 | dm1=3 | E10 | dm2=1 |

TABLE T-7

| State | Edge #1 | DM #1 | Edge #2 | DM #2 | BUIO |
|---|---|---|---|---|---|
| S5 | E9 | dm1=3 | E10 | dm2=1 | √ |
| S5 | E4 | dm1=3 | E2 | dm3=3 | √ |
| S5 | E9 | dm1=3 | E3 | dm5=2 | √ |
| S4 | E10 | dm2=1 | | | √ |
| S2 | E2 | dm3=3 | E1 | dm1=3 | √ |
| S5 | E6 | dm3=3 | E8 | dm3=3 | √ |
| S5 | E6 | dm3=3 | E5 | dm4=1 | √ |

TABLE T-7-continued

| State | Edge #1 | DM #1 | Edge #2 | DM #2 | BUIO |
|---|---|---|---|---|---|
| S2 | E2 | dm3=3 | E11 | dm6=1 | √ |
| S3 | E5 | dm4=1 | | | √ |
| S5 | E7 | dm5=2 | E8 | dm3=3 | √ |
| S5 | E7 | dm5=2 | E5 | dm4=1 | √ |
| S1 | E11 | dm6=1 | | | √ |

Table T-8 was constructed by selecting one FUIO sequence (see Table T-5) and one BUIO sequence (see Table T-7) for each state. The edges have been replaced by the appropriate labels (see Table T-3).

The criteria used here to select BUIO and FUIO sequences was:

1) Always prefer a one edge UIO sequence over a two edge sequence.

2) On a fanout, look for UIO sequences first on the edges with the lowest DM value.

3) Always select the edge with lowest DM value at any given state. It should be noted that other selection criteria may be alternatively implemented. Additionally, note that the preferred implementation uses an adjustable timer based on the search tree depth to determine whether or not UIO sequences for any given state can be identified within a given cost limit. If neither a FUIO or BUIO can be identified for any given EUT, a FUIOset and/or a BUIOset may be constructed.

Each FUIO, BUIO, FUIOset, and BUIOset is a UIO Set which uniquely identifies a FSM state. The set of all UIO Sets that uniquely identify the same FSM state are Sets of UIO Sets. A Set of EUT UIO Sets is the set of all UIO Sets that uniquely identify either the EUT starting state, or the EUT ending state. A Set of EUT UIO Sets may comprise UIO Sets of different classes, for example a Set of EUT UIO Sets may include both a FUIO and a BUIO. In that case, either the FUIO or the BUIO could be selected for Test Subsequence (TS) construction.

TABLE T-8

| State | FUIO Edges | FUIO Seq. | BUIO Edges | BUIO Seq. |
|---|---|---|---|---|
| S1 | E3 @ E8 | $DL_5$ @ $DL_3$ | E11 | $DL_6$ |
| S2 | E5 | $DL_4$ | E11 @ E2 | $DL_6$ @ $DL_3$ |
| S3 | E7 @ E10 | $DL_5$ @ $DL_6$ | E5 | $DL_4$ |
| S4 | E9 @ E10 | $DL_1$ @ $DL_6$ | E10 | $DL_2$ |
| S5 | E10 | $DL_2$ | E5 @ E7 | $DL_4$ @ $DL_5$ |

Table T-9 shows the generation of Test Subsequences (TS) based primarily on always selecting a FUIO first, regardless of length, if it is available, even if it is longer than the BUIO sequence for any given state.

The Test Subsequences (TS) in Table T-9 were constructed by first taking each of the original transition edges as the Edges Under Test (EUT). Following each of these EUTs was concatenated the FUIO sequences shown in Table T-8 for the ending state for each of the EUT states. In this case it was convenient to first construct each Test Subsequence ($TS_i$) by concatenating all the relevant edges. Then, each edge, was replaced by the appropriate I/O label ($DL_i$) from Table T-3. The starting state was the starting state of the first edge in the sequence, and the ending state was the stop state of the last edge in the FUIO sequence.

TABLE T-9

| EUT Edge | EUT Seq. | B/F | UIO Edges | UIO Seq. | TS Edges | Start State | Stop State | TS |
|---|---|---|---|---|---|---|---|---|
| E1 | $DL_1$ | F | E3 @ E8 | $DL_5$ @ $DL_3$ | E1 @ E3 @ E8 | S1 | S3 | $DL_1DL_5$@$DL_3$ |
| E2 | $DL_3$ | F | E5 | $DL_4$ | E2 @ E5 | S1 | S3 | $DL_3$ @ $DL_4$ |
| E3 | $DL_5$ | F | E9 @ E10 | $DL_1$ @ $DL_6$ | E3 @ E9 @ E10 | S1 | S4 | $DL_5DL_1$ @ $DL_6$ |
| E4 | $DL_1$ | F | E10 | $DL_2$ | E4 @ E10 | S2 | S4 | $DL_1$ @ $DL_2$ |
| E5 | $DL_4$ | F | E7 @ E10 | $DL_5$ @ $DL_6$ | E5 @ E7 @ E10 | S2 | S4 | $DL_4$ @ $DL_5$ @ $DL_6$ |
| E6 | $DL_3$ | F | E10 | $DL_2$ | E6 @ E10 | S3 | S4 | $DL_3$ @ $DL_2$ |
| E7 | $DL_5$ | F | E10 | $DL_2$ | E7 @ E10 | S3 | S4 | $DL_5$ @ $DL_2$ |
| E8 | $DL_3$ | F | E7 @ E10 | $DL_5$@$DL_6$ | E8 @ E7 @ E10 | S4 | S4 | $DL_3$ @ $DL5$ @ $DL_6$ |
| E9 | $DL_1$ | F | E10 | $DL_2$ | E9 @ E10 | S4 | S4 | $DL_1$ @ $DL_2$ |
| E10 | $DL_2$ | F | E9 @ E10 | $DL_1$ @ $DL_6$ | E10 @ E9 @ E10 | S5 | S4 | $DL_2$ @ $DL_1$ @ $DL_2$ |
| E11 | $DL_6$ | F | E3 @ E8 | $DL_5$ @ $DL_3$ | E11 @ E3 @ E8 | S5 | S3 | $DL_6$ @ $DL_5$ @ $DL_3$ |

Table T-10 is similar to Table T-9, except that it was constructed by always selecting the appropriate BUIO instead of the FUIO used in Table T-9. The Test Subsequence Edges were constructed by concatenating the BUIO Edges from Table T-8 in front of each of the Edges Under Test (EUT).

Note that the criteria used here are for demonstration purposes only. Other criteria may yield acceptable performance. One alternative is to select the UIO sequence with the lowest cumulative DM measurement for all edges in a potential UIO sequence. Another alternative is to select the UIO sequence with the lowest cost.

TABLE T-10

| EUT Edge | EUT Seq. | B/F | UIO Edges | UIO Seq. | TS Edges | Start State | Stop State | TS |
|---|---|---|---|---|---|---|---|---|
| E1 | $DL_1$ | B | E11 | $DL_6$ | E11 @ E1 | S5 | S1 | $DL_6$ @ $DL_1$ |
| E2 | $DL_3$ | B | E11 | $DL_6$ | E11 @ E2 | S5 | S2 | $DL_6$ @ $DL_3$ |
| E3 | $DL_5$ | B | E11 | $DL_6$ | E11 @ E3 | S5 | S4 | $DL_6$ @ $DL_5$ |
| E4 | $DL_1$ | B | E11 @ E2 | $DL_6$ @ $DL_3$ | E11 @ E2 @ E4 | S2 | S5 | $DL_6$ @ $DL_3$ @ $DL_1$ |
| E5 | $DL_4$ | B | E11 @ E2 | $DL_6$ @ $DL_3$ | E11 @ E2 @ E5 | S2 | S3 | $DL_6$ @ $DL_3$ @ $DL_4$ |
| E6 | $DL_3$ | B | E5 | $DL_4$ | E5 @ E6 | S3 | S5 | $DL_4$ @ $DL_3$ |
| E7 | $DL_5$ | B | E5 | $DL_4$ | E5 @ E7 | S3 | S5 | $DL_4$ @ $DL_5$ |
| E8 | $DL_3$ | B | E10 | $DL_2$ | E10 @ E8 | S5 | S3 | $DL_2$ @ $DL_3$ |
| E9 | $DL_1$ | B | E10 | $DL_2$ | E10 @ E9 | S4 | S5 | $DL_2$ @ $DL_1$ |
| E10 | $DL_2$ | B | E5 @ E7 | $DL_4$ @ $DL_5$ | E5 @ E7 @ E10 | S2 | S4 | $DL_4$ @ $DL_5$ @ $DL_2$ |
| E11 | $DL_6$ | B | E5 @ E7 | $DL_4$ @ $DL_5$ | E5 @ E7 @ E11 | S2 | S1 | $DL_4$ @ $DL_5$ @ $DL_6$ |

Table T-11 is similar to Tables T-9 and T-10 except that it was constructed by selecting either the BUIO or the FUIO for each Edge Under Test (EUT), depending on which appeared to be optimal.

TABLE T-11

| EUT Edge | EUT Seq. | B/F | UIO Edges | UIO Seq. | TS Edges | Start State | Stop State | TS |
|---|---|---|---|---|---|---|---|---|
| E1 | $DL_1$ | B | E11 | $DL_6$ | E11 @ E1 | S5 | S1 | $DL_6$ @ $DL_1$ |
| E2 | $DL_3$ | F | E5 | $DL_4$ | E2 @ E5 | S1 | S3 | $DL_3$ @ $DL_4$ |
| E3 | $DL_5$ | B | E11 | $DL_6$ | E11 @ E3 | S5 | S4 | $DL_6$ @ $DL_5$ |
| E4 | $DL_1$ | F | E10 | $DL_2$ | E4 @ E10 | S2 | S4 | $DL_1$ @ $DL_2$ |
| E5 | $DL_4$ | F | E7 @ E10 | $DL_5$ @ $DL_6$ | E5 @ E7 @ E10 | S2 | S4 | $DL_4$ @ $DL_5$ @ $DL_6$ |
| E6 | $DL_3$ | F | E10 | $DL_2$ | E6 @ E10 | S3 | S4 | $DL_3$ @ $DL_2$ |
| E7 | $DL_5$ | F | E10 | $DL_2$ | E7 @ E10 | S3 | S4 | $DL_5$ @ $DL_2$ |
| E8 | $DL_3$ | B | E10 | $DL_2$ | E10 @ E8 | S5 | S3 | $DL_2$ @ $DL_3$ |
| E9 | $DL_1$ | F | E10 | $DL_2$ | E9 @ E10 | S4 | S4 | $DL_1$ @ $DL_2$ |
| E10 | $DL_2$ | B | E5 @ E7 | $DL_4$ @ $DL_5$ | E5 @ E7 @ E10 | S2 | S4 | $DL_4$ @ $DL_5$ @ $DL_2$ |
| E11 | $DL_6$ | B | E5 @ E7 | $DL_4$ @ $DL_5$ | E5 @ E7 @ E11 | S2 | S1 | $DL_4$ @ $DL_5$ @ $DL_6$ |

The criteria used to select whether a BUIO or FUIO would be used for a particular EUT was similar to the criteria used above to construct BUIO and FUIO sequences:

1) Shorter sequences were preferred to longer ones.

2) Sequences with initially lower DM measures were preferred to those with higher DM measurements.

Figure 13:
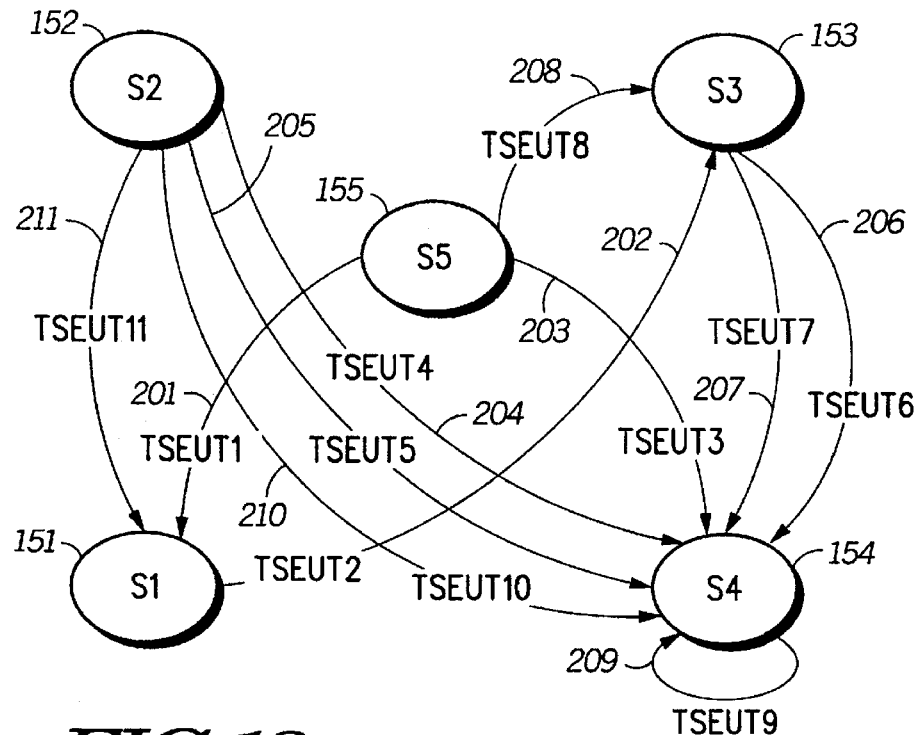
FIG. 13 shows a FSM model state transition diagram of the Test Subsequence (TS) graph constructed, from the FSM model shown in FIG. 8 and utilizing the Test Subsequences shown in the last column of Table T-11.

FIG. 13 shows a FSM state diagram of the states S1 151 to S5 155 shown in FIG. 8 to 12 with the transition edges E1 181 to E11 191 replaced by the Test Subsequences (TSeut$_1$) corresponding to the Test Subsequences shown in the last column of Table T-11. This is the last step in Creating a Test Subsequence Graph 20. The eleven Test Subsequences (TS), or Micro-Edges, are titled TSeut1 through TSeut11, corresponding to Edge-Under-Test (EUT) edges E1 181 through E11 191. Thus, TSeut1 is the Test Subsequence (TS) for testing edge E1 181, consisting of the stimulus/response I/O sequence of $DL_6$@$DL_1$ (or (c/z)@(a/x), see Table T-2) traversing from state S5 155 to state S1 151.

As the FSM currently being described is not hierarchical, but rather one level, the Merge Test Subsequence Graph 22 and Merge FSM Graph 24 steps are not necessary, and thus are not discussed at this time. The Test Subsequence Graph 65 is equivalent to the Merged Test Subsequence Graph 39, and the FSM Graph 53 is equivalent to the Merged FSM Graph 83. The discussion can now turn to the Construction of Bridging Sequences, step 26.

Table T-12 is constructed from Table T-11 by listing each of the five states S1 151 through 155 and tallying for each state the number of incoming and outgoing micro-edges or Test Subsequences. The differences between these two numbers for each state are the in-degree and out-degree for that state. Note that the numbers of incoming and outgoing edges are each equal to the total number of edges in the FSM (11), while the sum of the in-degrees and out-degrees are both equal to zero.

TABLE T-12

| State | # Out | # In | Out$\Delta$ | In$\Delta$ |
|---|---|---|---|---|
| S1 | 1 | 2 | −1 | +1 |
| S2 | 4 | 0 | +4 | −4 |
| S3 | 2 | 2 | 0 | 0 |
| S4 | 1 | 7 | −6 | +6 |
| S5 | 3 | 0 | +3 | −3 |
| Total | 11 | 11 | 0 | 0 |

One of the requirements for an Euler Tour is that the graph be symmetric. This means that, except possibly for a single source and sink, the number of incoming and outgoing edges must be equal for each state. This is true, since the goal of the Euler Tour is to tour the graph one time, without retracing steps. Thus, when touring a non-symmetric graph, one is destined to get stuck in a state / node that has more incoming than outgoing edges.

The purpose then of Constructing Bridging Sequences 26 is to augment a (Merged) Test Subsequence Graph 39 (such as is shown in FIG. 13) with the addition of micro-edges so as to make it symmetric. Thus, every state (S1 151, S4 154) that has more outgoing micro-edges than incoming micro-edges must have enough incoming micro-edges added to equal the outgoing micro-edges. Likewise, every state (S2 154, S5 155) with a greater number of incoming micro-edges must be augmented with outgoing micro-edges until the number of incoming and outgoing micro-edges is equal for all states in the (Merged) Test Subsequence Graph 39. The result is an Augmented Test Subsequence Graph 95.

One implementation of Constructing Bridging Sequences 26 starts by sorting the states (S1 151, S4 154) where outdegree is greater than indegree, and sorting the states (S2 154, S5 155) were indegree is greater than outdegree. The states with the highest (indegree-outdegree) (S2 152) is matched with the state with the highest (outdegree-indegree) (S4 154). The maximum number of identical augmenting micro-edges possible are constructed between these two states. This proceeds until augmenting micro-edges have been built between the states (S2 154, S5 155) with (outdegree-indegree) greater than zero to those states (S1 151, S4 154) with (indegree-outdegree) greater than zero. Thus each state in the resulting Augmented Test Subsequence Graph 95 will have the same number of incoming and outgoing edges, allowing a Euler Tour 28 of the augmented Test Subsequence Graph 95.

TABLE T-13

| TS Name | Start State | Stop State | Augmented Micro-Edge | Test Subsequence |
|---|---|---|---|---|
| $TS_{ame1}$ | S4 | S2 | E9 @ E11 @ E2 | $DL_1$ @ $DL_6$ @ $DL_3$ |
| $TS_{ame2}$ | S4 | S2 | E9 @ E11 @ E2 | $DL_1$ @ $DL_6$ @ $DL_3$ |
| $TS_{ame3}$ | S4 | S2 | E9 @ E11 @ E2 | $DL_1$ @ $DL_6$ @ $DL_3$ |
| $TS_{ame4}$ | S4 | S2 | E9 @ E11 @ E2 | $DL_1$ @ $DL_6$ @ $DL_3$ |
| $TS_{ame5}$ | S4 | S5 | E9 | $DL_1$ |
| $TS_{ame6}$ | S4 | S5 | E9 | $DL_1$ |
| $TS_{ame7}$ | S1 | S5 | E3 @ E9 | $DL_5$ @ $DL_1$ |

Table T-13 shows the construction of Test Subsequence Augmented Micro-Edges (TSame) in order to make the Test Subsequence Graph 65 shown in FIG. 13 symmetric. We start by first finding a path from state S4 154 to state S2 152. Several approaches are possible here. One alternative is to try to construct the path as much as possible from UIOs (see Tables T-5, T-7, and T-8). The Test Subsequences in Table T-13 were constructed from the shortest length sequences possible. Should there be multiple sequences of that shortest length, the sequence with the lowest cumulative DM value is selected. Note that once a single path for one state to another is selected, it is replicated if necessary the number of times corresponding to the number of times that the two states overlap. Thus, four copies of the path from state S4 154 to state S2 152 are created. This procedure is repeated for every pairing resulting from the sort. This matching and replication minimizes computational resource utilization.

One alternative when there a, re comparably longer Test Subsequences of the same length between the same two states is to rotate through these paths. This thereby maximizing fault coverage. Another alternative is to construct lowest cost micro-edges.

Figure 14:
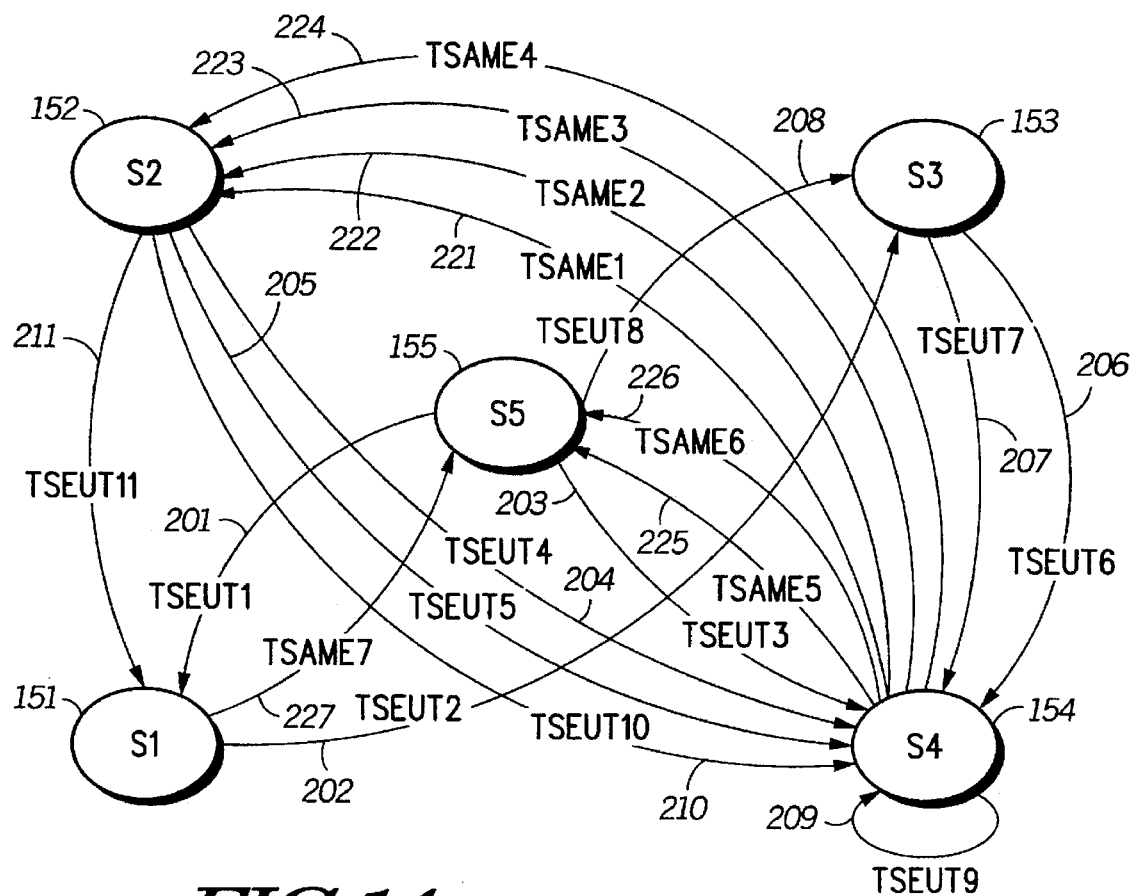
FIG. 14 is a FSM model state transition diagram showing the Test Subsequence Graph shown in FIG. 13 augmented to make it symmetric in order to allow an Euler Tour to be performed. The symmetry is obtained by adding the Test Subsequence Bridging Sequences shown in Table T-13 to the FIG. 13 Test Subsequence Graph.

FIG. 14 is a state diagram for the Test Subsequence Graph 65 shown in FIG. 13 augmented to make it symmetric in order to allow an Euler Tour 42 be performed. The symmetry is obtained by adding the bridging sequences shown in Table T-13 to the FIG. 13 Test Subsequence Graph 65.

Table T-14 lists the Test Subsequences or Micro-Edges that make up the Augmented Test Subsequence Graph 95. It is created by combining the information in Tables T-11 and T-13.

TABLE T-14

| TS Name | Start State | Stop State | Augmented Micro-Edge | Test Subsequence |
|---|---|---|---|---|
| $TS_{eut1}$ | S5 | S1 | E11 @ E1 | $DL_6$ @ $DL_1$ |
| $TS_{eut2}$ | S1 | S3 | E2 @ E5 | $DL_3$ @ $DL_4$ |
| $TS_{eut3}$ | S5 | S4 | E11 @ E3 | $DL_6$ @ $DL_5$ |
| $TS_{eut4}$ | S2 | S4 | E4 @ E10 | $DL_1$ @ $DL_2$ |
| $TS_{eut5}$ | S2 | S4 | E5 @ E7 @ E10 | $DL_4$ @ $DL_5$ @ $DL_6$ |
| $TS_{eut6}$ | S3 | S4 | E6 @ E10 | $DL_3$ @ $DL_2$ |
| $TS_{eut7}$ | S3 | S4 | E7 @ E10 | $DL_5$ @ $DL_2$ |
| $TS_{eut8}$ | S2 | S4 | E10 @ E8 | $DL_2$ @ $DL_3$ |
| $TS_{eut9}$ | S4 | S4 | E9 @ E10 | $DL_1$ @ $DL_2$ |
| $TS_{eut10}$ | S2 | S4 | E5 @ E7 @ E10 | $DL_4$ @ $DL_5$ @ $DL_2$ |
| $TS_{eut11}$ | S2 | S1 | E5 @ E7 @ E11 | $DL_4$ @ $DL_5$ @ $DL_6$ |
| $TS_{ame1}$ | S4 | S2 | E9 @ E11 @ E2 | $DL_1$ @ $DL_6$ @ $DL_3$ |
| $TS_{ame2}$ | S4 | S2 | E9 @ E11 @ E2 | $DL_1$ @ $DL_6$ @ $DL_3$ |
| $TS_{ame3}$ | S4 | S2 | E9 @ E11 @ E2 | $DL_1$ @ $DL_6$ @ $DL_3$ |
| $TS_{ame4}$ | S4 | S2 | E9 @ E11 @ E2 | $DL_1$ @ $DL_6$ @ $DL_3$ |
| $TS_{ame5}$ | S4 | S5 | E9 | $DL_1$ |
| $TS_{ame6}$ | S4 | S5 | E9 | $DL_1$ |
| $TS_{ame7}$ | S1 | S5 | E3 @ E9 | $DL_5$ @ $DL_1$ |

21

Table T-15 contains the same information as Table T-14, except that it is sorted by Start and Stop states. This form is more useful in the Euler Tour.

TABLE T-15

| TS Name | Start State | Stop State | Augmented Micro-Edge | Test Subsequence |
|---|---|---|---|---|
| TS$_{eut2}$ | S1 | S3 | E2 @ E5 | DL$_3$ @ DL$_4$ |
| TS$_{ame7}$ | S1 | S5 | E3 @ E9 | DL$_5$ @ DL$_1$ |
| TS$_{eut11}$ | S2 | S1 | E5 @ E7 @ E11 | DL$_4$ @ DL$_5$ @ DL$_6$ |
| TS$_{eut10}$ | S2 | S4 | E5 @ E7 @ E10 | DL$_4$ @ DL$_5$ @ DL$_2$ |
| TS$_{eut4}$ | S2 | S4 | E4 @ E10 | DL$_1$ @ DL$_2$ |
| TS$_{eut5}$ | S2 | S4 | E5 @ E7 @ E10 | DL$_4$ @ DL$_5$ @ DL$_6$ |
| TS$_{eut6}$ | S3 | S4 | E6 @ E10 | DL$_3$ @ DL$_2$ |
| TS$_{eut7}$ | S3 | S4 | E7 @ E10 | DL$_5$ @ DL$_2$ |
| TS$_{ame1}$ | S4 | S2 | E9 @ E11 @ E2 | DL$_1$ @ DL$_6$ @ DL$_3$ |
| TS$_{ame2}$ | S4 | S2 | E9 @ E11 @ E2 | DL$_1$ @ DL$_6$ @ DL$_3$ |
| TS$_{ame3}$ | S4 | S2 | E9 @ E11 @ E2 | DL$_1$ @ DL$_6$ @ DL$_3$ |
| TS$_{ame4}$ | S4 | S2 | E9 @ E11 @ E2 | DL$_1$ @ DL$_6$ @ DL$_3$ |
| TS$_{eut9}$ | S4 | S4 | E9 @ E10 | DL$_1$ @ DL$_2$ |
| TS$_{ame5}$ | S4 | S5 | E9 | DL$_1$ |
| TS$_{ame6}$ | S4 | S5 | E9 | DL$_1$ |
| TS$_{eut1}$ | S5 | S1 | E11 @ E1 | DL$_6$ @ DL$_1$ |
| TS$_{eut8}$ | S5 | S3 | E10 @ E8 | DL$_2$ @ DL$_3$ |
| TS$_{eut3}$ | S5 | S4 | E11 @ E3 | DL$_6$ @ DL$_5$ |

The Euler Method, step 42, is used to tour an Augmented Test Subsequence Graph 95. The following method for performing an Euler Tour is for demonstrative purposes only. Other methods are also envisioned. Also note that other methods of touring an Augmented Test Subsequence Graph 95 are envisioned. For example, the Chinese Postman Tour utilized by Dahbura et al. may be utilized. The use of the Euler method is advantageous in many instances due to its speed over other tour methods. Another advantage is that the Euler Tour does not require a Merged FSM Graph 83 to be strongly connected. This strong connection is required by the Chinese Postman Tour.

The Euler Tour 42 starts by initializing all states to "White" state, indicating that the states have not yet been toured. Two Depth First Searches (DFS) are performed in order to identify strongly connected components. In the first DFS call, the finish exploring time of each node is returned and used in the second DFS call. The second DFS call searches the graph backwards comparing to the first DFS call, and the search is in a decreasing order of the finish times from the first DFS call.

Figure 15A:
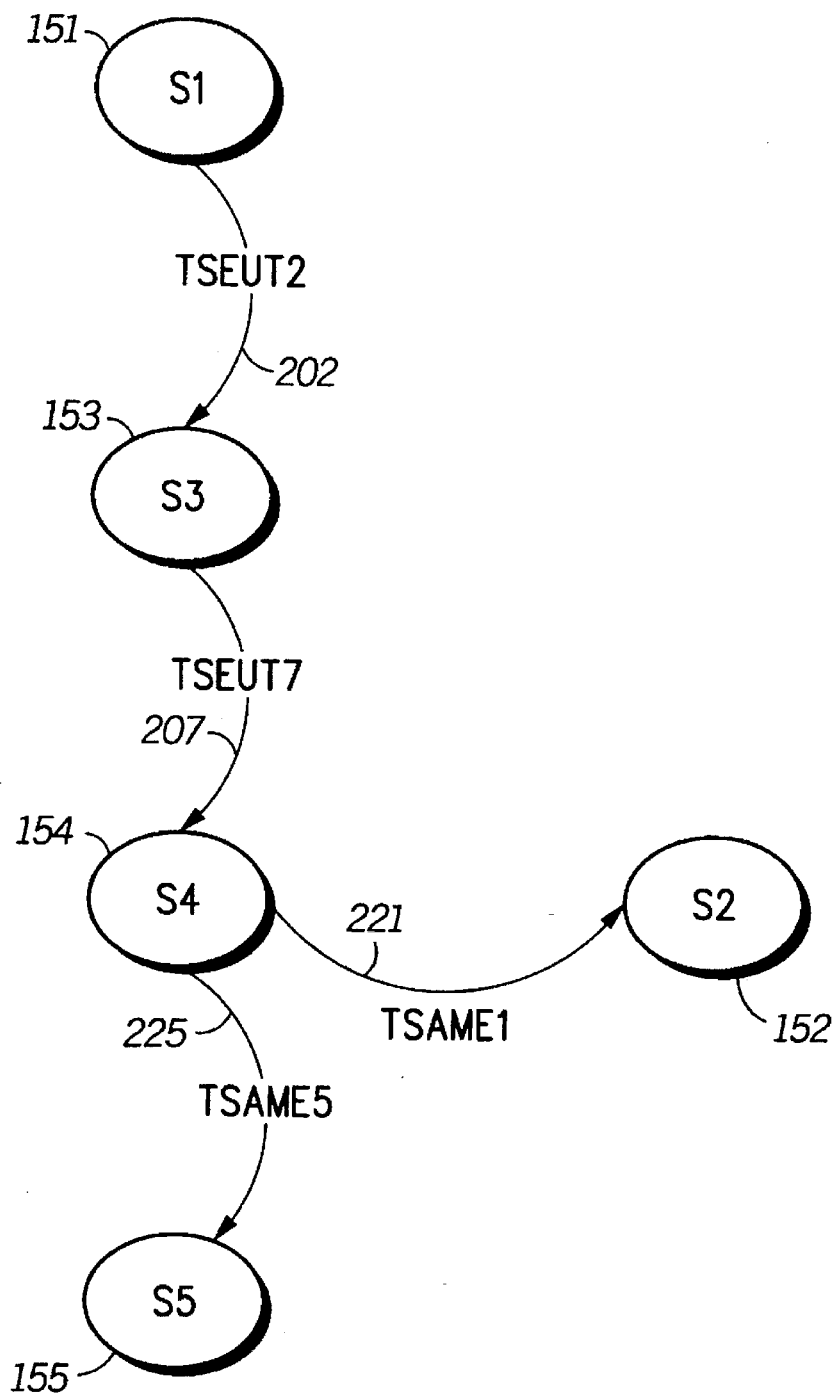
FIG. 15A is constructed from the first Depth First Search (DFS)

FIG. 15A is a state diagram showing the results of the first DFS search. The search is started by arbitrarily picking one state. In this example, state S1 151 is selected first. It is entered at Start Time (ST) equal to one. Its color is set to "Gray", indicating that the state has been entered but not returned from. A search is made of the outgoing edges or TRansitions from S1 151. Edge TS$_{eut2}$ 202 is followed to state S3 153 at Start Time (ST) equal to two. Likewise, Micro-Edge TS$_{eut7}$ 207 is followed to state S4 154 at Start Time (ST) equal to three.

State S5 155 is entered at Start Time (ST) equal to 4. State S5 155 has no unused outgoing TRansitions, so the DFS search exits from State S5 155 at Exit Time (ET) equal to five, setting its color to "Black". Micro-edge TS$_{ame1}$ is then followed to state S2 152, which is entered at ST equal to 6. There are no more unvisited states, so the DFS search returns from S2 152 at Exit Time (ET) equal to 7, from S4 154 at ET=8, S3 153 at TF=9, and S1 151 at TF=10. The color of each state is set to "Black" as the state is exited. Table T-16 shows the results of the first DFS search.

22

TABLE T-16

| T | S1 ST | S1 ET | S1 C | S2 ST | S2 ET | S2 C | S3 ST | S3 ET | S3 C | S4 ST | S4 ET | S4 C | S5 ST | S5 ET | S5 C |
|---|---|---|---|---|---|---|---|---|---|---|---|---|---|---|---|
| 0 |   |   |   |   |   |   |   |   |   |   |   |   |   |   |   |
| 1 | 1 |   |   |   |   |   |   |   |   |   |   |   |   |   |   |
| 2 | 1 |   |   | 2 |   |   |   |   |   |   |   |   |   |   |   |
| 3 | 1 |   |   | 2 |   |   | 3 |   |   |   |   |   |   |   |   |
| 4 | 1 |   |   | 2 |   |   | 3 |   |   |   |   |   |   |   |   |
| 5 | 1 |   |   | 2 |   |   | 3 |   |   | 4 |   |   |   |   |   |
| 6 | 1 |   |   | 2 |   |   | 3 |   |   | 4 | 5 |   |   |   |   |
| 7 | 1 |   |   | 6 |   |   | 2 |   |   | 3 |   |   | 4 | 5 |   |
| 8 | 1 |   |   | 6 | 7 |   | 2 |   |   | 3 | 8 |   | 4 | 5 |   |
| 3 | 1 |   |   | 6 | 7 |   | 2 | 9 |   | 3 | 8 |   | 4 | 5 |   |
| 10 | 1 | 10 |   | 6 | 7 |   | 2 | 9 |   | 3 | 8 |   | 4 | 5 |   |

The second DFS search is also started by arbitrarily picking one state. In this example, state S1 151 is selected first. The DFS again starts at time ("T") equal to 1. The start time ("ST") for S1 151 is set to one (1), and the color ("C") to gray, to indicate that state S1 151 has been entered, but not completed. An incoming micro-edge or transition is selected. In order to select an incoming micro-edge, all incoming micro-edges are followed back to their source. The Exit Time (ET) of all the states with outgoing micro-edges ending in S1 151 are compared, and the state, S2 152, with the greatest Exit Time (ET) is selected. The two requirements for this selection is that 1) the state from which the selected edge is coming has not yet been entered, indicated by a color of "White", and 2) of all the states colored "White", the state with the greatest Exit Time (ET) is selected.

Micro-edge TSeut11 211 is followed back to state S2 152, which is entered at time ("T") equal to two (2). The state is set to color "Gray", with its entering time set to two (2). The only micro-edges entering state S2 152 come from state S4 154. One of these micro-edges is arbitrarily selected, such as edge TSame1 221, becoming the "Tree" Edge between S4 154 and S2 152.

Micro-edge TSame1 221 is followed back to state S4 154, which is entered at time ("T") equal to three (3). The state is set to color "Gray", and its entering time set to three (3). A transition from an untraversed state to state S4 154 is selected. Micro-edge TSeut6 206 is selected as the "Tree" Edge or transition from S3 153 to S4 154.

Micro-edges terminating at state S4 154 come from S2 152, S3 153, and S5 155. State S2 152 has already been entered, so it's TRansitions are ignored. State S3 153 is selected since its Exit Time (ET) is greater than the Exit Time for state S5 155. Micro-edge TSeut6 206 is followed back to state S3 153 which is entered at time ("T") equal to four (4). The state is set to color "Gray", and its entering time set to four (4). A transition from the only untraversed state S5 155 to state S3 153 is selected. Micro-edge TSeut8 208 is selected as the "Tree" Edge or transition from S5 155 to S3 153.

Micro-edge TSeut8 208 is followed back to State S5 155, which is entered at time ("T") equal to five (5). The state is set to color "Gray", with an entering time set to five (5). At time. ("T") equal to 6, the incoming edges to state S5 155 are considered. None of the incoming edges is from an unentered state, so state S5 155 is considered complete. Its color ("C") is changed from "Gray" to "Black", and its Exit Time ("ET") is set to six (6).

The "Tree" edge leading from state S5 155 is then traversed, and state S3 153 is entered at time ("T") equal to seven (7). As there are no incoming edges to state S3 153 from untraversed states, the state is considered complete. It is changed from "Gray" to "Black", and its Exit Time ("ET") is set to 7. If instead, there had been an incoming edge from an untraversed state, the color ("C") of state S3 153 would have remained as "Gray", and that untraversed state would have been entered, being itself set to color "Gray" and its entry time set to the current time (7). This backtracking is repeated, returning through states S4 154 at T=8, S2 152 at T=9, and S1 151 at T=10.

If the Test Subsequence Graph 65 has been properly augmented 40, all of the states should now have been toured. However, if the Test Subsequence Graph 65 is still only weakly connected, there could be portions of the graph that have not yet been traversed. In these cases, an untraversed state is selected, and the above tour method is repeated. The results of the above method for times ("T") from one (1) to ten (10) are shown in table T-17. From the result, we know that there is only one strongly connected component in this Augmented Test Subsequence Graph 95.

TABLE T-17

| T | S1 ST | S1 ET | S1 C | S2 ST | S2 ET | S2 C | S3 ST | S3 ET | S3 C | S4 ST | S4 ET | S4 C | S5 ST | S5 ET | S5 C |
|---|---|---|---|---|---|---|---|---|---|---|---|---|---|---|---|
| 0 | | | | | | | | | | | | | | | |
| 1 | 1 | | | | | | | | | | | | | | |
| 2 | 1 | | | 2 | | | | | | | | | | | |
| 3 | 1 | | | 2 | | | 3 | | | | | | | | |
| 4 | 1 | | | 2 | | | 3 | | | | | | | | |
| 5 | 1 | | | 2 | | | 3 | | | 4 | | | | | |
| 6 | 1 | | | 2 | | | 3 | | | 4 | | | 5 | | |
| 7 | 1 | | | 2 | | | 3 | | | 4 | 7 | | 5 | 6 | |
| 8 | 1 | | | 2 | | | 3 | 8 | | 4 | 7 | | 5 | 6 | |
| 9 | 1 | | | 2 | 9 | | 3 | 8 | | 4 | 7 | | 5 | 6 | |
| 10 | 1 | 10 | | 2 | 9 | | 3 | 8 | | 4 | 7 | | 5 | 6 | |

Table T-18 illustrates the next step in an Euler Tour 42. The Exit Times of the source and destination states of each micro-edge in the Augmented Test Subsequence Graph 95 are compared. If the exit time ("ET") for a destination or stopping state is greater than the exit time for the corresponding source or starting state, the edge is considered a "Forward" edge, otherwise a "Backward" edge. Note that "Tree" edges are always "Forward" edges. Self edges have the same starting and stopping state, and are thus both backward and forward edges. There are also potentially "Cross" edges connecting weakly connected subgraphs.

TABLE T-18

| TS Edge | Ref Num | Starting State | Starting T | Stopping State | Stopping T | Edge Type |
|---|---|---|---|---|---|---|
| $TS_{eut1}$ | 201 | S5 | 6 | S1 | 10 | Forward |
| $TS_{eut2}$ | 202 | S1 | 10 | S3 | 7 | Backward |
| $TS_{eut3}$ | 203 | S5 | 6 | S4 | 8 | Forward |
| $TS_{eut4}$ | 204 | S2 | 9 | S4 | 8 | Backward |
| $TS_{eut5}$ | 205 | S2 | 9 | S4 | 8 | Backward |
| $TS_{eut6}$ | 206 | S3 | 7 | S4 | 8 | Forward/Tree |
| $TS_{eut7}$ | 207 | S3 | 7 | S4 | 8 | Forward |
| $TS_{eut8}$ | 208 | S5 | 6 | S3 | 7 | Forward/Tree |
| $TS_{eut9}$ | 209 | S4 | 8 | S4 | 8 | Self |
| $TS_{eut10}$ | 210 | S2 | 9 | S4 | 8 | Backward |
| $TS_{eut11}$ | 211 | S2 | 9 | S1 | 10 | Forward/Tree |
| $TS_{ame1}$ | 221 | S4 | 8 | S2 | 9 | Forward/Tree |
| $TS_{ame2}$ | 222 | S4 | 8 | S2 | 9 | Forward |
| $TS_{ame3}$ | 223 | S4 | 8 | S2 | 9 | Forward |
| $TS_{ame4}$ | 224 | S4 | 8 | S2 | 9 | Forward |
| $TS_{ame5}$ | 225 | S4 | 8 | S5 | 6 | Backward |
| $TS_{ame6}$ | 226 | S4 | 8 | S5 | 6 | Backward |
| $TS_{ame7}$ | 227 | S1 | 10 | S5 | 6 | Backward |

Figure 15B:
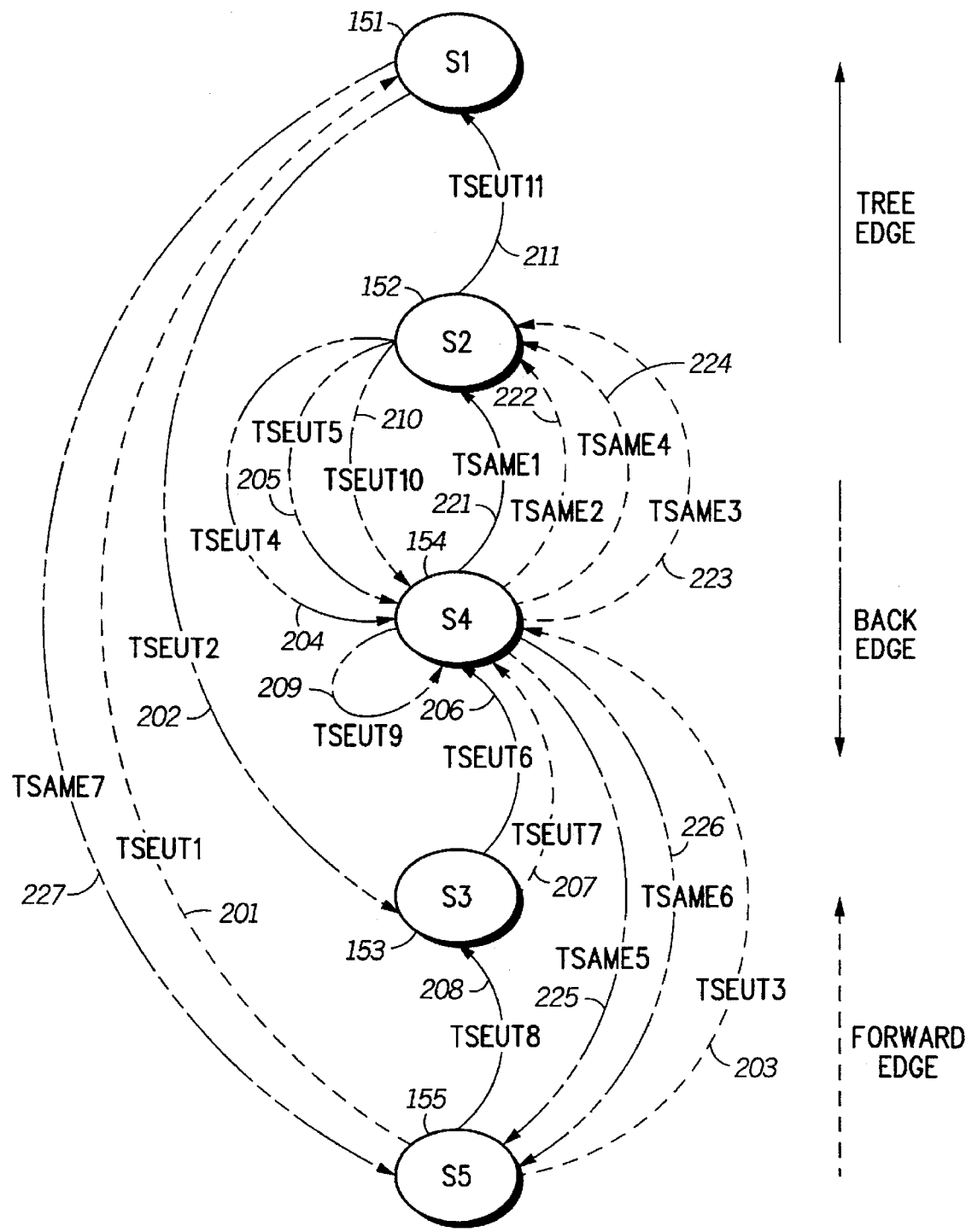
FIG. 15B is constructed from the second DFS. Each Test Subsequence is identified as a Tree, Forward, Backward, and/or Self Edge.

FIG. 15B is a state diagram constructed from the information in Table T-18. It shows the status of all of Test Subsequence (TS) graph edges: whether each edge is a Tree, Forward, Backward, or Self Edge. Note that in this case the single Self Loop, $TS_{eut9}$ 209, is shown as a Back Edge.

The next step in the Euler Tour 42 is to construct closed loops. One way of doing this is to start by realizing that each complete loop requires at least one forward and at least one backward edge. Self edges can be treated as being both a forward and backward edge at the same time. A set of loops can be formed by forming loops with the fewest number of edges first. Thus, all self-loops, such as TSeut9 209, are selected first. Then all two edge loops are selected. In this case, $TSame7@TSeut1$, $TSeut4@TSame3$, $TSeut5@TSame4$, $TSeut10@TSame2$, and $TSame5@TSeut3$ are all two edge loops.

The procedure continues by constructing three, four, etc. edged loops. This can be expedited by capitalizing on the knowledge that each loop requires a backward edge. Thus, a three edge loop can be constructed using TSame6 216 as the backwards edge, and TSeut8 208 and TSeut6 206 as the forward edges. Finally, a four edged loop is constructed from the remaining edges, using TSeut2 202 as the backward edge, and TSeut7 217, TSame1 221, and TSeut11 211 as forward edges. The closed loops constructed are numbered and sorted in reverse order. Thus, the four edged loop constructed last is listed first as loop number one (1). Loops just constructed, along with the starting and ending states for each transition in each of the loops, are listed in Table T-19.

TABLE T-19

| Loop Num | Seq | TS Edge | Ref Num | Start State | Stop State | Edge Type |
|---|---|---|---|---|---|---|
| 1 | 1 | $TS_{eut2}$ | 202 | S1 | S3 | Backward |
| 1 | 2 | $TS_{eut7}$ | 207 | S3 | S4 | Forward |
| 1 | 3 | $TS_{ame1}$ | 221 | S4 | S2 | Forward/Tree |
| 1 | 4 | $TS_{eut11}$ | 211 | S2 | S1 | Forward/Tree |
| 2 | 1 | $TS_{ame6}$ | 226 | S4 | S5 | Backward |
| 2 | 2 | $TS_{eut8}$ | 208 | S5 | S3 | Forward/Tree |
| 2 | 3 | $TS_{eut6}$ | 206 | S3 | S4 | Forward/Tree |
| 3 | 1 | $TS_{ame5}$ | 225 | S4 | S5 | Backward |
| 3 | 2 | $TS_{eut3}$ | 203 | S5 | S4 | Forward |
| 4 | 1 | $TS_{eut10}$ | 210 | S2 | S4 | Backward |
| 4 | 2 | $TS_{ame2}$ | 222 | S4 | S2 | Forward |
| 5 | 1 | $TS_{eut5}$ | 205 | S2 | S4 | Backward |
| 5 | 2 | $TS_{ame4}$ | 224 | S4 | S2 | Forward |
| 6 | 1 | $TS_{eut4}$ | 204 | S2 | S4 | Backward |
| 6 | 2 | $TS_{ame3}$ | 223 | S4 | S2 | Forward |
| 7 | 1 | $TS_{ame7}$ | 227 | S1 | S5 | Backward |
| 7 | 2 | $TS_{eut1}$ | 201 | S5 | S1 | Forward |
| 8 | 1 | $TS_{eut9}$ | 209 | S4 | S4 | Self |

The next step in the Euler Tour 42 is to link or merge loops together. This is done by starting with the first loop as the base state set. The second loop is compared to the base set in the first loop looking for common states or nodes. The first common state discovered is state S4 154. The second loop is opened up at state S4 154 and inserted at that location in the first loop. This can also be done with the third loop. The fourth loop shares both S2 152 and S4 154 with the merged loop under construction. The choice is essentially arbitrary which state to pick. Selecting state S2 152 since it is encountered first in loop 4, the loop is merged in at that point. The same applies to merging loops 5 and 6. Loop 7 can be merged at state S1 151, and the self loop (8) is merged at state S4 154. The resulting merged loop is shown in Table T-20.

In the case of large FSM models, it is possible that multiple merged loops may be created when merging forward through the table of loops. If this happens, the process is repeated until all loops have been merged into one large loop. It can be appreciated now that the reason for sorting loops in order of decreasing size is to expedite the above merge operation.

TABLE T-20

| Loop | | TS | Ref. | | State | TS |
|---|---|---|---|---|---|---|
| Num | Seq | Edge | Num | State | State | Sequence |
| 1 | 1 | $TS_{eut2}$ | 202 | S1 | S3 | $DL_3 @ DL_4$ |
| 1 | 2 | $TS_{eut7}$ | 207 | S3 | S4 | $DL_5 @ DL_2$ |
| 8 | 1 | $TS_{eut9}$ | 209 | S4 | S4 | $DL_1 @ DL_2$ |
| 3 | 1 | $TS_{ame5}$ | 225 | S4 | S5 | $DL_1$ |
| 3 | 2 | $TS_{eut3}$ | 203 | S5 | S4 | $DL_6 @ DL_5$ |
| 2 | 1 | $TS_{ame6}$ | 226 | S4 | S5 | $DL_1$ |
| 2 | 2 | $TS_{eut8}$ | 208 | S5 | S3 | $DL_2 @ DL_3$ |
| 2 | 3 | $TS_{eut6}$ | 206 | S3 | S4 | $DL_3 @ DL_2$ |
| 1 | 3 | $TS_{ame1}$ | 221 | S4 | S2 | $DL_1 @ DL_6 @ DL_3$ |
| 6 | 1 | $TS_{eut4}$ | 204 | S2 | S4 | $DL_1 @ DL_2$ |
| 6 | 2 | $TS_{ame3}$ | 223 | S4 | S2 | $DL_1 @ DL_6 @ DL_3$ |
| 5 | 1 | $TS_{eut5}$ | 205 | S2 | S4 | $DL_4 @ DL_5 @ DL_2$ |
| 5 | 2 | $TS_{ame4}$ | 224 | S4 | S2 | $DL_1 @ DL_6 @ DL_3$ |
| 4 | 1 | $TS_{eut10}$ | 210 | S2 | S4 | $DL_4 @ DL_5 @ DL_2$ |
| 4 | 2 | $TS_{ame2}$ | 222 | S4 | S2 | $DL_1 @ DL_6 @ DL_3$ |
| 1 | 4 | $TS_{eut11}$ | 211 | S2 | S1 | $DL_4 @ DL_5 @ DL_6$ |
| 7 | 1 | $TS_{ame7}$ | 227 | S1 | S5 | $DL_5 @ DL_1$ |
| 7 | 2 | $TS_{eut1}$ | 201 | S5 | S1 | $DL_6 @ DL_1$ |

Table T-21 is constructed from Table T-20 by expanding the TS Subsequences and by replacing the I/O labels with the actual I/O sequences (from Table T-2). The forty-one (41) I/O sequences are concatenated together in table order to form a Verification Test Sequence 43. Note that the tour starts and ends at state S1 151. As the Augmented Test Subsequence Graph 95 is symmetric and well connected, the decision from which of the five states to start the tour is arbitrary.

TABLE T-21

| Seq. Num | Micro Edge | Start State | TR Edge | I/O Label | I/O Seg. | Stop State |
|---|---|---|---|---|---|---|
| 1 | $TS_{eut2}$ | S1 | E2 | $DL_3$ | b/x | S2 |
| 2 | $TS_{eut2}$ | S2 | E5 | $DL_4$ | b/y | S3 |
| 3 | $TS_{eut7}$ | S3 | E7 | $DL_5$ | c/y | S5 |
| 4 | $TS_{eut7}$ | S5 | E10 | $DL_2$ | a/z | S4 |
| 5 | $TS_{eut9}$ | S4 | E9 | $DL_1$ | a/x | S5 |
| 6 | $TS_{eut9}$ | S5 | E10 | $DL_2$ | a/z | S4 |
| 7 | $TS_{ame5}$ | S4 | E9 | $DL_1$ | a/x | S5 |
| 8 | $TS_{eut3}$ | S5 | E11 | $DL_6$ | c/z | S1 |
| 9 | $TS_{eut3}$ | S1 | E3 | $DL_5$ | c/y | S4 |
| 10 | $TS_{ame6}$ | S4 | E9 | $DL_1$ | a/x | S5 |
| 11 | $TS_{eut8}$ | S5 | E10 | $DL_2$ | a/z | S4 |
| 12 | $TS_{eut8}$ | S4 | E8 | $DL_3$ | b/x | S3 |
| 13 | $TS_{eut6}$ | S3 | E6 | $DL_3$ | b/x | S5 |
| 14 | $TS_{eut6}$ | S5 | E10 | $DL_2$ | a/z | S4 |
| 15 | $TS_{ame1}$ | S4 | E9 | $DL_1$ | a/x | S5 |
| 16 | $TS_{ame1}$ | S5 | E11 | $DL_6$ | c/z | S1 |
| 17 | $TS_{ame1}$ | S1 | E2 | $DL_3$ | b/x | S2 |
| 18 | $TS_{eut4}$ | S2 | E4 | $DL_1$ | a/x | S5 |
| 19 | $TS_{eut4}$ | S5 | E10 | $DL_2$ | a/z | S4 |
| 20 | $TS_{ame3}$ | S4 | E9 | $DL_1$ | a/x | S5 |
| 21 | $TS_{ame3}$ | S5 | E11 | $DL_6$ | c/z | S1 |
| 22 | $TS_{ame3}$ | S1 | E2 | $DL_3$ | b/x | S2 |
| 23 | $TS_{eut5}$ | S2 | E5 | $DL_4$ | b/y | S3 |
| 24 | $TS_{eut5}$ | S3 | E7 | $DL_5$ | c/y | S5 |
| 25 | $TS_{eut5}$ | S5 | E10 | $DL_2$ | a/z | S4 |
| 26 | $TS_{ame4}$ | S4 | E9 | $DL_1$ | a/x | S5 |
| 27 | $TS_{ame4}$ | S5 | E11 | $DL_6$ | c/z | S1 |
| 28 | $TS_{ame4}$ | S1 | E2 | $DL_3$ | b/x | S2 |
| 29 | $TS_{eut10}$ | S2 | E5 | $Dl_4$ | b/y | S3 |
| 30 | $TS_{eut10}$ | S3 | E7 | $DL_5$ | c/y | S5 |
| 31 | $TS_{eut10}$ | S5 | E10 | $DL_2$ | a/z | S4 |
| 32 | $TS_{ame2}$ | S4 | E9 | $DL_1$ | a/x | S5 |
| 33 | $TS_{ame2}$ | S5 | E11 | $DL_6$ | c/z | S1 |

TABLE T-21-continued

| Seq. Num | Micro Edge | Start State | TR Edge | I/O Label | I/O Seg. | Stop State |
|---|---|---|---|---|---|---|
| 34 | $TS_{ame2}$ | S1 | E2 | $DL_3$ | b/x | S2 |
| 35 | $TS_{eut11}$ | S2 | E5 | $DL_4$ | b/y | S3 |
| 36 | $TS_{eut11}$ | S3 | E7 | $DL_5$ | c/y | S5 |
| 37 | $TS_{eut11}$ | S5 | E11 | $DL_6$ | c/z | S1 |
| 38 | $TS_{ame7}$ | S1 | E3 | $DL_5$ | c/y | S4 |
| 39 | $TS_{ame7}$ | S4 | E9 | $DL_1$ | a/x | S5 |
| 40 | $TS_{eut1}$ | S5 | E11 | $DL_6$ | c/z | S1 |
| 41 | $TS_{eut1}$ | S1 | E1 | $DL_1$ | a/x | S1 |

A Verification Test Sequence (VTS) 43 thus can be constructed by concatenating the Test Subsequences (TS) from Table T-20 as shown in Table T-21 in the order shown. Thus, one Verification Test Sequence (VTS) 43 for the FSM graph shown in FIG. 8 starts with the sequence $DL_3@DL_4@DL_5@DL_2@DL_1@DL_2@$ .... Substituting I/O sequences for the equivalent labels (see Table T-2) results in an Verification I/O Test Sequence that starts with (b/x)@(b/y)@(c/y)@(a/z)@(a/x)@(a/z)@ .... The Verification Test Sequence 43 generated starts in state S1 151 and transits states S2, S3, S5, S4, S5, S4, S5, S1, S4, S5, S4, S3, S5, ....

The Dahbura method applied to the same FSM results in a verification test sequence with 55 Input/Output pairs (see the test sequence shown on page 84 of the A.V. Aho article). The reduction in the length of the generated verification test sequence from 55 I/O pairs to 41 I/O pairs for the same FSM model results in a large part from several features of the current invention. First, the Dahbura method requires the use of a reset sequence for each edge tested. Secondly, the BUIO for a given EUT can be shorter than the corresponding FUIO. Also note that the Dahbura method cannot handle hierarchical FSM models.

The remainder of this detailed description will demonstrate the construction of test subsequences, and ultimately verification test sequences, from hierarchical FSM models and corresponding graphs. Hierarchical FSM models often offer significant advantages over fiat FSM models. They also more closely reflect the way that circuits, software, and communications protocols are designed and implemented.

The hierarchical model shown herein is constructed of subgraphs. There is usually a single high level subgraph, and a number of lower level subgraphs. Each lower level subgraph consists of one or more "Start" states, one or more intermediate states, and one or more "Exit" states, as well as the TRansitions between these states. The "Start" and "Exit" states operate very similarly to subroutine entry and return statements. Each subgraph has a parent subgraph. Level two subgraphs have the top level subgraph as their parent, while level three subgraphs have a level two subgraph as their parent. In this implementation, the Input/Output sequences for TRansitions leaving "Start" states, and for those entering "Exit" states are also found associated with TRansitions in the parent subgraph.

Finally, it must be realized that the hierarchical technique disclosed herein is for illustrative purposes only, and other techniques of hierarchical FSM representation may be handled with minor modifications by the disclosed procedures.

A new Finite State Machine is introduced in FIG. 16 (A–D). FIG. 16A shows the module level of the new FSM. The FSM shown is hierarchical, with a high level BC 240, and two lower levels, S0 241 and S1 242. It depicts a well known model of a single bit counter. The first bit in the Input/Output sequences for the state TRansitions in the model is the bit to count, the second bit is a reset signal, and the output is the current state of the counter.

Figure 16A:
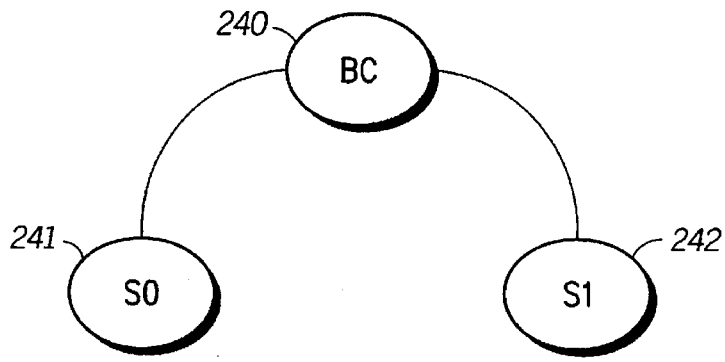
FIG. 16A shows the module level hierarchy.
Figure 16B:
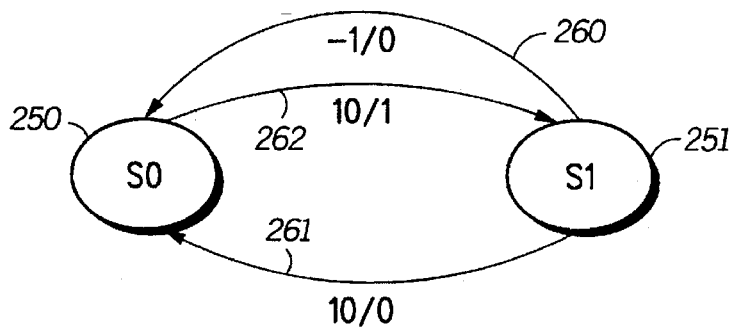
FIG. 16B shows the two high level states.

FIG. 16B is a FSM state diagram for high level BC 240. It has two states, S0 250, and S1 251, with three state TRansitions between the two states. There are two TRansitions from S1 251 to S0 250, one with an Input/Output sequence of "−1/0" 260 and the other with an I/O sequence of "10/0" 261. The single transition 262 from S0 250 to S1 251 has an I/O sequence equal to "10/1". Note that the "−" in the first state transition 260 means that the corresponding position is a "don't care", matching either a "0" or a "1" (in the Boolean realm). In this case, the "don't care" is because the other bit corresponds to a "reset" signal.

Figure 16C:
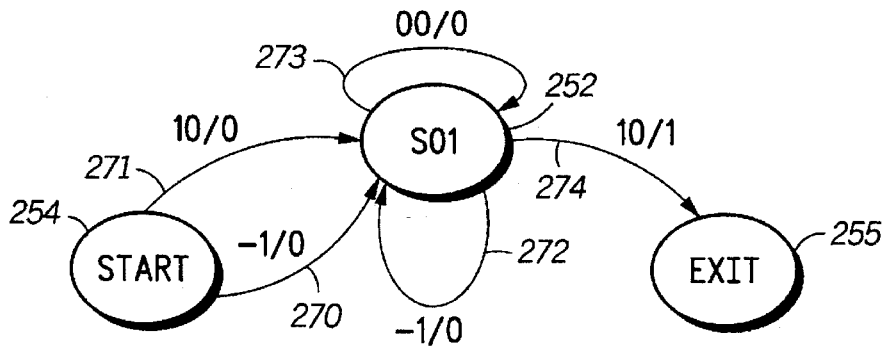
FIG. 16C and FIG. 16D show the two lower level model states.
Figure 16D:
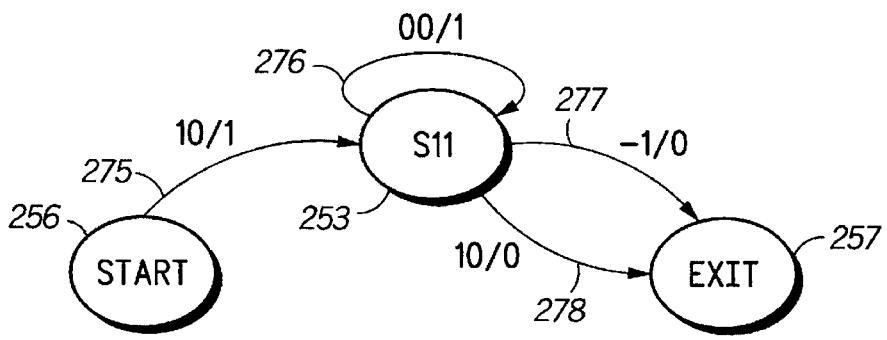

FIG. 16C is a FSM state diagram for lower level S0 241. It consists of three states, Start 256, S01 252, and Exit 257. There are five state TRansitions in the FIG. 16C FSM state diagram 270, 271, 272, 273, 274. FIG. 16D is a FSM state diagram for lower level S1 242. It shows three states, Start 254, S11 253, and Exit 257. It has four state TRansitions 275, 276, 277, 278. Table T-22 includes the states and TRansitions shown in FIG. 16B, 16C, and 16D.

TABLE T-22

| FIG. | Transition | | | Start State | | | End State | | | I/O Seq. | |
|---|---|---|---|---|---|---|---|---|---|---|---|
| | Asg | Ref | Orig | Asg | Ref | Orig | Asg | Ref | | In | Out |
| 16B | $TR_1$ | 262 | S0 | $ST_1$ | 250 | S1 | $ST_2$ | 251 | | 10 | 1 |
| 16B | $TR_2$ | 261 | S1 | $ST_2$ | 251 | S0 | $ST_1$ | 251 | | 10 | 0 |
| 16B | $TR_3$ | 260 | S1 | $ST_2$ | 251 | S0 | $ST_1$ | 250 | | −1 | 0 |
| 16C | $TR_1$ | 273 | S01 | $ST_1$ | 252 | S01 | $ST_1$ | 252 | | 00 | 0 |
| 16C | $TR_2$ | 271 | Start | $ST_2$ | 254 | S01 | $ST_1$ | 252 | | 10 | 0 |
| 16C | $TR_3$ | 274 | S01 | $ST_1$ | 252 | Exit | $ST_3$ | 255 | | 10 | 1 |
| 16C | $TR_4$ | 270 | Start | $ST_2$ | 254 | S01 | $ST_1$ | 252 | | −1 | 0 |
| 16C | $TR_5$ | 272 | S01 | $ST_1$ | 252 | S01 | $ST_1$ | 252 | | −1 | 0 |
| 16D | $TR_1$ | 276 | S11 | $ST_1$ | 253 | S11 | $ST_1$ | 253 | | 00 | 1 |
| 16D | $TR_2$ | 275 | Start | $ST_2$ | 256 | S11 | $ST_1$ | 253 | | 10 | 1 |
| 16D | $TR_3$ | 278 | S11 | $ST_1$ | 253 | Exit | $ST_3$ | 257 | | 10 | 0 |
| 16D | $TR_4$ | 277 | S11 | $ST_1$ | 253 | Exit | $ST_3$ | 257 | | −1 | 0 |

Table T-22 also contains labels assigned ("Asg") to each of the states and transitions in FIG. 16 (B–D).

Table T-23 is constructed from Table T-21 by assigning labels to the Input/Output sequences for the transitions in FIG. 16 (B–D).

TABLE T-23

| FIG. | Label | I/O |
|---|---|---|
| 16B | $DL_1$ | 10/1 |
| 16B | $DL_2$ | 10/0 |
| 16B | $DL_3$ | −1/0 |
| 16C | $DL_1$ | 00/0 |
| 16C | $DL_2$ | 10/0 |
| 16C | $DL_3$ | 10/1 |
| 16C | $DL_4$ | −1/0 |
| 16D | $DL_1$ | 00/1 |
| 16D | $DL_2$ | 10/1 |
| 16D | $DL_3$ | 10/0 |
| 16D | $DL_4$ | −1/0 |

Table T-24 is constructed from Table T-22 by replacing I/O sequences with their appropriate labels, and tallying the number of occurrence of each label in the appropriate FSM subgraph. Three different distinctness measurements are computed: DM which is the global distinctness over the entire FSM subgraph; DM_from, which is the distinctness of I/O labels ($D1_i$) for all of the labels leaving a specified state; and DM_to, which is the distinctness of the of I/O labels ($D1_i$) for all of the labels entering a specified state.

TABLE T-24

| FIG. | Transition | | Start State | | End State | | | Distinctness | | |
|---|---|---|---|---|---|---|---|---|---|---|
| | $TR_i$ | Ref | State | Ref | State | Ref | LBL | DM | Frm | To |
| 16B | $TR_1$ | 262 | S0 | 250 | S1 | 251 | $DL_1$ | 1 | 1 | 1 |
| 16B | $TR_2$ | 261 | S1 | 251 | S0 | 250 | $DL_2$ | 1 | 1 | 1 |
| 16B | $TR_3$ | 260 | S1 | 251 | S0 | 250 | $DL_3$ | 1 | 1 | 1 |
| 16C | $TR_1$ | 273 | S01 | 252 | S01 | 252 | $DL_1$ | 1 | 1 | 1 |
| 16C | $TR_2$ | 271 | Start | 254 | S01 | 252 | $DL_2$ | 1 | 1 | 1 |
| 16C | $TR_3$ | 274 | S01 | 252 | Exit | 255 | $DL_3$ | 1 | 1 | 1 |
| 16C | $TR_4$ | 270 | Start | 254 | S01 | 252 | $DL_4$ | 2 | 1 | 2 |
| 16C | $TR_5$ | 272 | S01 | 252 | S01 | 252 | $DL_4$ | 2 | 1 | 2 |
| 16D | $TR_1$ | 276 | S11 | 253 | S11 | 253 | $DL_1$ | 1 | 1 | 1 |
| 16D | $TR_2$ | 275 | Start | 256 | S11 | 253 | $DL_2$ | 1 | 1 | 1 |
| 16D | $TR_3$ | 278 | S11 | 253 | Exit | 257 | $DL_3$ | 1 | 1 | 1 |
| 16D | $TR_4$ | 277 | S11 | 253 | Exit | 257 | $DL_4$ | 1 | 1 | 1 |

Table T-25 shows Test Subsequences ($TS_j$) constructed for each of the Transitions ($TR_j$) shown in FIG. 16 (B–D). The Test Subsequences are constructed by taking the Transitions shown in Table T-23 as Edges-Under-Test (EUT) and concatenating these with Unique Input/Output Sequence Sets.

TABLE T-25

| | EUT | | Test Subsequences | | States | |
|---|---|---|---|---|---|---|
| FIG. | $TR_i$ | Ref | $TS_i$ | Ref | Subseq. | From | To |
| 16B | $TR_1$ | 262 | $TS_1$ | 280 | $TR_1$ @ $TR_2$ | S0 | S0 |
| 16B | $TR_2$ | 261 | $TS_2$ | 281 | $TR_2$ @ $TR_1$ | S1 | S1 |
| 16B | $TR_3$ | 260 | $TS_3$ | 282 | $TR_3$ @ $TR_1$ | S1 | S1 |
| 16C | $TR_1$ | 273 | $TS_{10}$ | 293 | $TR_1$ @ $TR_2$ | S01 | S01 |
| 16C | $TR_2$ | 271 | $TS_{20}$ | 291 | $TR_2$ @ $TR_1$ | Start | S01 |
| 16C | $TR_3$ | 274 | $TS_{50}$ | 292 | $TR_1$ @ $TR_3$ | S01 | Exit |
| 16C | $TR_4$ | 270 | $TS_{30}$ | 294 | $TR_4$ @ $TR_1$ | Start | S01 |
| 16C | $TR_5$ | 272 | $TS_{40}$ | 290 | $TR_5$ @ $TR_1$ | S01 | S01 |
| 16D | $TR_1$ | 276 | $TS_{11}$ | 296 | $TR_1$ @ $TR_1$ | S11 | S11 |
| 16D | $TR_2$ | 275 | $TS_{21}$ | 295 | $TR_2$ @ $TR_1$ | Start | S11 |
| 16D | $TR_3$ | 278 | $TS_{31}$ | 297 | $TR_1$ @ $TR_3$ | S11 | Exit |
| 16D | $TR_4$ | 277 | $TS_{41}$ | 298 | $TR_1$ @ $TR_4$ | S11 | Exit |

Table T-26 is built from Table T-25 by substituting the Distinctness Labels ($DL_i$) and I/O sequences for the corresponding TRansitions ($TR_j$).

TABLE T-26

| | Test Subsequence | | | States | | Test Subsequence | |
|---|---|---|---|---|---|---|---|
| FIG. | $TS_i$ | Ref | Subseq. | From | To | Labels | I/O |
| 16B | $TS_1$ | 280 | $TR_1$ @ $TR_2$ | S0 | S0 | $DL_1$ @ $DL_2$ | 10/1 @ 10/0 |
| 16B | $TS_2$ | 281 | $TR_2$ @ $TR_1$ | S1 | S1 | $DL_2$ @ $DL_1$ | 10/0 @ 10/1 |
| 16B | $TS_3$ | 282 | $TR_3$ @ $TR_1$ | S1 | S1 | $DL_3$ @ $DL_1$ | –1/0 @ 10/1 |
| 16C | $TS_{1\_0}$ | 293 | $TR_1$ @ $TR_1$ | S01 | S01 | $DL_1$ @ $DL_1$ | 00/0 @ 00/0 |
| 16C | $TS_{2\_0}$ | 291 | $TR_2$ @ $TR_1$ | Start | S01 | $DL_2$ @ $DL1_1$ | 10/0 @ 00/0 |
| 16C | $TS_{3\_0}$ | 294 | $TR_1$ @ $TR_1$ | S01 | Exit | $DL_1$ @ $DL_3$ | 00/0 @ 10/1 |
| 16C | $TS_{4\_0}$ | 290 | $TR_4$ @ $TR_1$ | Start | S01 | $DL_4$ @ $DL_1$ | –1/0 @ 00/0 |
| 16C | $TS_{5\_0}$ | 292 | $TR_5$ @ $TR_1$ | S01 | S01 | $DL_4$ @ $DL_1$ | –1/0 @ 00/0 |
| 16D | $TS_{1\_1}$ | 296 | $TR_1$ @ $TR_1$ | S11 | S11 | $DL_1$ @ $DL_1$ | 00/1 @ 00/1 |
| 16D | $TS_{2\_1}$ | 296 | $TR_2$ @ $TR_1$ | Start | S11 | $DL_2$ @ $DL_1$ | 10/1 @ 00/1 |
| 16D | $TS_{3\_1}$ | 297 | $TR_1$ @ $TR_3$ | S11 | Exit | $DL_1$ @ $DL_3$ | 00/1 @ 10/0 |
| 16D | $TS_{4\_1}$ | 298 | $TR_1$ @ $TR_4$ | S11 | Exit | $DL_1$ @ $DL_4$ | 00/1 @ –1/0 |

FIG. 17 (A–D) is a FSM diagram showing Test Subsequence (TS) subgraphs constructed from the information in Table T-26. The high level FSM subgraph shown in FIG. 16B has two resulting disjoint Test Subsequence subgraphs: FIG. 17A for state S0 250; and FIG. 17B for state S1 251. FIG. 17C shows the Test Subsequence Subgraph resulting from the FSM subgraph shown in FIG. 16C, and FIG. 17D shows the Test Subsequence Subgraph resulting from the FSM subgraph shown in FIG. 16D.

Figure 17A:
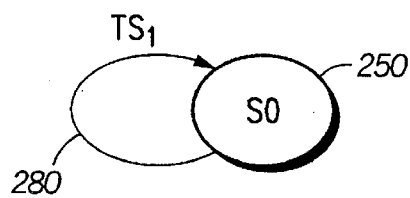
FIG. 17 is a FSM model state transition diagram showing the four Test Subsequence Subgraphs (FIG. 17 (A–D)) constructed from the information in Table T-26 and corresponding to the four FSM model states shown in FIG. 16. The higher level FSM Subgraph shown in FIG. 16B has two resulting disjoint Test Subsequence Subgraphs FIG. 17(A–B), while the two lower level FSM Subgraphs FIG. 16(C–D) correspond to the two resulting lower level Test Subsequence Subgraphs FIG. 17(C–D)
Figure 17B:
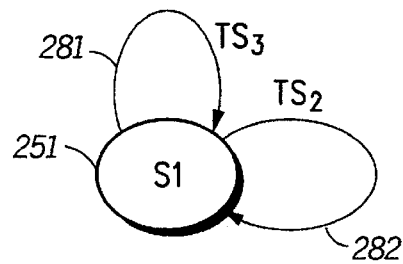
Figure 17C:
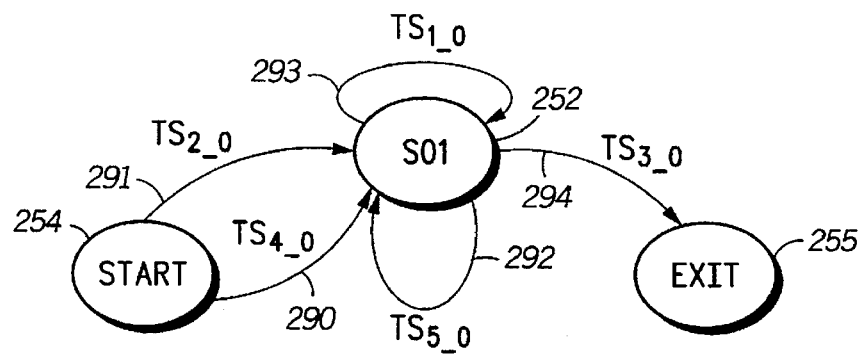
Figure 17D:
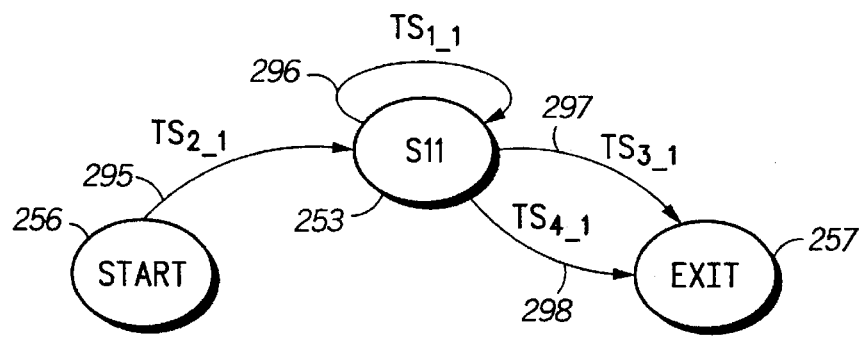
Figure 19:
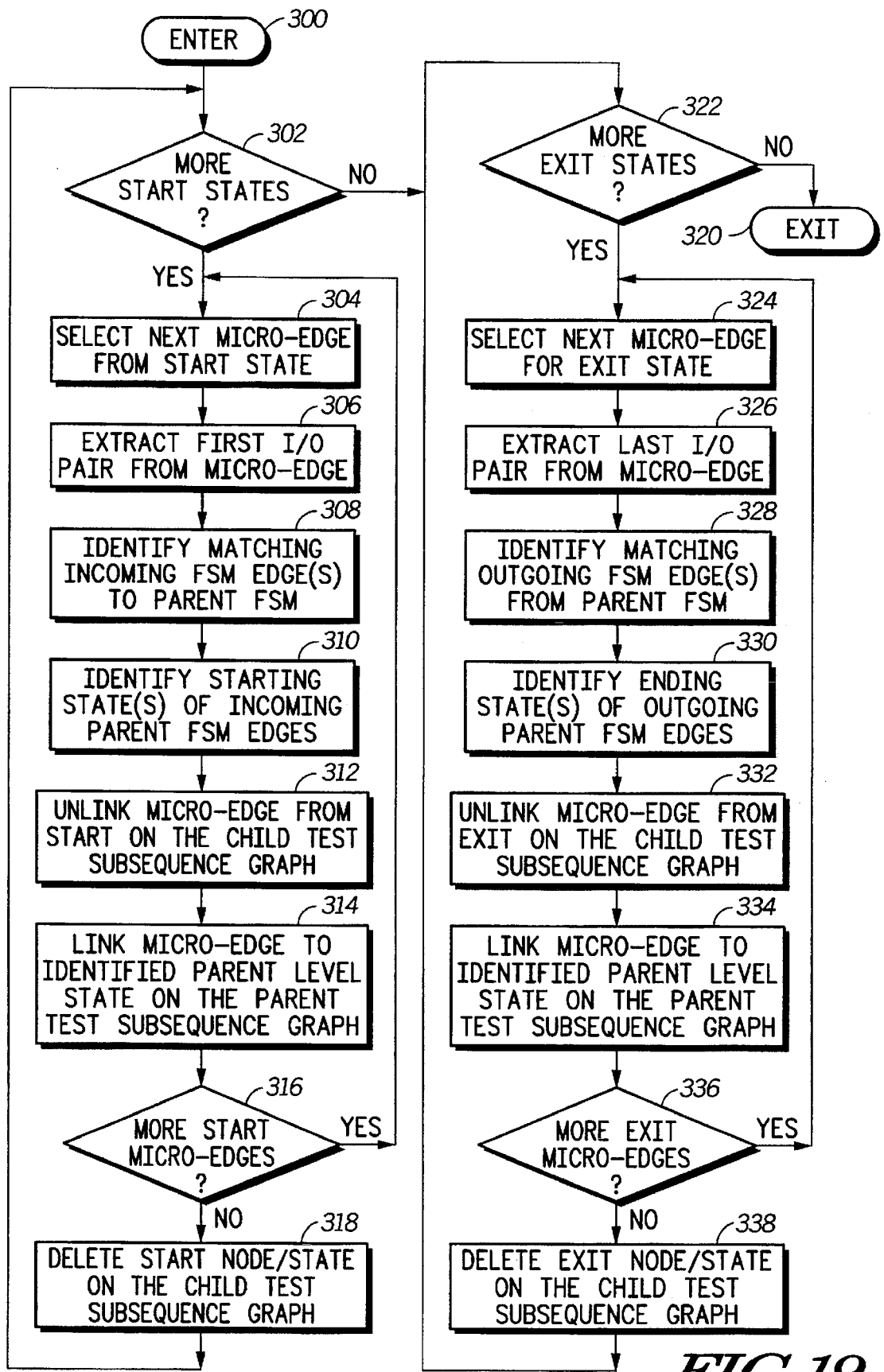
FIG. 19 is a flow chart showing in accordance with the present invention one method for merging Hierarchical Test Subsequence Subgraphs into a single Test Subsequence Graph.

FIG. 19 is a flow chart showing a method for merging Hierarchical Test Subsequence Subgraphs into a single flattened Test Subsequence (TS) Graph (see FIG. 3). The procedure shown in FIG. 19 is executed for each lower level Test Subsequence Subgraph by the Merge Test Subsequence Graph 38 routine. The procedure is recursive. Starting at the lowest level Subgraphs, the child TS Subgraphs are merged successively into their higher level parent TS Subgraphs, until at the highest level, a single flat Merged Test Subsequence Graph 83 is generated from the parentless TS Subgraphs. The merge routine is entered 300 for each lower level TS Subgraph to merge. All of the Subgraph "Start" states are looped through. A test is made for more "Start" states to process, step 302. As long as there are more "Start" states to process, a new "Start" state is selected for processing. An inner loop processes all of the outgoing Test Subsequence Micro-Edges for that selected "Start" state. The next Micro-Edge Test Subsequence for that "Start" state is selected, step 304. The first I/O pair for that Micro-Edge is extracted, step 306. For example, Test Subsequence $TS_{2\_0}$ 291 shown in FIG. 17C, is comprised of the I/O sequence "10/0@00/0". The first I/O pair for Test Subsequence $TS_{2\_0}$ 291 is thus "10/0".

Next, the FSM Subgraph corresponding to the parent's Test Subsequence Subgraph is utilized to identify an adoptive starting state for the Test Subsequence Micro-Edge, $TS_{2\_0}$ 291. State S0 250 shown in FIG. 16B and FIG. 17A is the parent of the FSM Subgraph shown in FIG. 16C. The FSM Subgraph shown in FIG. 16C corresponds to the Test Subsequence Subgraph shown in FIG. 17C containing Test Subsequence $TS_{2\_0}$ 291. The incoming edges to the parent state, S0 250, are checked in order to identify which incoming Transition, $TR_2$ 261, corresponds to the I/O Sequence, step 308. The starting state, S1 251, of the Transition, $TR_2$ 261, having the I/O Sequence is identified, step 310 as the adoptive starting state. The lower level Micro-Edge, $TS_{2\_0}$ 291, is unlinked, step 312, from the lower level child "Start" state 254 and linked, step 314, to the adoptive starting state, S1 251, in the parent Test Subsequence Subgraph.

A check is then made for more Micro-Edges outgoing from the selected "Start" state, step 316. If there are more Micro-Edges, the inner loop is repeated. Otherwise, the "Start" state Test Subsequence Subgraph vertex is deleted, step 318. In the case of the Subgraph shown in FIG. 17C, there are two Test Subsequence Micro-Edges, $TS_{2\_0}$ 291 and $TS_{4\_0}$ 290, attached to the Subgraph's single "Start" state 254. The inner loop would thus be executed one time for each of the two subsequences, then the "Start" state 254 would be deleted from the FIG. 17C Test Subsequence Subgraph.

Note here that should multiple incoming TRansitions be found with the same I/O Sequence into the parent state, the Test Subsequence Micro-Edge being processed would be duplicated for each Transition with the matching I/O sequence, and one such Test Subsequence Micro-Edge is connected to the starting state of each of these parent Test Subsequence Graph TRansitions.

When all of the lower level "Start" states have been processed and deleted, the second section of the routine is entered to process the "Exit" states. The "Exit" state processing is the exact opposite of the "Start" state processing just discussed.

A check is made for more "Exit" states to process, step 322. When no more "Exit" states are available in a given Test Subsequence Subgraph, the routine exits, step 320. The routine will be subsequently reentered, step 300, to merge the next Test Subsequence Subgraph.

Otherwise, the next "Exit" state vertex is selected in the child TS Subgraph being processed. An inner loop is entered for processing all of the Test Subsequences ending at that "Exit" state. The next Micro-Edge incoming to that "Exit" state is selected, step 324. The last I/O pair in the Test Subsequence Micro-Edge is extracted, step 326. The transition edge starting from the parent state of its FSM Subgraph is then identified that corresponds to the extracted I/O Sequence, step 328. The ending state for that identified parent FSM Subgraph transition is then identified, step 330, and will become the adoptive ending state for the Test Subsequence Micro-Edge being processed.

The Micro-Edge being processed is then unlinked from the "Exit" state, step 332, and linked to the identified adoptive transition ending state in the parent test Subsequence Subgraph, step 334. A check is made for more "Exit" Micro-Edges, step 336, and if none are found, the "Exit" state vertex is deleted from the Test Subsequence Subgraph, step 338, and the next "Exit" state vertex in that Subgraph is then processed.

Table T-27 is constructed from Table T-26 by executing the procedure in the FIG. 19 flow charts for the test Subsequence. This results in the merging of the lower level test Subsequence subgraphs in FIG. 17C and FIG. 17D into the higher level test Subsequence subgraphs in FIG. 17A and FIG. 17B.

shown in FIG. 16C is considered a peer or sibling of the FSM Subgraph shown in FIG. 16D.

The Subgraph Merge routine operates by merging equivalent Input/Output Sequences between peers or siblings. TRansitions outgoing from a "Start" state in one Subgraph are merged with equivalent TRansitions incoming into an "Exit" state in another Subgraph. In this case, three I/O sequences are shared between peer states S01 152 and S11 153. For example, transition $TR_3$ 274 in FIG. 16C has the same I/O Sequence as Transition $TR_2$ 275 in FIG. 16D. Both of these TRansitions have I/O Sequences matching that of Transition $TR_1$ 262 in the FIG. 16B FSM subgraph. The result is the replacement of the lower level TRansitions from a "Start" state to a peer state, $TR_2$ 275 in FIG. 16D, and from a peer state to an "Exit" state, $TR_3$ 274 in FIG. 16C, by the parent transition with the same I/O Sequence extending from one peer state, S01 252 to the other peer state, S11 253.

This is repeated with all TRansitions outgoing from a "Start" state, or incoming into an "Exit" state in the children FSM Subgraphs. The procedure is then applied to the next higher level of parents, recursively iterating until the entire FSM Graph is flattened into a Merged FSM Graph 83.

One reason for flattening the Hierarchical FSM Subgraphs into a Merged FSM Graph 83 is that the Merged FSM Graph 83 is useful in building Bridging Sequences between states originally in different FSM Subgraphs in the construction of an Augmented Test Subsequence Graph 95.

Figure 21:
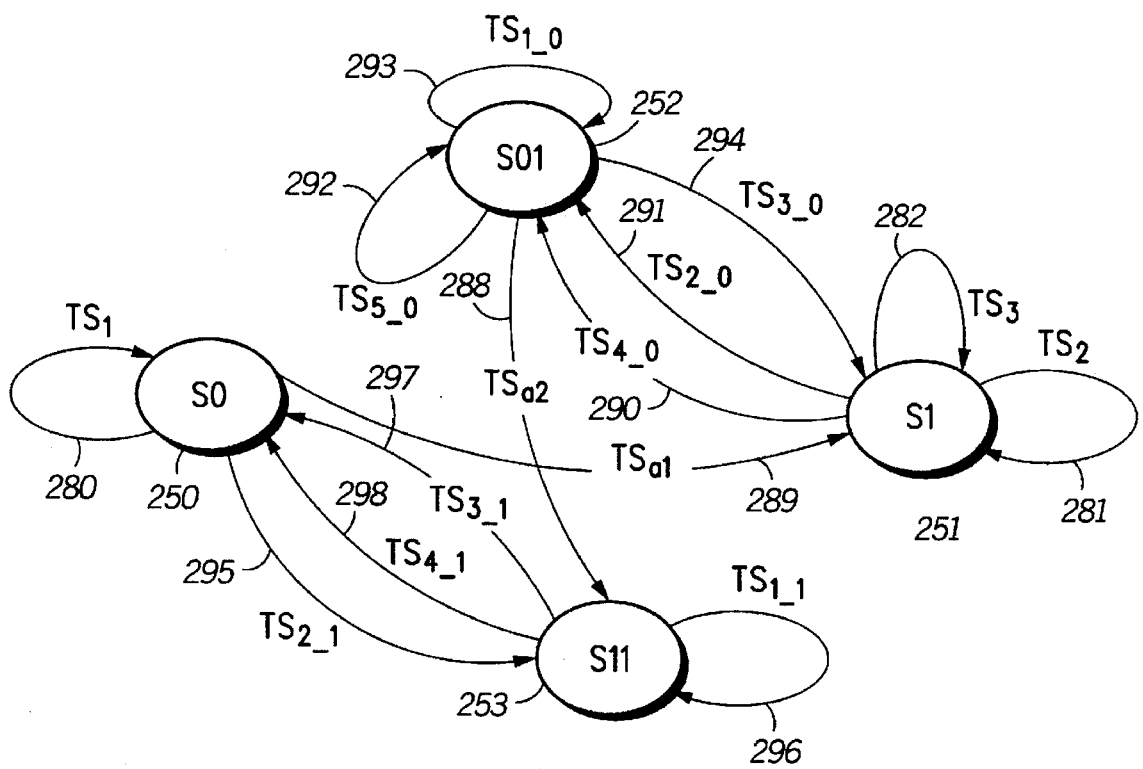
FIG. 21 is a FSM model state transition diagram of an Augmented Test Subsequence Graph constructed from the Merged Test Subsequence Graph shown in FIG. 20.

FIG. 21 is a FSM Graph of an Augmented Test Subsequence Graph 95 constructed from the Merged Test Subse-

TABLE T-27

| FIG. | Test Subsequence $TS_i$ | Ref | From State State | Ref. | To State State | Ref. | Test Subsequence Labels | I/O |
|---|---|---|---|---|---|---|---|---|
| 18 | $TS_1$ | 280 | S0 | 250 | S0 | 250 | $DL_1$ @ $DL_2$ | 10/1 @ 10/0 |
| 18 | $TS_2$ | 281 | S1 | 251 | S1 | 251 | $DL_2$ @ $DL_1$ | 10/0 @ 10/1 |
| 18 | $TS_3$ | 282 | S1 | 251 | S1 | 251 | $DL_3$ @ $DL_1$ | –1/0 @ 10/1 |
| 18 | $TS_{1\_0}$ | 293 | S01 | 252 | S01 | 252 | $DL_1$ @ $DL_1$ | 00/0 @ 00/0 |
| 18 | $TS_{2\_0}$ | 291 | S1 | 251 | S01 | 252 | $DL_2$ @ $DL1_1$ | 10/0 @ 00/0 |
| 18 | $TS_{3\_0}$ | 294 | S01 | 252 | S1 | 251 | $DL_1$ @ $DL_3$ | 00/0 @ 10/1 |
| 18 | $TS_{4\_0}$ | 290 | S1 | 251 | S01 | 252 | $DL_4$ @ $DL_1$ | –1/0 @ 00/0 |
| 18 | $TS_{5\_0}$ | 292 | S01 | 252 | S01 | 252 | $DL_4$ @ $DL_1$ | –1/0 @ 00/0 |
| 18 | $TS_{1\_1}$ | 296 | S11 | 253 | S11 | 253 | $DL_1$ @ $DL_1$ | 00/1 @ 00/1 |
| 18 | $TS_{2\_1}$ | 295 | S0 | 250 | S11 | 253 | $DL_2$ @ $DL_1$ | 10/1 @ 00/1 |
| 18 | $TS_{3\_1}$ | 297 | S11 | 253 | S0 | 250 | $DL_1$ @ $DL_3$ | 00/1 @ 10/0 |
| 18 | $TS_{4\_1}$ | 298 | S11 | 253 | S0 | 250 | $DL_1$ @ $DL_4$ | 00/1 @ –1/0 |

Figure 20:
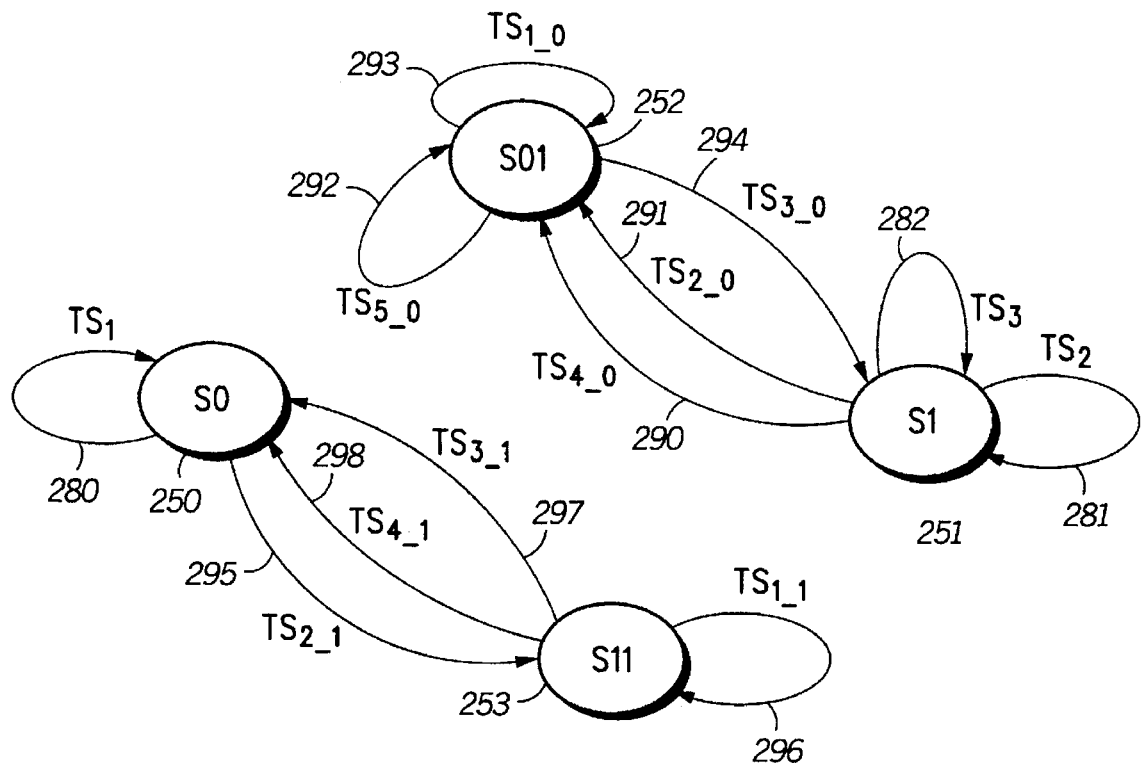
FIG. 20 is a FSM model state transition diagram showing the Merged Test Subsequence Graph built from the information in Table T-27.

FIG. 20 is a FSM diagram showing the Merged Test Subsequence Graph 39 built from the information in Table T-26.

Figure 18:
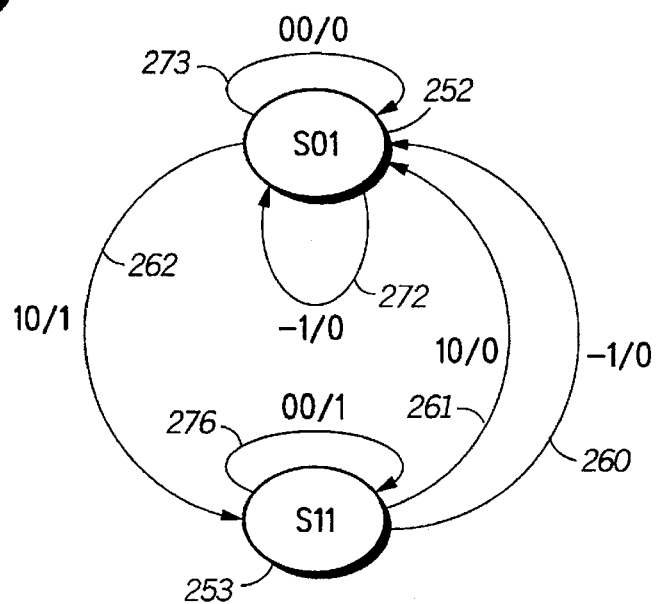
FIG. 18 is a FSM model state transition diagram showing the Merged FSM Graph constructed from the Hierarchical FSM Subgraphs shown in FIG. 16(A–D)

FIG. 18 is a FSM diagram showing the Merged FSM Graph 83 constructed from the HIERARCHICAL FSM SUBGRAPHS 53 shown in FIG. 16 (A–D). The Merge FSM Graph routine, step 82 (see FIG. 6) is similar to the Merge Test Subsequence Graph routine, step 38 (see FIG. 6, FIG. 19).

However, there are distinct differences between the two Merge routines. The Merge FSM Graph routine, step 82, works on hierarchical FSMs only, while the Merge Test Subsequence (TS) Graph routine, step 38, works on Hierarchical Test Subsequence subgraphs and Hierarchical FSM subgraphs. The Merge FSM Graph routine, step 82, contains concepts of peer merging and roll-up merging while the Merge Test Subsequence Graph routine, step 38, does not contain these concepts.

Starting at the top of the FSM hierarchy tree, children of each level of parent are identified. The FSM Subgraph quence Graph 39 shown in FIG. 20. Two bridging sequences are constructed, $TS_{a1}$ 289 and $TS_{a2}$ 288. Note that two states in the Merged Test Subsequence Graph 39 have (indegree-outdegree) of one, and two have an (outdegree-indegree) of one. Thus, there are two possible combinations of sets that could have been connected with Bridging Sequences. In this case, state S0 250 was connected to state S1 251, and state S01 252 was connected to state S11 253. Two bridging sequences are found on the graph constructed from UIOs, such that fault coverage can be improved by bridging sequences constructed by UIOs. This has another advantage, since if state S0 250 had been connected to state S11 253, the resulting Merged Test Subsequence Graph 39 would have had two disjoint state sets. As the two graphs would not have been weakly connected, a single Euler Tour, step 42 (see FIG. 3) would not have be possible.

It can now be appreciated that different representations of Hierarchical FSM Models are possible. The representation disclosed here offers obvious advantages when merging Test Subsequence Subgraphs. However, these techniques may be applied with small modifications to other envisioned hierarchical FSM representations.

The representation utilized herein probably was not realistically implimentable until the disclosure of the remainder of this invention. The construction of Test Subsequences for lower level Subgraphs would have been difficult, if not impossible, before the disclosure herein of using FUIOs, BUIOs, FUIOsets and BUIOsets together in their construction. For example, sink states, such as the lower level "Exit" states, do not have FUIO sequences, but will usually have either a BUIO or a BUIOset. Likewise, source states, such as the lower level "Start" states, do not have BUIO sequences, but will usually either be uniquely identified by a FUIO and/or a FUIOset.

The obvious advantage of utilizing and allowing Hierarchical FSM Models is first that these Models often mirror the reality of circuit, protocol, and software design better than fiat models. For example, most complex circuits today are constructed of successively lower levels of modules, ultimately resolving into logic elements and then transistors. Secondly, hierarchical construction of Test Subsequences can be substantially more efficient than non-hierarchical construction. One reason is that UIO searches need not address the larger model. This may result in both faster identification of UIO sequences, and shorter UIO sequences. One final advantage is that hierarchical Test Subsequence construction may now be done more easily in parts. Indeed, a change to one lower level Subgraph or module need not require reconstruction of Test Subsequences for the remainder of a FSM model. This enables the invention to be used not only in top down designs, but also in bottom up designs.

Those skilled in the art will recognize that modifications and variations can be made without departing from the spirit of the invention. Therefore, it is intended that this invention encompass all such variations and modifications as fall within the scope of the appended claims.

Appendix
- 1 -

1. Process Definition

1.1 Process Check_Command_Line

```
Check_Command_Line(argc, *argv)
If ("-h" is in the gen_command_line){
        print out help message and exit(1)
}
if ("-f" is in the gen_command_line){
        file_name = the next token in the command line;
        if("-v" is in the gen_command_line){
            verbose = TRUE;
    }
else {
        Print_Error() to print "# ERROR" message and exit(1);
    }
}
```

1.2 Process Parse_FSM

```
Parse_FSM(FSM file, command_line options, FSM data))
If (the FSM file is not empty){
    number_transition = 0;
    while(not EOF){
      read one line;
      if(the first character of the first field is not a comment sign){
          if (the first/two characters of the first field is a directive sign(. or !.)){
          // set directive variables;
      }
        else {
           If(".flattened" directive is found in the file){
               input_vector[number_transition][0]  = first field in the line;
               current_state[number_transition][0] = second field in the line;
               next_state[number_transition][0]    = third field in the line;
               output_vector[number_transition][0] = forth field in the line;
               increase number_transition by one;
        }
         else {
              read in hierarchical tree file;
```

Appendix
- 2 -

```
        while(there is one FSM not read in){
            traversal the hierarchical tree by use Breadth_First_Search method;
            For(some files in the same hierarchical level){
                while(not meet ".end" ){
                    input_vector[number_transition][sub_fsm]  = first field in the line;
                    current_state[number_transition][sub_fsm] = second field in the line;
                    next_state[number_transition][sub_fsm]    = third field in the line;
                    output_vector[number_transition][sub_fsm] = forth field in the line;
                    increase number_transition[sub_fsm] by one;
                }
                sub_fsm increases one;
            }
            hierarchical level increases one;
            }
          }
        } // end of while loop
}
If( the number of states without outgoing transitions > 1){
    For( states without outgoing transitions){
        Print_error() to print state names and incoming transitions;
    }
}
If( the number of states without incoming transitions > 1){
    For( states without incoming transitions){
        Print_error() to print state names and outgoing transitions;
    }
}
For( all states){
    If( there are more than one outgoing transitions with identical I/O label enter two different
states){
        Print_error() to print the current state and next sates of the transition
        and the input/output of the transitions;
    }
}
For(all Sub_FSM files){
```

Appendix
- 3 -

```
For( all transitions in one FSM file){
    If (there are more than one transitions from a common state and to a common state){
        Print_warning() to warn the use that there are duplication transitions;
    }
  }
}
```

1.3   Process Generate_Test_Sequence

```
For(all FSMs in the FSM file){
        Create_FSM_Graph(FSM data, Gfsm(V,E);
        Check_Weakly_Connected(Gfsm(V,E));
        Compute_Distinctness(Gfsm(V,E), Gfsm(V,E) with distinctness measurement);
        Sort_edge_Vertex(Gfsm(V,E) with distinctness measurement, Sorted Gfsm(V,E));
        Generate_UIOs(Sorted Gfsm(V,E), UIO Sequences, verbose results);
        Create_Test_Subsequence_Graph(Sorted Gfsm(V,E), UIO Sequences, verbose results,
                        Test Subsequence Graph);
        Create_Symmetric_Augmented_Test_Subsequence_Graph(Test Subsequence Graph,
                                Symmetric Test Subsequence Graph);
        Generate_Euler_Tour(Symmetric Test Subsequence Graph, Individual_Euler_Tours);
}
```

1.4   Process Create_FSM_Graph

Create_FSM_Graph(FSM data, Gfsm(V,E))

Create a graph representation of the FSM, where a node (vertex) of the graph represents a state in the FSM, an edge of the graph represents a transition from one current state to another state in the FSM, the node of the list represents two consecutive transition lines and its properties (distinctness measurements and traversal flags values which will be determined below) of the FSM file
}

1.5   Process Check_Weakly_Connected

Check_Weakly_Connected(Gfsm(V,E))
// Depth_First_Search on the Gfsm(V,E)
Depth_First_Search(Gfsm(V,E));
Weakly_Connected_Check(V, p[v]);

Appendix
- 4 -

1.6 Process Depth_First_Search

```
Depth_First_Search(G(V,E))
For(each vertex u inside V[G]){
    do color[u] = white;
    // p[v] is a predecessor of v, Gp = (V, Ep),
    // where Ep = {(p[v],v): v is inside V and p[v] is not equal to NULL},
    // Gp is the predecessor subgraph of a depth-first search which forms
    // a depth-first forest composed of several depth-first trees. The edges
    // in Ep are called tree edges.
    p[u] = NULL;
}
time = 0;
For(each vertex u inside V[G]){
    If(color[u] = white){
        Depth_First_Visit(u);
    }
}
Depth_First_Visit(u)
// white vertex u has just been visited
color[u] = gray;
time = time + 1;
d[u] = time;
// First time traversal edge (u,v)
For(each v inside adjacency list of u)
    If(color[v] = white){
        p[v] = u;
        Depth_First_Visit(v);
    }
// Blacken u; it is finished
color[u] = black;
time = time + 1;
finish[u] = time;
}
```

1.7 Process Weakly_Connected_Check

Weakly_Connected_Check(V, p[v])

Appendix
- 5 -

```
If(the number of nodes visited by Depth_First_Search is less than
the number of nodes Gfsm(V,E)){
    // not weakly connected
    Print_Error();
    return(FAIL);
}
else {
    return(SUCCEED);
}
```

1.8 Process Compute_Distinctness

Compute_Distinctness(Gfsm(V,E), Gfsm(V,E) with distinctness measurement)
// Compute the distinctness measurement dmi of input/output pairs appeared in the FSM,
   where i is every transition in the FSM.
// For each state j, compute the distinctness measurement of input/output pairs from the state,
   which is dm_fromij , for all i transition from state j.
// For each state k, compute the distinctness measurement of input/output pairs to the state,
   which is dm_toik , for all i transition to state k.
Initialize all dmi , dm_fromij , dm_toik to 0;
Find distinctive labels (stimuli, expected response of the transition) in the FSM;
For (each distinctive label i){
    For (each transition TR in the FSM){
        if( the distinctive label i equals the TR){
          increase dmi by 1;
        }
    }
    For (each transition TR_from from state j){
        if(the distinctive label i equals the TR_from){
          increase dm_fromij by 1;
        }
    }
    For (each transition TR_to to state k){
        if(the distinctive label i equals the TR_to){
          increase dm_toik by 1;
        }
    }
}
```

Appendix
- 6 -

}

1.9 Process Sort_edge_Vertex

Sort_edge_Vertex(Gfsm(V,E) with distinctness measurement, Sorted Gfsm(V,E))
// Sort edges (transitions) of the FSM by the distinctness measurements
Sort edges of the FSM by dmi;
For(each node (state) j in the FSM){
    For( outgoing edges with same dmi ){
       sort these edges according to dm_fromij ;
    }
}
For(each node (state) k in the FSM){
    For(incoming edges with same dmi ){
       sort these edges according to dm_toik ;
}
Sort vertex (state) according to the (sum of dmi on the outgoing transitions of the vertex) /
(total number of transition from this vertex) ;

1.10 Process Generate_UIOs

Generate_UIOs(Sorted Gfsm(V,E), FUIO Sequences, BUIO Sequences, UIO_Set,
Partial_UIO_Set, State_BUIO, State_UIO_Set, state_candidate_UIO_set, verbose results)
// Breadth_First_Search starting from all states in the FSM
all_found = FALSE;
set_found = FALSE;

For (every state j){
    For( all edges from state j to state k with dmi = 1){
       FUIOj = BUIOk = TRi;
       Remove the state j from state candidate set for searching UIOs;
    }
}
For (each state k in the state candidate set for searching UIOs){
    While( the depth of Breadth_First_Search trees is less than TIME_OUT){
       // Use state k as root, Breadth_First_Search forward, use distinctness
       // measurements as heuristics;
       For(vertex is not visited by other trees or vertex visited by other trees Appendix
-7-

```
            but the expected response under the stimuli is different){
                Expand Breadth_First_Search trees forward one more level;
        }
        // Find unique sequences from every tree root;
        if( unique sequences from every tree root are found){
            Save FUIOstate found and delete these states from the candidate set;
            State_FUIO = State_FUIO + the state(s);
        }
            if( the state candidate is equal to empty){
                all_found = TRUE;
            }
    } // end of while loop
}
For (all state si for which FUIO was not found){
    For (all starting states sd of the incoming edges to the state si ){
        add sd into the state candidate set for searching UIOs;
    }
}
if(all_found == FALSE){
    For (each state k in the state candidate set for searching UIOs){
        While( the depth of Breadth_First_Search trees is less than TIME_OUT){
            // Use state k as root, Breadth_First_Search backward, use distinctness
            // measurements as heuristics;
            For(vertex is not visited by other trees or vertex visited by other trees
            but the expected response under the stimuli is different){
                Expand Breadth_First_Search trees backward one more level;
        }
        // Find unique sequences (in all trees) from every tree root;
        if(unique sequences from every tree root are found){
            Save BUIOstate found and delete these states from the candidate set;
            State_BUIO = State_BUIO + the state(s);
        }
            if(the state candidate is equal to empty){
                all_found = TRUE;
            }
    } // end of while loop
```

Appendix
- 8 -

```
    }
}
if(all_found == FALSE){
    copy state_candidate_set for UIOs to state_candidate_UIO_set;
    For (each state k in the state candidate set for searching UIO Set){
        While(the depth of Breadth_First_Search trees is less than TIME_OUT){
            // Use state k as root, Breadth_First_Search forward, use distinctness
            // measurements as heuristics;
            For(vertex is not visited by other trees or vertex visited by other trees
            but the expected response under the stimuli is different){
                Expand Breadth_First_Search trees forward one more level;
            }
            // Find distinctive sequences to distinduish state k from the state candidate set
            // with one of the state other than state k in the FSM, one by one,
            // we call the distinctive sequences found as UIO_Set
            if( distinctive sequences for state k from the state candidate set are found){
                Save UIO_Setk found and delete the state from the candidate set;
                State_UIO_Set = State_UIO_Set + the state k;
            }
                if( the state candidate is equal to empty){
                set_found = TRUE;
            }
            else {
                Use sequence searched as a Partial_UIO_Set for these states
                    which don't possess FUIOs, BUIOs and UIO Set;
            }
        } // end of while loop
    }
}
```

1.11  Process Breadth_First_Search

```
Breadth_First_Search(G(V,E),source_vertex)
For(each vertex u inside V[G] -{source_vertex}){
    color[u] = white;
    distance[u] = infinite;
    // p[v] is a predecessor of v, Gp = (Vp, Ep),
```

Appendix
- 9 -

```
        // where Vp = {v is inside V: p[v] is not equal to NULL} plus {source_vertex},
        // Ep = {(p[v], v) inside E: v is inside Vp-{source_vertex} and p[v] is not equal to NULL},
        // Gp is the predecessor subgraph of a breadth-first search which forms
            // a breadth-first forest composed of several breadth-first trees. The edges
            // in Ep are called tree edges.
        p[u] = NULL;
    }
    color[source_vertex] = Gray;
    distance[source_vertex] = 0;
    p[source_vertex] = NULL;
    // Push only source_vertex into a queue Q, which is a first-in, first-out queue
    // Q is used to manage the set of gray vertices
    Q = NULL;
    Enqueuqe(Q,source_vertex);
    While(Q is not empty){
        u = the head vertex inside the queue Q;
        For(each v inside adjacency list of u){
            if(color[v] == white){
                color[v] = gray;
                distance[v] = distance[u] + 1;
                p[v] = u;
                Enqueue(Q,v);
            }
        }
        Dequeue(Q);
        color[u] = black;
    }
}
```

1.12 Process Create_Test_Subsequence_Graph

Create_Test_Subsequence_Graph(Sorted Gfsm(V,E), FUIO Sequences, BUIO Sequences,
UIO_Set, Partial_UIO_Set, State_BUIO, State_UIO_Set, state_candidate_UIO_set, verbose
results, Test Subsequence Graph)
// "@" means concatenating two sequences
For( every state k with FUIOsk){
    For( every incoming transition TRi of state k)
        // TSi is the Test Subsequence of TRi Appendix
- 10 -

```
        TSi = TRi_to_state_k @ one of FUIOsk;
    }
}
For( every state k in State_BUIO ){
    For( every outgoing transition TRi of state k)
        // TSi is the Test Subsequence of TRi
        TSi = one of BUIOsk @ TRi_from_state_k ;
    }
}
For( every sink state k){
    For( every incoming transition TRi of state k)
        // TSi is the Test Subsequence of TRi
        If(The starting state j of TRi is in State_BUIO){
            // TSi = one of BUIOsj @ TRi_to_state_k is processed in the above loop
        }
        else
        {
            TSi = TRi_to_state_k;
        }
    }
}
For( every state k in State_UIO_Set){
    For( every incoming transition TRi of state k for forward UIO_Set){
    // TSij is the Test Subsequence of TRi for the jth partial UIO_Set sequence
    // to distinguish at least between state j and state i
        For( every sequence j in the UIO_Set){
            TSij = TRi_to_state_k @ jth Sequence of forward UIO_Set;
        }
    }
    For( every outgoing transition TRi of state k for backward UIO_Set){
        For( every sequence j in the UIO_Set){
            TSij = jth Sequence of backward UIO_Set@TRi_from_state_k ;
        }
    }
}
For (every state k in (state_candidate_UIO_set - State_UIO_Set))
```

Appendix
- 11 -

```
For( every incoming transition TRi of state k)
    // TSij is the Test Subsequence of TRi for the jth sequence in the UIO_Set
    // to distinguish between state j and state i
    For( every sequence j in the Partial_UIO_Set){
        TSij = TRi_to_state_k @ jth Sequence of Partial_UIO_Set;
    }
  }
}
// Create Test Subsequence Graph by viewing Test Subsequences as macro-edges.
Create Test Subsequence Graph using the states in the FSM graph as node and
using Test Sequence as an edge in the Test Subsequence graph (create a double link list);
```

1.13 Process Merge_Hierachical_Test_Subsequence_Graph

```
Merge_Hierachical_Test_Subsequence_Graph(Hierarchical Test Subsequence Graph,
 Test Subsequence Graph)
If(the FSM is hierarchically described){
    Connect the Individual Test_Subsequence_Graph of the sub_FSm file by traversal
    the hierarchical tree and merge the START transition of the current FSM to the transition
which
    leaves its parent FSM for the current FSM with the identical label of the
    Test_Subsequence_Graph of its parent FSM and merge the EXIT point transition to the
    transition which leaves its current FSM for the parent FSM with the identical label
    of the Test_Subsequence_Graph of its parent FSM;
}
```

1.14 Process Create_Symmetric_Augmented_Test_Subsequence_Graph

```
Create_Symmetric_Augmented_Test_Subsequence_Graph(Test Subsequence Graph,
Symmetric Test Subsequence Graph)
// Make In_degree = Out_degree for every node except only the initial (reset) state and one
more
// state can have the property of In_degree = Out_degree +1 or In_degree = Out_degree -1
// The above is the symmetric augmentation definition.

// Compute in_degree and out_degree of all vertices in the Test Subsequence Graph.
// diff_degree(s) = in_degree(s) - out_degree(s).
Compute_Symmetric_Measurement(Test Subsequence Graph, diff_degree);
```

Appendix
- 12 -

```
// Sort the vertices whose diff_degree are not balanced (not symmetric).
Sort_Vertex_Degree(diff_degree, Test Subsequence Graph, sorted vertex list,
        Test Subsequence Graph);

While( the Test Subsequence Graph is not symmetric){
    Pick one vertex with largest positive value of diff_degree from sorted vertex lists as
start_vertex;
    If(the Test Subsequence Graph is not connected
        and diff_degree(non-source and non-sink) == 0){
        If(a pair of vertices is not on any articulation edges in the FSMs){
            pick any a pair of states in a pair of unconnected pieces as a pair of
            start_vertex and end_vertex_set;
        }
    }
    Create_Guios(Vuio, Euio)_Graph(UIO Sequences, Merged Gfsm (V,E), Guios(Vuio, Euio));
    Find_Shortest_Path(start_vertex, end_vertex_set, bridging sequences,
            Test Subsequence Graph, Guios(Vuio, Euio));
    Symmetric_Augmenting(bridging sequences, Test Subsequence Graph,
            Symmetric Test Sequence Graph);
    Compute_Symmetric_Measurement(Test Subsequence Graph, diff_degree);
    Sort_Vertex_Degree(diff_degree, Test Subsequence Graph, sorted vertex list,
            Test Subsequence Graph);
}
If(diff_degree(START) or diff_degree(EXIT) is still not equal to zero){
    replace the traversed transition from START state with
    un-traversed transitions from START state to form another tour sequence;
    replace the traversed transition to EXIT state with
    untraversed transitions to EXIT state to form another tour sequence;
}
```

1.15 Process Compute_Symmetric_Measurement

```
Compute_Symmetric_Measurement(Test Subsequence Graph, diff_degree)
For( every vertex s in the Test Subsequence Graph){
    in_degree(s) = the number of incoming transitions of the vertex s;
    out_degree(s) = the number of outing transitions of the vertex s;
```

Appendix
- 13 -

```
    diff_degree(s) = in_degree(s) - out_degree(s);
    Check_Weakly_Connected(Test Subsequence Graph);
}
```

1.16    Process Sort_Vertex_Degree

Sort_Vertex_Degree(diff_degree, Test Subsequence Graph, sorted vertex list)
Create one list of vertices for diff_degree(s) > 0;
Create another list of vertices for diff_degree(s) < 0;
Sort them according to the absolute value of diff_degree(s) separately;

1.17    Process Merge_Hierachical_FSM_Graph

Merge_Hierachical_FSM_Graph(Gfsm(V,E), Merged Gfsm(V,E))
If(the FSM is hierarchically described){
    Connect the Individual Gfsm(V,E) of the sub_FSm file by traversal
    the hierarchical tree and merge the START transition of the current FSM to the leaving
    point of the Gfsm(V,E) of    its parent FSM and merge the EXIT point
    transition to the entering of the Gfsm(V,E) of its parent FSM;
}

1.18    Process Create_Guios(Vuio, Euio)_Graph

Create_Guios(Vuio, Euio)_Graph(UIO Sequences, Merged Gfsm (V,E), Guios(Vuio, Euio))
Create a graph Guios(Vuio, Euio) based on the Merged Gfsm (V,E), which views UIOs as
micro edges, where Vuio is the start node and end node of UIOs and Euio is
the UIO sequences viewed as micro edges;

1.19    Process Find_Shortest_Path

Find_Shortest_Path(start_vertex, end_vertex_set, bridging sequences, Test Subsequence
Graph, Guios(Vuio, Euio))
// bridging sequence = shortest weighted path from start_vertex to end_vertex
// Find shortest path from the start_vertex to end_vertex_set by using UIOs as micro edges
// in the shortest path, the number of transitions in the micro edge is used
// as weighted distance on the micro edge
// D_Shortest_Path() find all shortest path from a source_vertex to all reachable vertices
D_Shortest_Path(start_vertex, end_vertex_set, bridging sequences, Guios(Vuio, Euio) with
weight = the number of transitions on every UIO);
If(the shortest path is not found){

Appendix
- 14 -

```
// View the distinctive measurement dmi as the weighted distance on every transition
// find shortest path on the original Gfsm (V,E) with distinctness measurement;
    D_Shortest_Path(start_vertex, end_vertex_set, bridging sequences, Gfsm(V , E ) with
    distinctive measurement dmi as the weight on every transition);
}
```

1.20   Process D_Shortest_Path

D_Shortest_Path(source_vertex, end_vertex_set, bridging sequences, G (V, E) with weight on every edge)

```
// In the following requirement, we maintain a priority queue Q that contain
// all the vertices in V-Set_S, keyed by their distance values
For(every edge in the E){
   If(weight(the edge) < 0){
      Print_Error();
   }
}
Initialize-single-source(G, source_vertex);
Set_S = empty;
Q = V[G];
While( Q is not empty){
   u = Extract-min(Q);
   Set_S = Set_S + {u};
   For(each vertex v inside adjacency list of u){
      Relax(u,v,weight);
   }
}

Initialize-single-source(G,source_vertex)
For(each vertex v inside V[G]){
    // distance(v) is a shortest-path estimate
    distance(v) = infinite;
    // p[v] is a predecessor set of v
    p[v] = NULL;
}
distance(source_vertex) = 0;
```

Appendix
- 15 -

```
Relax(u,v,weight)
If( distance(v) > distance(u) + weight(u,v)){
   distance(v) = distance(u) + weight(u,v);
   p[v] = u;
   }
}
```

Extract-min(Q)
// extract the vertex with minimum shortest-path estimate (distance value) from the queue Q;

1.21 Process Symmetric_Augmenting

Symmetric_Augmenting(bridging sequences, Test Subsequence Graph, Symmetric Test Sequence Graph)

Add the bridging sequence to the Test Subsequence Graph by viewing the sequence as a macro edge;

modify in_degree, out_degree, diff_degree of the starting/ending vertices of the bridging sequence;

1.22 Process Generate_Euler_Tour

Generate_Euler_Tour(Symmetric Test Subsequence Graph, Individual_Euler_Tours)
// Find the Euler_Tour by merging edge-disjoint cycles, O(|E|) complexity.
// Finish(v) is a timestamp which records when the search finishes examining v's adjacency list.

Depth_First_Search on the forward links of the SATS_Graph
(Symmetric_Augmented_Test_Subsequence_Graph) to compute Finish(v) for each vertex v;
Depth_First_Search on the backward links of the SATS_Graph for the vertices in order of decreasing Finish(v) as computed in the first Depth_First_Search call;
Save each tree and its loop-edges (backward, forward edges) in the second
Depth_First_Search
call as separate strongly connected component;
Save other edges as between different trees as articulation edges;
For(every strongly connected component){
    For(every edge-disjoint loops){
        find out the shared vertices between loops;

}
    take one of the loop to form the tour starting from the initial state to the first shared vertices;

For(every shared vertices between edge-disjoint loops){ remove one of the shared vertices from loops;

connect the end point of the current tour to the starting point of the merged loop;

connect the end point the merged loop to the outgoing edge of the shared vertex on the current loop;

continue the tour until a new shared vertices is met;

}
}

Connect tours found using articulation edges between strongly connected components;

Print TOUR;

exit(SUCCEED);

}

1.23 Process Print_Error

Print_Error()

Print out error information according to the error type;

exit(FAIL);

1.24 Process Print_Warning

Print_Warning()

Print out waring information;

We claim:

1. A method utilizing a computer for merging Hierarchical Test Subsequence (TS) Subgraphs into a merged Test Subsequence (TS) Graph, the merged Test Subsequence (TS) Graph being used to generate test sequences utilized in testing a Machine Under Test (MUT) for conformance against a Hierarchical Finite State Machine (FSM) model, wherein:

each said Test Subsequence (TS) Subgraph is a Directed Graph stored in a Memory with one or more Test Subsequence (TS) Subgraph Vertices and one or more Test Subsequence (TS) Subgraph Micro-Edges between the Test Subsequence (TS) Subgraph Vertices;

each of said Test Subsequence (TS) Subgraph Micro-Edges corresponds to a Test Subsequence (TS);

each Test Subsequence (TS) comprises an Ordered Sequence of Input/Output (I/O) Sequences; and all said Test Subsequence (TS) Subgraphs are hierarchically related to each other, wherein:

at least one Test Subsequence (TS) Subgraph is a Parent Test Subsequence (TS) Subgraph, at least one Test Subsequence (TS) Subgraph is a Child Test Subsequence (TS) Subgraph, each Child Test Subsequence (TS) Subgraph has one Parent Test Subsequence (TS) Subgraph, at least one Parent Test Subsequence (TS) Subgraph is a Parentless Test Subsequence (TS) Subgraph, Parentless Test Subsequence (TS) Subgraphs do not have Parent Test Subsequence (TS) Subgraphs, and each Child Test Subsequence (TS) Subgraph has an Incoming Test Subsequence (TS) Subgraph Micro-Edge and an Outgoing Test Subsequence (TS) Subgraph Micro-Edge;

said method comprising the steps of:

(a) identifying the Parent Test Subsequence (TS) Subgraph for each Child Test Subsequence (TS) Subgraph;

(b) identifying all Incoming Test Subsequence (TS) Subgraph Micro-Edges and all Outgoing Test Subsequence (TS) Subgraph Micro-Edges for Each Child Test Subsequence (TS) Subgraph;

(c) merging all Child Test Subsequence (TS) Subgraphs with their corresponding Parent Test Subsequence (TS) Subgraphs by connecting all Incoming Child Test Subsequence (TS) Subgraph Micro-Edges and all Outgoing Child Test Subsequence (TS) Subgraph Micro-Edges to Test Subsequence (TS) Subgraph Vertices in Test Subsequence (TS) Subgraphs other than the Child Test Subsequence (TS) Subgraph;

(d) sequentially repeating steps (a)-(c) until all Child Test Subsequence (TS) Subgraphs have been merged with their Parent Test Subsequence (TS) Subgraph to form one or more Merged Parentless Test Subsequence (TS) Subgraph; and (e) forming the Merged Test Subsequence (TS) Graph for storage in the Memory by combining all of the one or more Merged Parentless Test Subsequence (TS) Subgraphs.

2. The method claimed in claim 1 wherein the step of merging all Child Test Subsequence (TS) Subgraphs with their corresponding Parent Test Subsequence (TS) Subgraphs comprises the substep of:

(1) connecting all incoming Test Subsequence (TS) Subgraph Micro-Edges of Child Test Subsequence (TS) Subgraphs and all Outgoing Test Subsequence (TS) Subgraph Micro-Edges of Child Test Subsequence (TS) Subgraph to Test Subsequence (TS) Subgraph Vertices in the Parent Test Subsequence (TS) Subgraph of the Child Test Subsequence (TS) Subgraph.

3. The method claimed in claim 1 which further comprises the step of:

(f) creating a Merged FSM Graph for storage in the Memory by merging FSM Subgraphs.

4. The method claimed in claim 1 which further comprises the step of:

(f) creating an Augmented Test Subsequence (TS) Graph for storage in the Memory by adding Bridging Sequences to the Merged Test Subsequence (TS) Graph.

5. The method claimed in claim 4 which further comprises the step of:

(g) creating a Verification Test Sequence (VTS) for storage in the Memory by following a Tour of the Augmented Test Subsequence (TS) Graph.

6. The method claimed in claim 5 which further comprises the step of:

(h) storing data representing the Verification Test Sequence (VTS) in the Memory.

7. A method for testing conformance of the Machine Under Test (MUT) with a Hierarchical FSM Model utilizing the method claimed in claim 5 wherein:

the Verification Test Sequence (VTS) comprises a Sequentially Ordered Series Of Input/Output (I/O) Sequences, each I/O Sequence includes an Input Stimulus and a corresponding Output Response, and each said Input Stimulus comprises one or more Input Stimulus Signals;

the method further comprising the steps of:

(h) driving the Machine Under Test (MUT) by sequentially supplying to the Machine Under Test (MUT) each of the Input Stimulus Signals in the Verification Test Sequence (VTS);

(i) comparing Output Responses received from the Machine Under Test (MUT) to the Output Responses associated with each Input Stimulus in the Verification Test Sequence (VTS); and (j) verifying that the Output Responses received from the Machine Under Test (MUT) match the Output Responses in the I/O Sequences in the Verification Test Sequence (VTS).

8. The method claimed in claim 1 wherein:

said Hierarchical FSM Model has a plurality of FSM Submodels;

each said FSM Submodel has one or more FSM Submodel States and one or more FSM Submodel State Transitions between the FSM Submodel States;

each said FSM Submodel State Transition has a corresponding Input/Out-put (I/O) Sequence;

all said FSM Submodels in the Hierarchical FSM Model are hierarchically related to each other;

each said Test Subsequence (TS) Subgraph Vertex corresponds to one FSM Submodel State;

each Test Subsequence (TS) comprises an Ordered Sequence Of I/O Sequences corresponding to an Ordered Sequence Of FSM Submodel State Transitions in a corresponding FSM Submodel;

all Test Subsequence (1S) Subgraph Vertices in each Test Subsequence (TS) Subgraph correspond to FSM Submodel States in the corresponding FSM Submodel; and each said Test Subsequence (TS) Subgraph is constructed from the FSM Submodel States and FSM Submodel State Transitions of a Single FSM Submodel.

9. A method utilizing a computer for merging Hierarchical Test Subsequence (TS) Subgraphs into a merged Test Subsequence (TS) Graph, the merged Test Subsequence (TS) Graph being used to generate test sequences utilized in testing a Machine Under Test (MUT) for conformance against a Hierarchical Finite State Machine (FSM) model, wherein:

each said Test Subsequence (TS) Subgraph is a Directed Graph stored in a Memory with one or more Test Subsequence (TS) Subgraph Vertices and one or more Test Subsequence (TS) Subgraph Micro-Edges between the Test Subsequence (TS) Subgraph Vertices;

each of said Test Subsequence (TS) Subgraph Micro-Edges corresponds to a Test Subsequence (TS);

each Test Subsequence (TS) comprises an Ordered Sequence of Input/Output (I/O) Sequences; and all said Test Subsequence (TS) Subgraphs are hierarchically related to each other, wherein:

at least one Test Subsequence (TS) Subgraph is a Parent Test Subsequence (TS) Subgraph, at least one Test Subsequence (TS) Subgraph is a Child Test Subsequence (TS) Subgraph, each Child Test Subsequence (TS) Subgraph has one Parent Test Subsequence (TS) Subgraph, at least one Parent Test Subsequence (TS) Subgraph is a Parentless Test Subsequence (TS) Subgraph, Parentless Test Subsequence (TS) Subgraphs do not have Parent Test Subsequence (TS) Subgraphs, each Child Test Subsequence (TS) Subgraph has an Incoming Test Subsequence (TS) Subgraph Micro-Edge and an Outgoing Test Subsequence (TS) Subgraph Micro-Edge, said Hierarchical FSM Model has a plurality of FSM Submodels, each said FSM Submodel has one or more FSM Submodel States and one or more FSM Submodel State Transitions between the FSM Submodel States, each said FSM Submodel State Transition has a corresponding Input/Output (I/O) Sequence, all said FSM Submodels in the Hierarchical FSM Model are hierarchically related to each other, each said Test Subsequence (TS) Subgraph Vertex corresponds to one FSM Submodel State, each Test Subsequence (TS) comprises an Ordered Sequence Of I/O Sequences corresponding to an Ordered Sequence Of FSM Submodel State Transitions in a corresponding FSM Submodel, all Test Subsequence (TS) Subgraph Vertices in each Test Subsequence (TS) Subgraph correspond to FSM Submodel States in the corresponding FSM Submodel, and each said Test Subsequence (TS) Subgraph is constructed from the FSM Submodel States and FSM Submodel State Transitions of a Single FSM Submodel;

said method comprising the steps of:

(a) identifying the Parent Test Subsequence (TS) Subgraph for each Child Test Subsequence (TS) Subgraph;

(b) identifying all Incoming Test Subsequence (TS) Subgraph Micro-Edges and all Outgoing Test Subsequence (TS) Subgraph Micro-Edges for Each Child Test Subsequence (TS) Subgraph;

(c) merging all Child Test Subsequence (TS) Subgraphs with their corresponding Parent Test Subsequence (TS) Subgraphs by connecting all Incoming Child Test Subsequence (TS) Subgraph Micro-Edges and all Outgoing Child Test Subsequence (TS) Subgraph Micro-Edges to Test Subsequence (TS) Subgraph Vertices in Test Subsequence (TS) Subgraphs other than the Child Test Subsequence (TS) Subgraph, said merging comprising the substep of:

(1) connecting all incoming Test Subsequence (TS) Subgraph Micro-Edges of Child Test Subsequence (TS) Subgraphs and all Outgoing Test Subsequence (TS) Subgraph Micro-Edges of Child Test Subsequence (TS) Subgraph to Test Subsequence (TS) Subgraph Vertices in the Parent Test Subsequence (TS) Subgraph of the Child Test Subsequence (TS) Subgraph;

(d) sequentially repeating steps (a)–(c) until all Child Test Subsequence (TS) Subgraphs have been merged with their Parent Test Subsequence (TS) Subgraph to form one or more Merged Parentless Test Subsequence (TS) Subgraph; and (e) forming the Merged Test Subsequence (TS) Graph for storage in the Memory by combining all of the one or more Merged Parentless Test Subsequence (TS) Subgraphs.

10. An apparatus for merging Hierarchical Test Subsequence (TS) Subgraphs into a merged Test Subsequence (TS) Graph, the merged Test Subsequence (TS) Graph being used to generate test sequences utilized in testing a Machine Under Test (MUT) for conformance against a Hierarchical Finite State Machine (FSM) model, wherein:

each said Test Subsequence (TS) Subgraph is a Directed Graph with one or more Test Subsequence (TS) Subgraph Vertices and one or more Test Subsequence (TS) Subgraph Micro-Edges between the Test Subsequence (TS) Subgraph Vertices;

each of said Test Subsequence (TS) Subgraph Micro-Edges corresponds to a Test Subsequence (TS);

each Test Subsequence (TS) comprises an Ordered Sequence of Input/Output (I/O) Sequences; and all said Test Subsequence (TS) Subgraphs are hierarchically related to each other, wherein:

at least one Test Subsequence (TS) Subgraph is a Parent Test Subsequence (TS) Subgraph, at least one Test Subsequence (TS) Subgraph is a Child Test Subsequence (TS) Subgraph, each Child Test Subsequence (TS) Subgraph has one Parent Test Subsequence (TS) Subgraph, at least one Parent Test Subsequence (TS) Subgraph is a Parentless Test Subsequence (TS) Subgraph, Parentless Test Subsequence (TS) Subgraphs do not have Parent Test Subsequence (TS) Subgraphs, and each Child Test Subsequence (TS) Subgraph has an Incoming Test Subsequence (TS) Subgraph Micro-Edge and an Outgoing Test Subsequence (TS) Subgraph Micro-Edge;

said apparatus comprising:

(a) a Memory storing data representing each of the Test Subsequence (TS) Subgraphs;

(b) means for identifying the Parent Test Subsequence (TS) Subgraph for each Child Test Subsequence (TS) Subgraph;

(c) means for identifying all Incoming Test Subsequence (TS) Subgraph Micro-Edges and all Outgoing Test Subsequence (TS) Subgraph Micro-Edges for Each Child Test Subsequence (TS) Subgraph;

(d) means for merging all Child Test Subsequence (TS) Subgraphs with their corresponding Parent Test Subsequence (TS) Subgraphs by connecting all Incoming Child Test Subsequence (TS) Subgraph Micro-Edges and all Outgoing Child Test Subsequence (TS) Subgraph Micro-Edges to Test Subsequence (TS) Subgraph Vertices in Test Subsequence (TS) Subgraphs other than the Child Test Subsequence (TS) Subgraph;

(e) means for sequentially repeating elements (b)–(d) until all Child Test Subsequence (TS) Subgraphs have been merged with their Parent Test Subsequence (TS) Subgraph to form one or more Merged Parentless Test Subsequence (TS) Subgraph;

(f) means for forming the Merged Test Subsequence (TS) Graph by combining all of the one or more Merged Parentless Test Subsequence (TS) Subgraphs; and (g) means for storing the Merged Test Subsequence (TS) Graph in the Memory.

11. A method utilizing a computer for merging Finite State Machine (FSM) Subgraphs into a Merged FSM Graph for use in testing a Machine Under Test (MUT) for conformance against a Hierarchical FSM Model, wherein:

said Hierarchical FSM Model has a plurality of FSM Submodels;

each FSM Submodel has a plurality of FSM Submodel States and a plurality of FSM Submodel State Transitions between the FSM Submodel States;

each FSM Submodel State Transition has a corresponding Input/Output (I/O) Sequence;

all FSM Subgraphs and the Merged FSM Graph are Directed Graphs stored in a Memory with a plurality of FSM Subgraph Vertices and a plurality of FSM Subgraph Edges between the plurality of FSM Subgraph Vertices, wherein:

each said FSM Subgraph Vertex corresponds to one FSM Submodel State, each said FSM Subgraph Edge corresponds to one FSM Submodel State Transition, and each said FSM Subgraph corresponds to one FSM Submodel; and all said FSM Subgraphs are hierarchically related to each other, wherein:

at least one FSM Subgraph is a Parent FSM Subgraph, at least one FSM Subgraph is a Child FSM Subgraph, each Child FSM Subgraph has one Parent FSM Subgraph, at least one Parent FSM Subgraph is a Parentless FSM Subgraph, wherein Parentless FSM Subgraphs do not have Parent FSM Subgraphs, and each Child FSM Subgraph has an Incoming FSM Subgraph Edge and an Outgoing FSM Subgraph Edge;

said method comprising the steps of:

(a) identifying the Parent FSM Subgraph for each Child FSM Subgraph, wherein:

each said Parent FSM Subgraph and each said Child FSM Subgraph are obtained from the Memory;

(b) identifying all Incoming FSM Subgraph Edges and all Outgoing FSM Subgraph Edges for each Child FSM Subgraph;

(c) merging all Child FSM Subgraphs with their corresponding Parent FSM Subgraphs by connecting all Incoming FSM Subgraph Edges to Child FSM Subgraphs and all Outgoing FSM Subgraph Edges to Child FSM Subgraphs to FSM Subgraph Vertices in FSM Subgraphs other than the Child FSM Subgraph;

(d) repeating steps (a) through (c) until all Child FSM Subgraphs have been merged with their Parent FSM Subgraph to form at least one Merged Parentless FSM Subgraph; and (e) forming the Merged FSM Graph for storage in the Memory by combining all Merged Parentless FSM Subgraphs.

12. The method claimed in claim 11 wherein the step of merging all Child FSM Subgraphs with their corresponding Parent FSM Subgraphs comprises the substep of:

(1) connecting Incoming FSM Subgraph Edges of Child FSM Subgraphs and Outgoing FSM Subgraph Edges of Child FSM Subgraphs to FSM Subgraph Vertices in the Parent FSM Subgraph of the Child FSM Subgraph.

13. The method claimed in claim 11 wherein the step of merging all Child FSM Subgraphs with their corresponding Parent FSM Subgraphs comprises the substep of:

(1) connecting Incoming FSM Subgraph Edges of Child FSM Subgraphs and Outgoing FSM Subgraph Edges of Child FSM Subgraphs to FSM Subgraph Vertices in Another Child FSM Subgraph.

14. The method claimed in claim 11 which further comprises the step of:

(g) creating a Merged Test Subsequence (TS) Graph for storage in the Memory from Test Subsequences (TS) constructed from I/C) Sequences that correspond to FSM Submodel State Transitions.

15. The method claimed in claim 14 which further comprises the step of:

(h) creating an Augmented Test Subsequence (TS) Graph for storage in the Memory by adding Bridging Sequences to the Merged Test Subsequence (TS) Graph.

16. The method claimed in claim 15 which further comprises the step of:

(i) creating a Verification Test Sequence (VTS) for storage in the memory by touring the Augmented Test Subsequence (TS) Graph.

17. The method claimed in claim 16 which further comprises the step of:

(j) storing data representing the Verification Test Sequence (VTS) in the Memory.

18. A method for testing conformance of a Machine Under Test (MUT) with a Hierarchical FSM Model utilizing the method claimed in claim 16 wherein:

within the step of creating a Verification Test Sequence (VTS) for storage in the memory by touring the Augmented Test Subsequence (TS) Graph:

the Verification Test Sequence (VTS) comprises a Sequentially Ordered Series Of I/O Sequences, each I/O Sequence includes an Input Stimulus and a corresponding Output Response, and each Input Stimulus comprises one or more Input Stimulus Signals; and the method further comprising the steps of:

(j) driving the Machine Under Test (MUT) by sequentially supplying the Input Stimulus Signals comprising each Input Stimulus in the Verification Test Sequence (VTS) to the Machine Under Test (MUT);

(k) comparing Output Responses received from the Machine Under Test (MUT) to the corresponding Output Responses in the Verification Test Sequence (VTS); and (l) verifying that the Output Responses received from the Machine Under Test (MUT) match the corresponding Output Responses in the Verification Test Sequence (VTS).

19. A method utilizing a computer for merging Finite State Machine (FSM) Subgraphs into a Merged FSM Graph for use in testing a Machine Under Test (MUT) for conformance against a Hierarchical FSM Model, wherein:

said Hierarchical FSM Model has a plurality of FSM Submodels;

each FSM Submodel has a plurality of FSM Submodel States and a plurality of FSM Submodel State Transitions between the FSM Submodel States;

each FSM Submodel State Transition has a corresponding Input/Output (I/O) Sequence;

all FSM Subgraphs and the Merged FSM Graph are Directed Graphs stored in a Memory with a plurality of FSM Subgraph Vertices and a plurality of FSM Subgraph Edges between the plurality of FSM Subgraph Vertices, wherein:

each said FSM Subgraph Vertex corresponds to one FSM Submodel State, each said FSM Subgraph Edge corresponds to one FSM Submodel State Transition, and each said FSM Subgraph corresponds to one FSM Submodel; and all said FSM Subgraphs are hierarchically related to each other, wherein:

at least one FSM Subgraph is a Parent FSM Subgraph, at least one FSM Subgraph is a Child FSM Subgraph, each Child FSM Subgraph has one Parent FSM Subgraph, at least one Parent FSM Subgraph is a Parentless FSM Subgraph, wherein Parentless FSM Subgraphs do not have Parent FSM Subgraphs, and each Child FSM Subgraph has an Incoming FSM Subgraph Edge and an Outgoing FSM Subgraph Edge;

said method comprising the steps of:

(a) identifying the Parent FSM Subgraph for each Child FSM Subgraph, wherein:

each said Parent FSM Subgraph and each said Child FSM Subgraph are obtained from the Memory;

(b) identifying all Incoming FSM Subgraph Edges and all Outgoing FSM Subgraph Edges for each Child FSM Subgraph;

(c) merging all Child FSM Subgraphs with their corresponding Parent FSM Subgraphs by connecting all Incoming FSM Subgraph Edges to Child FSM Subgraphs and all Outgoing FSM Subgraph Edges to Child FSM Subgraphs to FSM Subgraph Vertices in FSM Subgraphs other than the Child FSM Subgraph, said merge comprising the substeps of:

(1) connecting Incoming FSM Subgraph Edges of Child FSM Subgraphs and Outgoing FSM Subgraph Edges of Child FSM Subgraphs to FSM Subgraph Vertices in the Parent FSM Subgraph of the Child FSM Subgraph;

(d) repeating steps (a) through (c) until all Child FSM Subgraphs have been merged with their Parent FSM Subgraph to form at least one Merged Parentless FSM Subgraph;

(e) forming the Merged FSM Graph by combining all Merged Parentless FSM Subgraphs; and (f) storing data representing the Merged FSM Graph in the Memory.

20. An apparatus for merging Finite State Machine (FSM) Subgraphs into a Merged FSM Graph for use in testing a Machine Under Test (MUT) for conformance against a Hierarchical FSM Model, wherein:

said Hierarchical FSM Model has a plurality of FSM Submodels;

each FSM Submodel has a plurality of FSM Submodel States and a plurality of FSM Submodel State Transitions between the FSM Submodel States;

each FSM Submodel State Transition has a corresponding Input/Output (I/O) Sequence;

all FSM Subgraphs and the Merged FSM Graph are Directed Graphs stored in a Memory with a plurality of FSM Subgraph Vertices and a plurality of FSM Subgraph Edges between the plurality of FSM Subgraph Vertices, wherein:

each said FSM Subgraph Vertex corresponds to one FSM Submodel State, each said FSM Subgraph Edge corresponds to one FSM Submodel State Transition, and each said FSM Subgraph corresponds to one FSM Submodel; and all said FSM Subgraphs are hierarchically related to each other, wherein:

at least one FSM Subgraph is a Parent FSM Subgraph, at least one FSM Subgraph is a Child FSM Subgraph, each Child FSM Subgraph has one Parent FSM Subgraph, at least one Parent FSM Subgraph is a Parentless FSM Subgraph, wherein Parentless FSM Subgraphs do not have Parent FSM Subgraphs, and each Child FSM Subgraph has an Incoming FSM Subgraph Edge and an Outgoing FSM Subgraph Edge;

said apparatus comprising:

(a) a Memory containing data representing all of the FSM Subgraphs;

(b) means for identifying the Parent FSM Subgraph for each Child FSM Subgraph, wherein:

each said Parent FSM Subgraph and each said Child FSM Subgraph are obtained from the Memory;

(c) means for identifying all Incoming FSM Subgraph Edges and all Outgoing FSM Subgraph Edges for each Child FSM Subgraph;

(d) means for merging all Child FSM Subgraphs with their corresponding Parent FSM Subgraphs by connecting all Incoming FSM Subgraph Edges to Child FSM Subgraphs and all Outgoing FSM Subgraph Edges to Child FSM Subgraphs to FSM Subgraph Vertices in FSM Subgraphs other than the Child FSM Subgraph;

(e) means for sequentially repeating elements (b) through (d) until all Child FSM Subgraphs have been merged with their Parent FSM Subgraph to form at least one Merged Parentless FSM Subgraph;

(f) means for forming the Merged FSM Graph by combining all Merged Parentless FSM Subgraphs; and (g) means for storing data representing the Merged FSM Graph in the Memory.

21. An apparatus for merging Finite State Machine (FSM) Subgraphs into a Merged FSM Graph for use in testing a Machine Under Test (MUT) for conformance against a Hierarchical FSM Model, wherein:

said Hierarchical FSM Model has a plurality of FSM Submodels;

each FSM Submodel has a plurality of FSM Submodel States and a plurality of FSM Submodel State Transitions between the FSM Submodel States;

each FSM Submodel State Transition has a corresponding Input/Output (I/O) Sequence;

all FSM Subgraphs and the Merged FSM Graph are Directed Graphs stored in a Memory with a plurality of FSM Subgraph Vertices and a plurality of FSM Subgraph Edges between the plurality of FSM Subgraph Vertices, wherein:
  each said FSM Subgraph Vertex corresponds to one FSM Submodel State,
  each said FSM Subgraph Edge corresponds to one FSM Submodel State Transition, and
  each said FSM Subgraph corresponds to one FSM Submodel; and
all said FSM Subgraphs are hierarchically related to each other, wherein:
  at least one FSM Subgraph is a Parent FSM Subgraph,
  at least one FSM Subgraph is a Child FSM Subgraph,
  each Child FSM Subgraph has one Parent FSM Subgraph,
  at least one Parent FSM Subgraph is a Parentless FSM Subgraph, wherein Parentless FSM Subgraphs do not have Parent FSM Subgraphs, and
  each Child FSM Subgraph has an Incoming FSM Subgraph Edge and an Outgoing FSM Subgraph Edge;
said apparatus comprising:

(a) a Memory containing data representing all of the FSM Subgraphs;

(b) a Computer Processor programmed to identify the Parent FSM Subgraph for each Child FSM Subgraph, wherein:
  each said Parent FSM Subgraph and each said Child FSM Subgraph are obtained from the Memory;

(c) the Computer Processor programmed to identify all Incoming FSM Subgraph Edges and all Outgoing FSM Subgraph Edges for each Child FSM Subgraph;

(d) the Computer Processor programmed to merge all Child FSM Subgraphs with their corresponding Parent FSM Subgraphs by connecting all Incoming FSM Subgraph Edges to Child FSM Subgraphs and all Outgoing FSM Subgraph Edges to Child FSM Subgraphs to FSM Subgraph Vertices in FSM Subgraphs other than the Child FSM Subgraph;

(e) the Computer Processor programmed to sequentially repeat elements (b) through (d) until all Child FSM Subgraphs have been merged with their Parent FSM Subgraph to form at least one Merged Parentless FSM Subgraph;

(f) the Computer Processor programmed to form the Merged FSM Graph by combining all Merged Parentless FSM Subgraphs; and (g) the Computer Processor programmed to store data representing the Merged FSM Graph in the Memory.

* * * * *